(12) United States Patent
Richardson et al.

(10) Patent No.: US 11,170,137 B1
(45) Date of Patent: Nov. 9, 2021

(54) CLOUD-BASED SIMULATION OF QUANTUM COMPUTING RESOURCES

(71) Applicant: Amazon Technologies, Inc., Seattle, WA (US)

(72) Inventors: David R. Richardson, Seattle, WA (US); Marc John Brooker, Seattle, WA (US); James Michael Thompson, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 701 days.

(21) Appl. No.: 15/814,305

(22) Filed: Nov. 15, 2017

(51) Int. Cl.
*G06F 30/20* (2020.01)
*G06F 9/50* (2006.01)
*G06N 10/00* (2019.01)

(52) U.S. Cl.
CPC ............ *G06F 30/20* (2020.01); *G06F 9/5061* (2013.01); *G06N 10/00* (2019.01)

(58) Field of Classification Search
CPC ........ G06F 30/20; G06F 9/5061; G06N 10/00
USPC .......................................................... 703/21
See application file for complete search history.

(56) References Cited

U.S. PATENT DOCUMENTS

| 7,277,872 | B2 | 10/2007 | Raussendorf et al. |
| 7,376,547 | B2 | 5/2008 | Meredith |
| 7,529,717 | B2 | 5/2009 | Vala et al. |
| 7,876,145 | B2 | 1/2011 | Koch |
| 8,190,553 | B2 | 5/2012 | Routt |
| 8,832,164 | B2 * | 9/2014 | Allen ...................... G06N 10/00 708/200 |
| 9,317,331 | B1 | 4/2016 | Koh et al. |
| 9,400,499 | B2 | 7/2016 | Williams et al. |
| 9,471,880 | B2 | 10/2016 | Williams |
| 9,530,873 | B1 | 12/2016 | Carroll et al. |
| 9,537,953 | B1 | 1/2017 | Dadashikelayeh et al. |
| 9,660,859 | B1 | 5/2017 | Dadashikelayeh et al. |
| 10,275,721 | B2 | 4/2019 | Dukatz et al. |
| 10,592,216 | B1 * | 3/2020 | Richardson ............ G06N 10/00 |
| 10,614,371 | B2 * | 4/2020 | Bishop ................ G06F 12/1416 |
| 2003/0121028 | A1 | 6/2003 | Coury et al. |

(Continued)

OTHER PUBLICATIONS

Philipp Niemann, et al., "On the "Q" in QMDDs: Efficient Representation of Quantum Functionality in the QMDD Data-structure", Proceedings of the 5th international conference on Reversible Computation, Jul. 2013, Source: http://www.informatik.uni-bremen.de/agra/doc/konf/13_rc_eff_qmdd_representation.pdf, pp. 125-140.

(Continued)

*Primary Examiner* — Justin C Mikowski
(74) *Attorney, Agent, or Firm* — Robert C. Kowert; Kowert, Hood, Munyon, Rankin & Goetzel, P.C.

(57) ABSTRACT

Methods, systems, and computer-readable media for cloud-based simulation of quantum computing resources are disclosed. One or more classical computing resources are selected based at least in part on a quantum algorithm. The resources are selected by a quantum computing simulation service of a provider network. The quantum algorithm is executable using a quantum computing resource comprising a plurality of quantum bits. The one or more classical computing resources are selected from a pool of computing resources of the provider network. The quantum algorithm is simulated using the one or more classical computing resources.

20 Claims, 35 Drawing Sheets

(56) References Cited

U.S. PATENT DOCUMENTS

| | | | |
|---|---|---|---|
| 2003/0169041 A1* | 9/2003 | Coury | B82Y 10/00 324/307 |
| 2006/0224547 A1* | 10/2006 | Ulyanov | G06N 10/00 706/62 |
| 2006/0225165 A1* | 10/2006 | Maassen van den Brink | H04L 67/12 257/9 |
| 2007/0174227 A1* | 7/2007 | Johnson | B82Y 10/00 706/62 |
| 2007/0239366 A1* | 10/2007 | Hilton | B82Y 10/00 702/27 |
| 2007/0294070 A1* | 12/2007 | Yamashita | G06N 10/00 703/13 |
| 2008/0313430 A1* | 12/2008 | Bunyk | B82Y 10/00 712/34 |
| 2013/0167123 A1 | 6/2013 | Dura et al. | |
| 2014/0187427 A1* | 7/2014 | Macready | G06N 5/02 505/170 |
| 2014/0264288 A1* | 9/2014 | Svore | G06N 10/00 257/31 |
| 2015/0339417 A1* | 11/2015 | Garcia-Ramirez | G06F 17/16 703/2 |
| 2016/0328253 A1* | 11/2016 | Majumdar | G06F 9/45504 |
| 2017/0017894 A1 | 1/2017 | Johnson et al. | |
| 2017/0177782 A1* | 6/2017 | Hastings | G06F 30/394 |
| 2017/0194930 A1* | 7/2017 | Wiebe | G06F 7/523 |
| 2017/0223094 A1 | 8/2017 | Johnson et al. | |
| 2017/0228483 A1* | 8/2017 | Rigetti | G06N 10/00 |
| 2017/0286858 A1* | 10/2017 | La Cour | G06F 7/50 |
| 2017/0357539 A1 | 12/2017 | Dadashikelayeh et al. | |
| 2017/0364796 A1* | 12/2017 | Wiebe | G06N 3/0445 |
| 2018/0046933 A1* | 2/2018 | La Cour | G06N 10/00 |
| 2018/0107939 A1* | 4/2018 | Schoennenbeck | H03K 19/195 |
| 2018/0232649 A1* | 8/2018 | Wiebe | G06N 10/00 |
| 2018/0260731 A1 | 9/2018 | Zeng et al. | |
| 2018/0307988 A1 | 10/2018 | Fano et al. | |
| 2018/0308000 A1 | 10/2018 | Dukatz et al. | |

OTHER PUBLICATIONS

Jeff Barr, "Developer Preview—EC2 Instances (F1) with Programmable Hardware", AWS Blog, Nov. 2016, Source: https://aws.amazon.com/blogs/aws/developer-preview-ec2-instances-f1-with-programmable-hardware, pp. 1-9.

Jeff Barr, "EC2 Instance Type Update—T2, R4, F1, Elastic GPUs, I3, C5", AWS Blog, Nov. 2016, Source: https://aws.amazon.com/blogs/aws/ec2-instance-type-update-t2-r4-f1-elastic-gpus-i3-c5/, pp. 1-6.

Sebastian Anthony, "Google's Quantum Computing Playground turns your PC into a quantum computer", Extremetech, May 2014, Source: https://www.extremetech.com/extreme/182913-googles-quantum-computing-playground-turns-your-pc-into-a-quantum-cornputer, pp. 1-3.

Jeff Barr, "In the Works—Amazon EC2 Elastic GPUs", Nov. 2016, Source: https://aws.amazon.com/blogs/aws/in-the-work-amazon-ec2-elastic-gpus/, pp. 1-6.

Jeff Barr, "New—Amazon EC2 Instances with Up to 8 NVIDIA Tesla V100 GPUs (P3)", AWS Blog, Oct. 2017, Source: https://aws.amazon.com/blogs/aws/new-amazon-ec2-instances-with-up-to-8-nvidia-tesla-v100-gpus-p3/, pp. 1-6.

Jarrod R. McClean, et al., "OpenFermion: The Electronic Structure Package for Quantum Computers", Oct. 23, 2017, Source: https://arxiv.org/abs/1710.07629, pp. 1-18.

Barbara Kessler, "The Evolution of Manged Services in Hyperscale Cloud Environments", AWS Partner Network Blog, Sep. 2016, Source: https://aws.amazon.com/blogs/apn/the-evolution-of-managed-services-in-hyperscale-cloud-environments/, pp. 1-7.

U.S. Appl. No. 15/814,301, filed Nov. 15, 2017, David R. Richardson et al.

U.S. Appl. No. 15/814,302, filed Nov. 15, 2017, David R. Richardson et al.

U.S. Appl. No. 15/814,304, filed Nov. 15, 2017, David R. Richardson et al.

* cited by examiner

CLOUD-BASED SIMULATION OF QUANTUM COMPUTING RESOURCES

BACKGROUND

Many companies and other organizations operate computer networks that interconnect numerous computing systems to support their operations, such as with the computing systems being co-located (e.g., as part of a local network) or instead located in multiple distinct geographical locations (e.g., connected via one or more private or public intermediate networks). For example, distributed systems housing significant numbers of interconnected computing systems have become commonplace. Such distributed systems may provide back-end services to servers that interact with clients. Such distributed systems may also include data centers that are operated by entities to provide computing resources to customers. Some data center operators provide network access, power, and secure installation facilities for hardware owned by various customers, while other data center operators provide "full service" facilities that also include hardware resources made available for use by their customers. As the scale and scope of distributed systems have increased, the tasks of provisioning, administering, and managing the resources have become increasingly complicated.

Figure 1A:
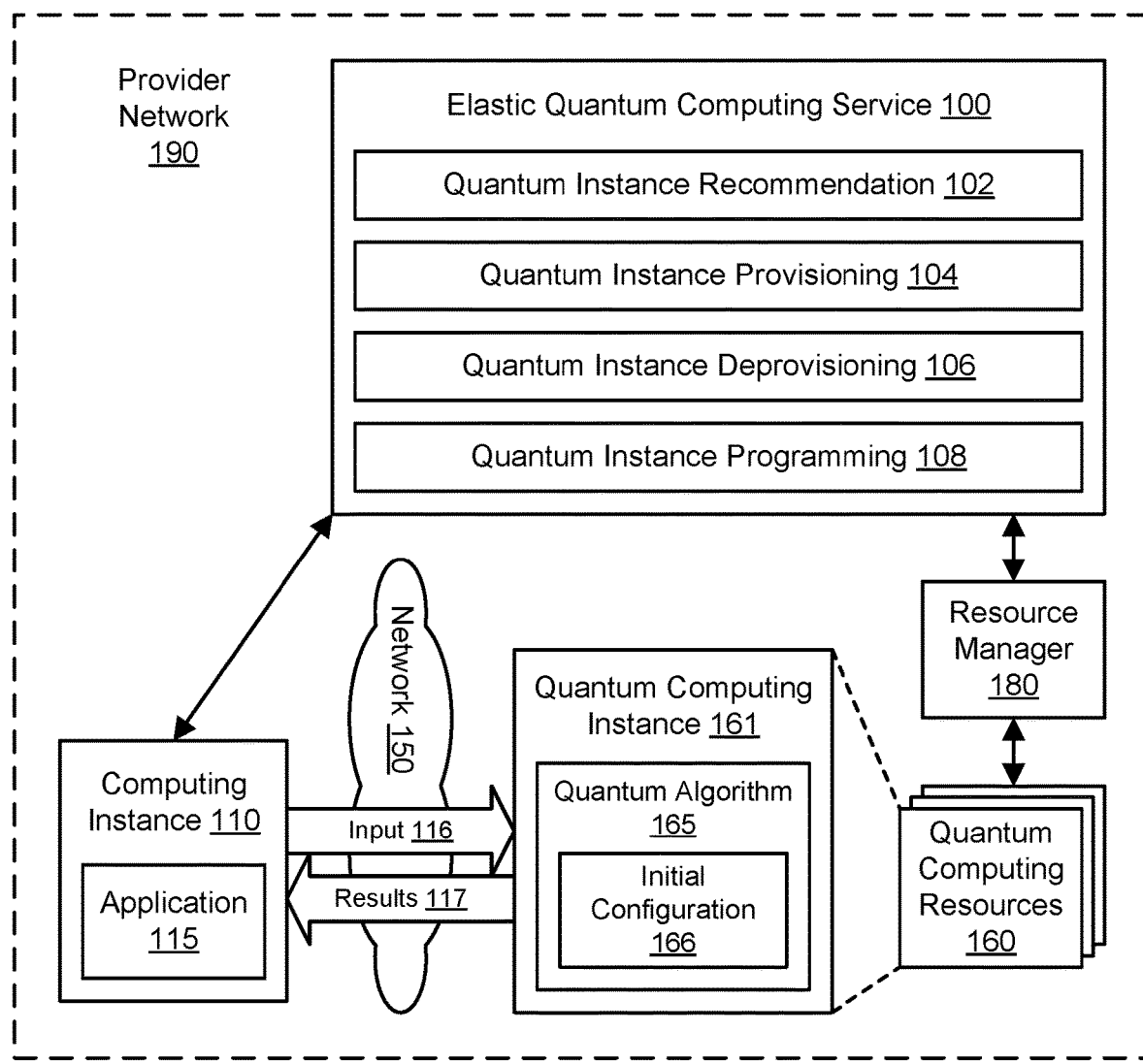
FIG. 1A illustrates an example system environment for cloud-based access to quantum computing resources, including a classical computing instance within the same provider network as a quantum computing instance, according to one embodiment.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning "having the potential to"), rather than the mandatory sense (i.e., meaning "must"). Similarly, the words "include," "including," and "includes" mean "including, but not limited to."

DETAILED DESCRIPTION OF EMBODIMENTS

Various embodiments of methods, systems, and computer-readable media for cloud-based access to quantum computing resources are described. Using the techniques described herein, quantum computing resources that are hosted "in the cloud" can be accessed by client computing devices. The client devices may represent "classical" (e.g., binary digital) computing devices that may seek to take advantage of the speed of quantum computing for solving particular problems. The client devices may be hosted inside or outside the same provider network that hosts the quantum computing resources. On request, a control plane may attach a quantum computing instance to a classical computing instance over a network. When a quantum instance is attached, the classical instance may have remote control of that quantum instance (exclusive of other classical instances) until the attachment is terminated. When the attachment is terminated, the quantum computing resource may be reclaimed and prepared for re-use by the same client or a different client at a later time. A particular quantum computing resource (e.g., a quantum computing instance) may be used and re-used by different client devices. Similarly, a particular client device may use different quantum computing resources over time. On request, a control plane of the provider network may provide access to a classical instance that includes or can locally access a quantum computing resource over an interconnect. A quantum computing instance may run a particular quantum algorithm with a particular initial configuration. The instance type of the quantum instance, the quantum algorithm, and/or the initial configuration may be selected by the client from a catalog. Different instance types may have different quantum computing characteristics such as the number or configuration of quantum bits. In one embodiment, a client may select an instance type that represents a template for solving a particular type of problem and that includes a pre-loaded quantum algorithm. In one embodiment, the elastic quantum computing service may recommend particular instance types, quantum algorithms, and/or initial configurations to a client, e.g., based on a specified problem domain or workload and to optimize speed, cost, or accuracy.

Various embodiments of methods, systems, and computer-readable media for a service for managing quantum computing resources are described. Using the techniques described herein, quantum computing resources that are hosted "in the cloud" may be managed using a task management service. The task management service may receive task descriptions from clients and select and orchestrate computing resources, including quantum computing resources, to perform the tasks on behalf of the clients. The computing resources may be selected based (at least in part) on task descriptions and on performance metrics of prior tasks. The task management service may select appropriate computing resources, select and/or optimize quantum algorithms to implement a task, determine how many times to run a quantum algorithm, determine when to change the initial values for a quantum algorithm, determine when to run quantum algorithms or other operations, and otherwise perform intelligent management of computing resources. The computing resources managed by the task management service may also include classical computing resources such as computing devices and accelerators. In some embodiments, the task management service may use both quantum computing resources and classical computing resources to perform a particular task, e.g., where the different types of resources perform different portions of the task. In some embodiments, the task management service may use both quantum computing resources and classical computing resources to perform the same task, and the service may analyze the results to influence the selection of resources for future tasks. The task management service may introduce a layer of intelligent management of computing resources such that clients may delegate management of resources to the service.

Various embodiments of methods, systems, and computer-readable media for a development environment for programming quantum computing resources are described. Using the techniques described herein, clients may use a development environment to build programs executable on quantum computing resources. The development environment may be hosted in the cloud (at least in part) or executed locally on a client computing device (at least in part). The development environment may be associated with a particular type of quantum computing resource or with a higher-level abstraction of quantum computing resources. Using the development environment, a client may enter information associated with a quantum algorithm, such as programming elements of the algorithm or other program code. The program code may be entered as text, as visual or graphical programming elements (e.g., nodes in a graphical program), or using any other suitable input modality. In one embodiment, programming elements may be selected by the client or by the environment itself from a repository. In one embodiment, programming elements may be recommended to the developer (the client) by the environment. The development environment may optimize the program code and compile the code into a quantum algorithm that is executable on a quantum computing resource. The development environment may select one or more quantum resources to run the quantum algorithm, e.g., from a pool of computing resources hosted in a cloud-based provider network. A quantum computing resource may be selected based (at least in part) on characteristics of the quantum algorithm, e.g., to select a quantum resource that is particularly suited for a specific problem domain such as molecular modeling, traffic optimization, and so on. A quantum computing resource may be selected based (at least in part) on optimization of speed, accuracy, and/or cost. In one embodiment, the quantum algorithm may be run on a quantum computing resource managed by the client. In one embodiment, a quantum algorithm may be tested on different quantum computing resources, or variants of an algorithm may be tested on different instances of the same type of quantum resource. In one embodiment, a quantum algorithm may be tested on both quantum resources and classical computing resources. Based on the testing, the environment may recommend particular resource types for the algorithm or may recommend one variant of the algorithm over another.

Various embodiments of methods, systems, and computer-readable media for cloud-based simulation of quantum computing resources are described. Using the techniques described herein, clients may submit quantum algorithms to a quantum computing simulation service. The quantum computing simulation service may implement simulation of the quantum algorithms using classical computing resources. In one embodiment, the quantum computing simulation service and the classical computing resources may be offered to clients by a cloud-based provider network. The quantum computing simulation service may select the classical resources, such as a plurality of virtual compute instances, from a pool of available computing resources of the provider network, and the resources may vary in their instance type or other characteristics. The quantum computing simulation service may select an appropriate number and type of classical resources for a particular quantum algorithm. In one embodiment, the quantum computing simulation service may recommend a number and/or type of classical resources to a client. In one embodiment, the selected classical resources may simulate the quantum algorithm using executable instructions that represent similar logic as the quantum algorithm. In one embodiment, at least some of the classical resources may run a simulator for quantum computing hardware, and any of the classical resources may simulate all or part of the quantum algorithm. In one embodiment, the quantum computing simulation service may orchestrate the use of many classical computing resources to perform various tasks associated with the simulation. The simulation may often require many more classical computing resources or more runtime than the use of a quantum computing resource. However, in some scenarios, the cost of the classical computing resources may be less than the quantum computing resource, or the classical computing resources may have greater availability than the quantum computing resource. In one embodiment, quantum algorithms may be selected from a catalog in the provider network and then simulated on classical resources. The quantum computing simulation service may be used to test quantum algorithms on classical computing resources prior to using genuine quantum computing resources. In one embodiment, the quantum computing simulation service may simulate quantum algorithms developed using a development environment for quantum computing.

Cloud-Based Access to Quantum Computing Resources

Figure 1B:
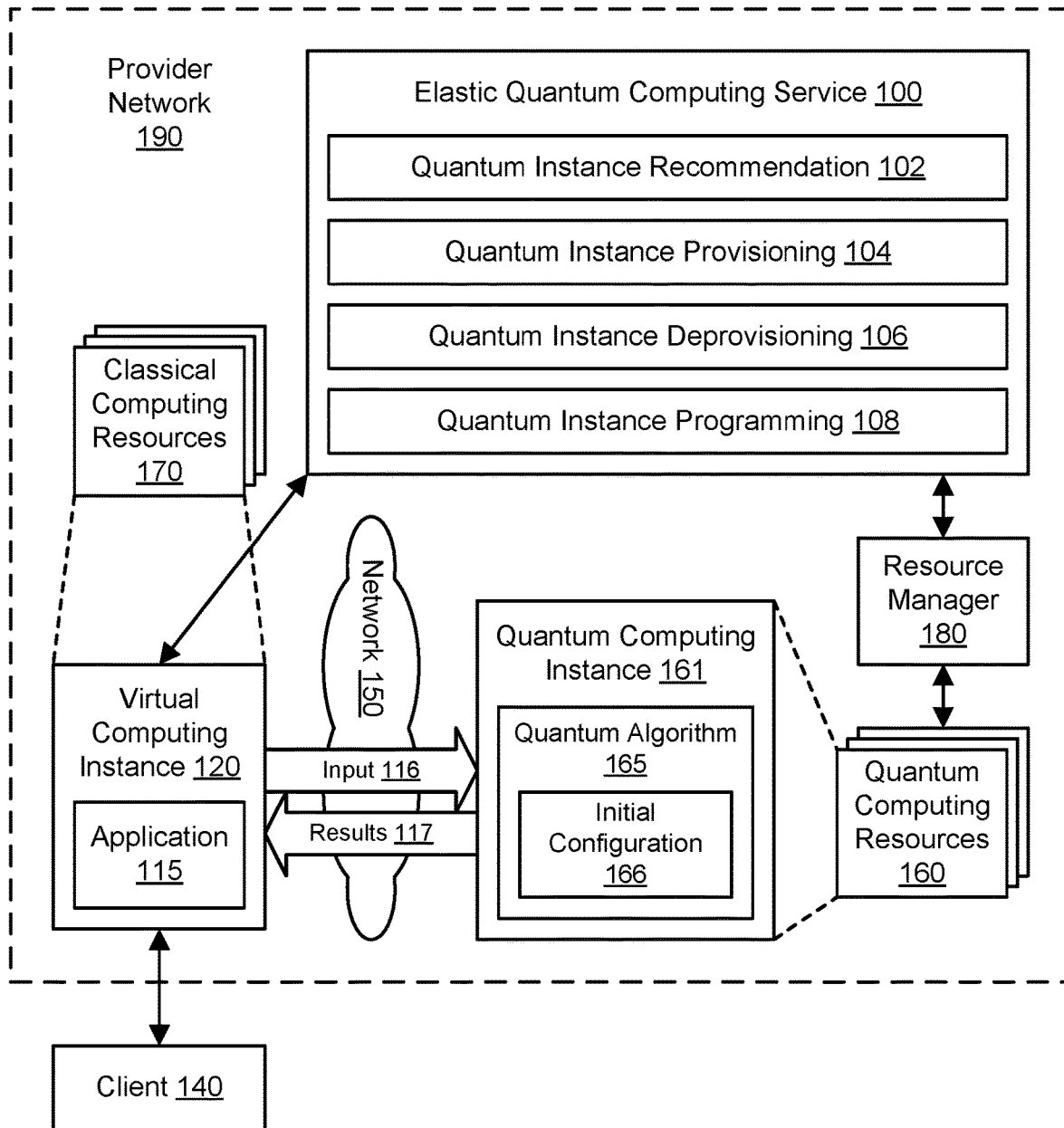
FIG. 1B illustrates an example system environment for cloud-based access to quantum computing resources, including a virtual computing instance within the same provider network as a quantum computing instance, according to one embodiment.
Figure 1C:
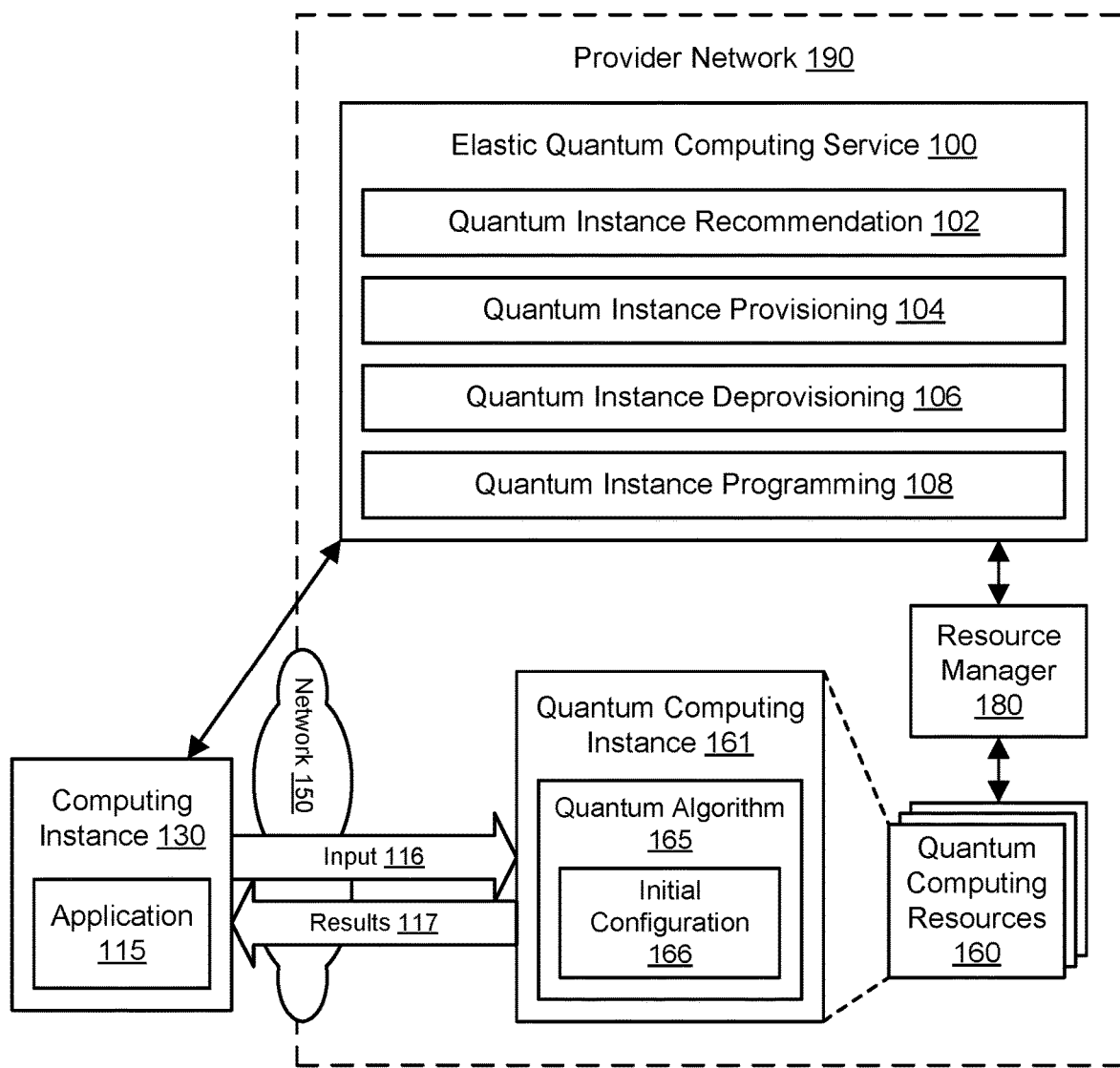
FIG. 1C illustrates an example system environment for cloud-based access to quantum computing resources, including a classical computing instance external to the provider network that hosts a quantum computing instance, according to one embodiment.

FIG. 1A, FIG. 1B, and FIG. 1C illustrate an example system environment for cloud-based access to quantum computing resources, according to some embodiments. An elastic quantum computing service 100 may provide access to quantum computing resources 160. The quantum computing resources may be hosted "in the cloud," e.g., in a cloud-based provider network 190 whose resources are remotely accessible to clients. Quantum computing resources 160 may include computing devices that rely on quantum-mechanical phenomena for their operation. A quantum computing device, also referred to as a quantum computer, may include a plurality of quantum bits (qubits). A quantum bit can be in a superposition of states. A quantum computer with n qubits may be in a superposition of $2^n$ different states simultaneously, while a non-quantum (classical) computer may be in only one of those states at a given time. A quantum computer may run a quantum algorithm that includes a sequence of quantum logic gates; a problem may be encoded by setting the initial configuration of values of the qubits. When measured, the system of qubits may collapse into one of the $2^n$ states, where each qubit represents a binary value (one or zero). Using these principles, quantum computing resources 160 may solve some problems much faster than a classical computer. For example, the quantum computing resources 160 may be used to solve complex problems in domains such as machine learning, financial portfolio optimization, molecular modeling, climate modeling, integer factorization, simulation, and so on. Quantum algorithms may often provide an exponential or quadratic speedup over their classical computing counterparts.

In some embodiments, the quantum computing resources 160 may run quantum algorithms such as Grover's algorithm, the Deutsch-Jozsa algorithm, Shor's algorithm, a quantum Fourier transform, a family of quantum algorithms involving amplitude amplification, adiabatic quantum computation, quantum error connection, and so on. Quantum algorithms may represent a translation of problems in various domains, such as chemistry and materials science, into quantum circuits that can be executed on quantum computing resources. Quantum algorithms may be generated by transforming physics equations which describe chemical and material systems into representations that can be interpreted by quantum computing resources. For example, to simulate the energy surface of a molecule using a quantum algorithm, several types of input may be used: e.g., a specification of the coordinates of the nuclei in the molecule, a basis set usable to discretize the molecule, and the charge and spin multiplicity of the system (if known). Classical computation may be used to optimally stage the computation of the quantum algorithm, e.g., to select an initial configuration for the algorithm using a Hartree-Fock calculation. A researcher may then specify the active space representing the electrons that are of greatest interest. The equations for these electrons may be mapped to a representation suitable for the quantum bits of a quantum computing resource, e.g., using the Bravyi-Kitaev transformation. A quantum algorithm may then be selected to solve for the properties of interest to the researcher. To run the quantum algorithm, the quantum circuit may be output in assembly language or another low-level language that can be run on the quantum computing resource.

Quantum computing is currently associated with numerous technical problems. For example, quantum computers may be very expensive to purchase due to their exotic nature and rarity. Additionally, quantum computers may be difficult to manage and maintain for similar reasons. Furthermore, quantum algorithms may be complex to develop and test, especially for developers who are accustomed to a classical computing paradigm. These problems may be addressed by providing cloud-based access to quantum computing resources and management of such resources such that clients need not purchase or maintain the quantum computing resources on their own but may instead lease the quantum resources on an as-needed basis. In one embodiment, a plurality of quantum computing instances may be provided to clients based on a set of quantum computing resources 160. In one embodiment, a quantum computing instance 161 may correspond to one physical quantum computing device in the quantum resources 160. In one embodiment, a plurality of quantum computing instances (including instance 161) may be provided by one physical quantum computing device in the quantum resources 160. In one embodiment, a single quantum computing device in the quantum resources 160 may be time-shared to offer its functionality to multiple tenants in manner that appears concurrent to the tenants. The time-sharing may be implemented using a control plane associated with the quantum computing resources 160, e.g., using the service 100 to facilitate the use of a single quantum computing device by different clients. In one embodiment, the quantum computing instance 161 may represent a virtual instance that is implemented on top of the underlying physical quantum resources 160.

Figure 20:
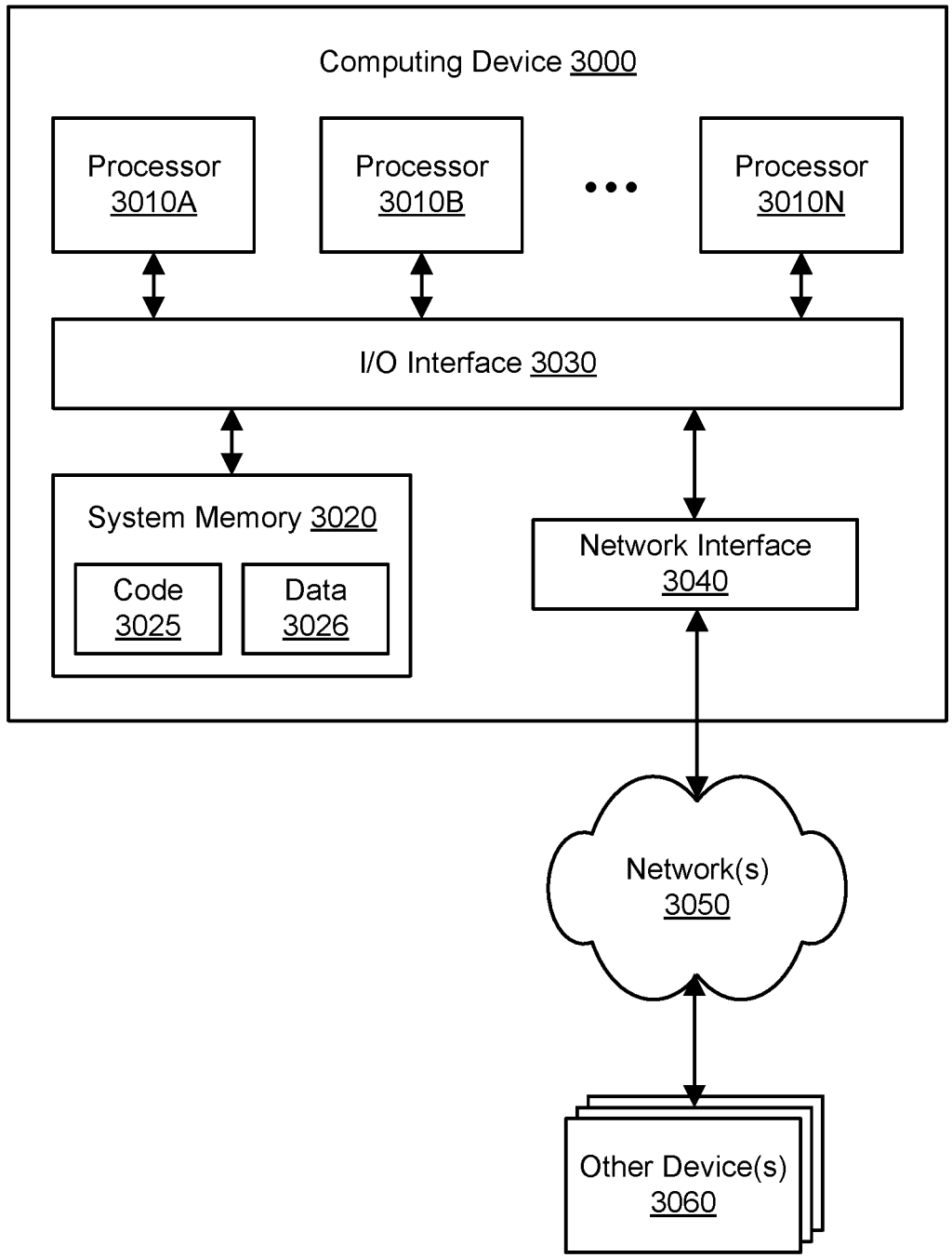
FIG. 20 illustrates an example computing device that may be used in some embodiments.

In one embodiment, the elastic quantum computing service 100 may provide remote access to quantum computing resources 160 for a plurality of clients of a provider network 190. The service 100 may represent a control plane of the provider network 190. The clients may represent customers of the provider network 190, and the clients may use various resources and services of the provider network in exchange for fees. The clients may operate various computing devices that represent a "classical" approach to computing in that they do not rely on quantum-mechanical phenomena for their operation. The classical computing resources may represent binary digital computing devices such as the example computing device 3000 as shown in FIG. 20. Using the elastic quantum computing service 100, quantum computing instances may be attached to classical computing instances via network connections (e.g., over network 150). In one embodiment, an attached quantum computing instance may act as an accelerator for particular tasks that are especially suited for quantum computing, such that quantum computing approaches are likely to provide faster or more accurate answers than classical computing approaches. In one embodiment, an attached quantum computing instance may be used solely by a particular classical instance as long as the attachment is maintained, such that other classical instances may not have concurrent access to the functionality of that particular quantum computing instance. Quantum instances may be used by classical instances on a temporary basis, and when an attachment is terminated, the quantum computing resource(s) used for a particular quantum instance may be returned to the pool of quantum computing resources 160 for potential re-use by the same client or different clients. In one embodiment, a quantum computing instance 161 may be attached to a classical computing instance based on an attachment request sent to the elastic quantum computing service 100. The attachment request may be sent by the classical instance itself (e.g., if the classical instance is already running), by a client associated with the classical instance, or by a client or other entity that seeks to provision both the classical instance and the attached quantum instance in the same transaction.

In various embodiments, clients who seek to attach quantum computing instances to classical computing instances may have varying relationships to the provider network 190. In some embodiments, a classical computing instance within the provider network 190 may be provisioned by a control plane of the provider network, e.g., based (at least in part) on a request from a client. As shown in the example of FIG. 1A, a client may operate a classical computing instance 110 that is internal to the provider network 190, e.g., such that the underlying hardware resources of the instance 110 are hosted by the provider network. As shown in the example of FIG. 1B, a client 140 may operate a virtual computing instance 120 that is internal to the provider network 190. Using a client computing device 140 (such as the example computing device 3000 as shown in FIG. 20), a client of the provider network 190 may interact with and control the virtual computing instance 120. The virtual computing instance 120 may be provided by a computing virtualization service of the provider network 190 using classical computing resources 170 that are hosted in the provider network. As shown in the example of FIG. 1C, a classical computing instance 130 may be external to the provider network 190, e.g., on client premises or otherwise in an environment not under the management of the provider network.

In various embodiments, the elastic quantum computing service 100 may include components to implement various types of functionality. In one embodiment, the elastic quantum computing service 100 may include a component for quantum instance recommendation 102. The quantum instance recommendation 102 may recommend the quantum computing instance 161, quantum algorithm 165, and/or initial configuration 166 to the client. For example, based on a particular problem domain or workload that the client specifies, the quantum instance recommendation 102 may recommend a particular instance type of the quantum instance 161 that is designed for the problem domain. The recommendation may seek to optimize a speed, accuracy, or cost of the problem, based (at least in part) on input concerning the client's goals. The instance type may be associated with a quantum computing resource that has particular quantum computing characteristics, such as a particular number of qubits. The recommended instance may be pre-loaded with a suitable quantum algorithm 165 and/or an initial configuration 166 (e.g., initial values for the qubits) for that algorithm, or the algorithm may be recommended separately. The recommendation may be communicated to the client through any suitable interface, e.g., a graphical user interface (GUI) associated with the elastic quantum computing service 100. In one embodiment, the recommended instance may be provisioned and attached to a classical instance specified by the client based on user input accepting the recommendation.

In one embodiment, the elastic quantum computing service 100 may include a component for quantum instance provisioning 104. The quantum instance provisioning 104 may interact with a resource manager 180 of the provider network 190 to reserve, configure, and/or attach at least one of the quantum computing resources 160 on behalf of a client associated with the classical computing instance 110, 120, or 130. The quantum computing resources 160 may represent a pool of available resources, including quantum computers in one or more data centers managed by the provider network 190. Provisioning the quantum computing instance 161 may include reserving one of the quantum computers, or a portion of one of the quantum computers, for attachment to the classical computing instance. The service 100 may also perform the attachment of the quantum instance 161 to the classical instance. In one embodiment, the elastic quantum computing service 100 may include a component for quantum instance deprovisioning 106. The attachment may be temporary, and the quantum computing resource(s) used to implement the quantum computing instance 161 may be returned to the pool of available quantum computing resources 160 when no longer needed or used by the classical instance. Deprovisioning the quantum computing instance 161 may include terminating the attachment (if not already terminated), deprogramming the quantum algorithm, erasing or resetting the values of any qubits, removing any client-specific data or metadata associated with the quantum instance (e.g., in a classical component that is local to the quantum computer and that manages the quantum computer), and/or otherwise preparing the reclaimed quantum computing resources for reuse by the same client or another client.

In one embodiment, the elastic quantum computing service 100 may include a component for quantum instance programming 108. The quantum instance programming 108 may deploy a quantum algorithm 165 to the quantum computing instance 161. The quantum instance programming 108 may configure a quantum algorithm 165 on the quantum computing instance 161, e.g., by providing an initial configuration 166 for the algorithm. The initial configuration 166 may represent initial values for qubits. In one embodiment, the quantum algorithm 165 may be provided by the client associated with the classical computing instance and deployed to the quantum instance 161 by the client device. In one embodiment, the quantum algorithm 165 may be selected by the client associated with the classical computing instance, e.g., from a catalog of algorithms offered by the provider network 190. In one embodiment, the quantum algorithm 165 may be pre-loaded on the quantum computing instance, and the quantum computing instance may be selected by the client due to its suitability for a particular problem domain.

The quantum algorithm 165 may be run based (at least in part) on input 116 from the classical computing instance. The input 116 may represent a selection of the algorithm 165, a selection of the initial configuration 166, a decision to start the run at a particular time, and/or other control signals associated with operation of the quantum computing instance 161. In one embodiment, the classical instance 110, 120, or 130 may run an application 115, and the application may generate at least a portion of the input 116 used by the quantum computing instance 161. Upon measuring (observing) the qubits, the qubits may collapse into a particular state where each qubit represents a binary value (one or zero). This state may represent the result(s) 117 of the run of the algorithm 165 and may be provided back to the classical computing instance. Quantum algorithms may be considered probabilistic such that they provide a solution with a certain probability, and the algorithm 165 may be run more than once to arrive at different results 117. In one embodiment, by repeatedly setting the algorithm's initial values, running the algorithm, and measuring the algorithm's results, the probability of arriving at the correct answer may be increased.

Figure 1D:
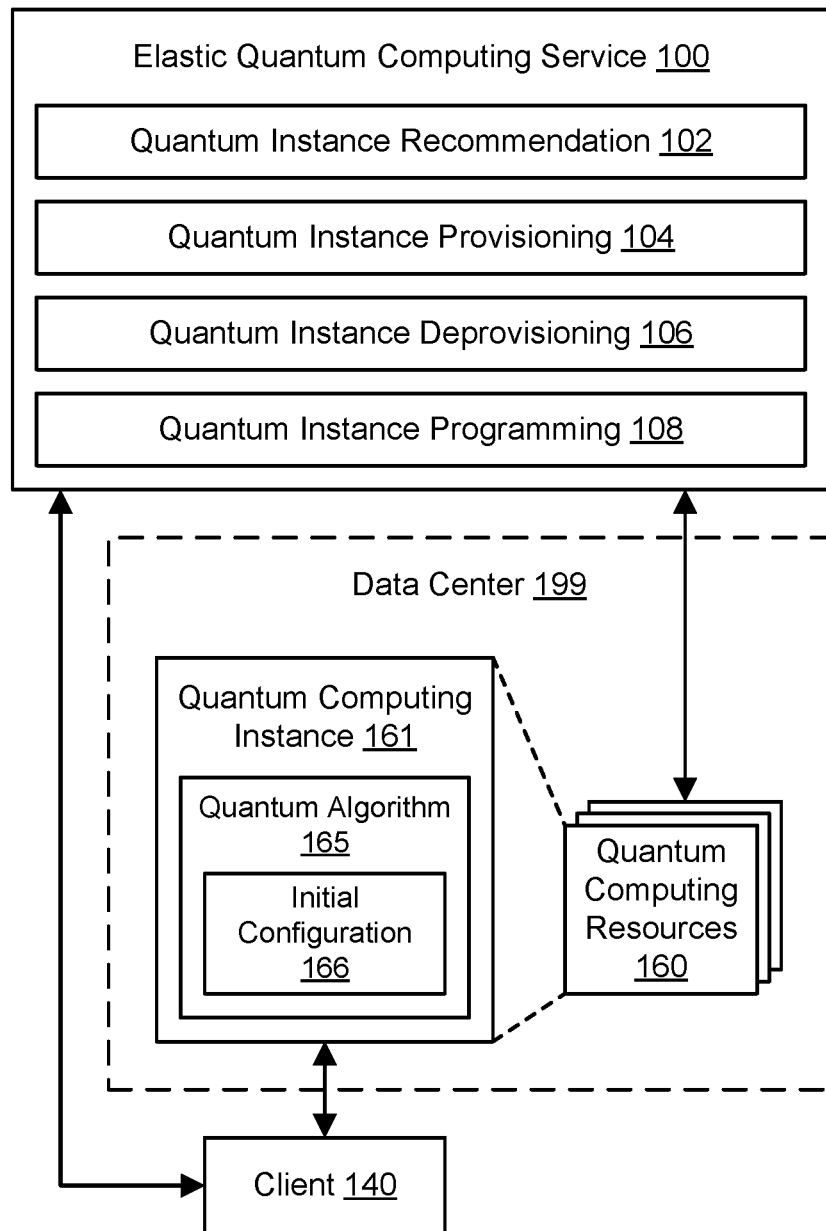
FIG. 1D illustrates an example system environment for cloud-based access to quantum computing resources, including a data center that hosts a quantum computing instance, according to one embodiment.

FIG. 1D illustrates an example system environment for cloud-based access to quantum computing resources, including a data center that hosts a quantum computing instance, according to one embodiment. In one embodiment, the quantum computing resources 160 may be hosted in a data center 199 that is not necessarily part of the provider network 190. For example, the data center 199 may be owned or managed by a different entity than the entity that provides the elastic quantum computing service 100. As another example, the data center 199 may represent a client-managed data center. In one embodiment, the service 100 may have access to the quantum computing resources 160 in the data center 199 and may interact with the data center to provision a quantum computing instance 161 on behalf of a client 140, e.g., in response to a request from the client. The client 140 may then remotely access and/or control the quantum computing instance 161 as discussed above.

Figure 1E:
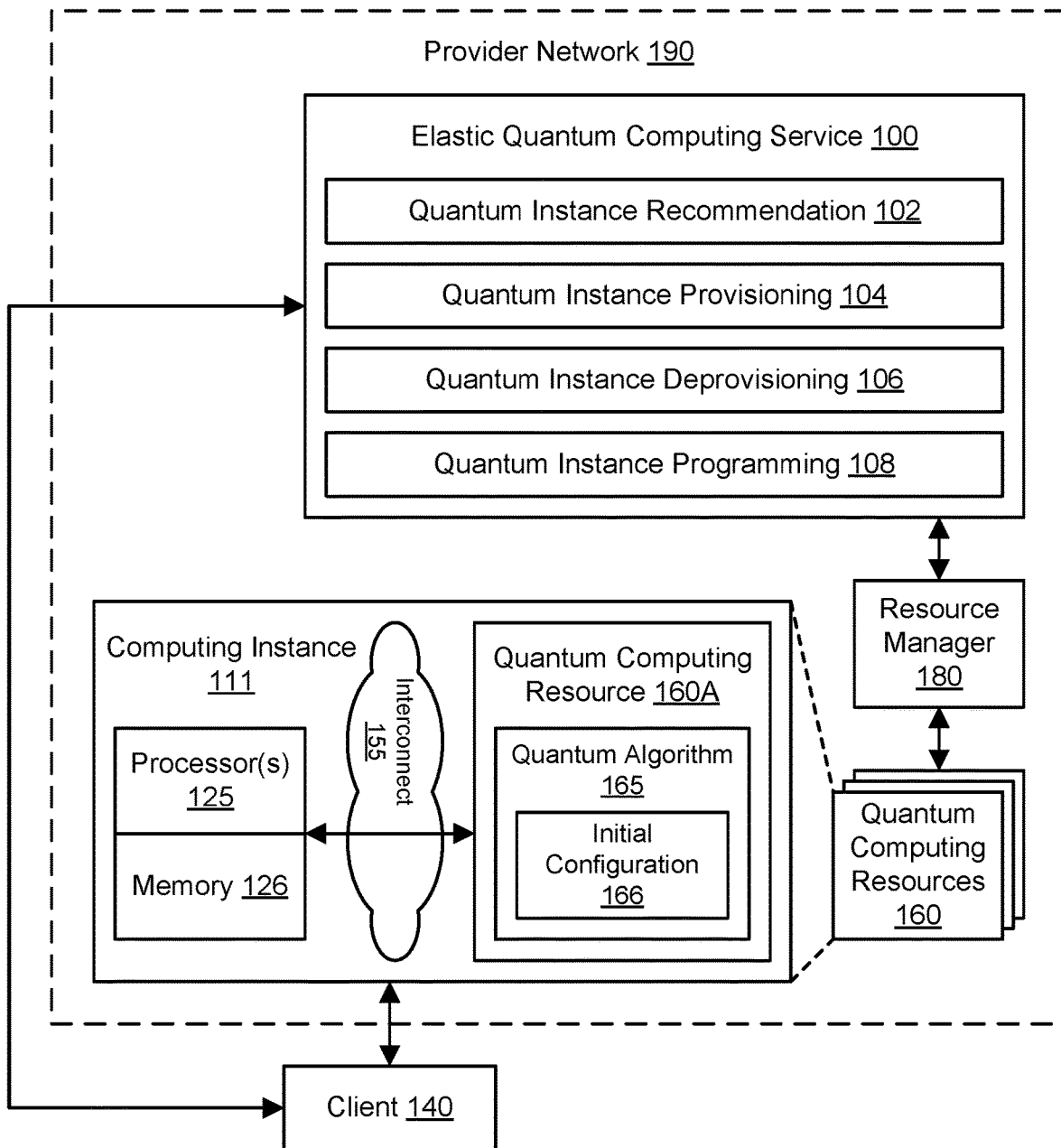
FIG. 1E illustrates an example system environment for cloud-based access to quantum computing resources, including a computing instance with a locally accessible quantum computing resource, according to one embodiment.

FIG. 1E illustrates an example system environment for cloud-based access to quantum computing resources, including a computing instance with a locally accessible quantum computing resource, according to one embodiment. In one embodiment, a computing instance 111 may be provisioned that includes both classical and quantum components. As classical components, the computing instance 111 may include one or more processors 125 and a memory 126 that stores executable instructions. The computing instance 111 may also include an interconnect 155 that permits the processor(s) 125 and/or memory 126 to control a quantum computing resource 160A that is locally attached or accessible. For example, the interconnect 155 may represent a local bus such as a PCIe (Peripheral Component Interconnect Express) bus. Access to the quantum computing resource 160A may be mediated by a hypervisor. The computing instance 111 may be implemented using a server, and the quantum computing resource 160A may be installed as a card in the server or may be locally attached and accessible to the server via the interconnect 155. The computing instance 111 may represent a virtual computing instance. The computing instance 111 may be provisioned from the resources of the provider network 190 and made accessible to a client 140 based on a request from the client.

The elastic quantum computing service 100 may be implemented using any suitable number and configuration of computing devices, any of which may be implemented by the example computing device 3000 illustrated in FIG. 20. The computing devices may be located in any suitable number of data centers or geographical locations. In various embodiments, at least some of the functionality of the service 100 may be provided by the same computing device or by different computing devices. If any of the components of the service 100 are implemented using different computing devices, then the components and their respective computing devices may be communicatively coupled, e.g., via one or more networks. Each of the components of the service 100 may represent any combination of software and hardware usable to perform their respective functions, as discussed as follows. Operations implemented by the service 100 may be performed automatically, e.g., without a need for user initiation or user intervention after an initial configuration stage, and programmatically, e.g., by execution of program instructions on at least one computing device. It is contemplated that the service 100 may include additional components not shown, fewer components than shown, or different combinations, configurations, or quantities of the components shown.

The elastic quantum computing service 100 may be implemented in a service-oriented system in which multiple services (e.g., the resource manager 180, a computing virtualization service, and so on) collaborate according to a service-oriented architecture. In such an environment, the service 100 may offer its functionality as to multiple clients in a substantially concurrent manner. It is contemplated that any suitable number and configuration of clients may interact with the service 100. To enable clients to invoke functionality, the service 100 may expose any suitable interface (s), such as one or more APIs or other programmatic interfaces and/or graphical user interfaces (GUIs). The service 100 may be implemented using a plurality of different instances that are distributed throughout one or more networks, and each instance may offer access to the functionality of the corresponding service to various clients. For example, multiple computing devices may each offer the functionality of the service 100 to clients in various locations. The functionality of the service 100, such as the attachment of quantum computing instances to classical computing instances, may be offered to the clients in exchange for fees.

One or more of the clients (such as client 140) may represent external devices, systems, or entities with respect to any components of the service 100 and/or provider network 190. The client devices may be implemented using any suitable number and configuration of computing devices, any of which may be implemented by the example computing device 3000 illustrated in FIG. 20. Client devices may convey network-based service requests to the service 100 via one or more networks, e.g., the network 150.

The classical computing instances may be located in different data centers or different physical environments than the quantum computing resources 160, and a network 150 may connect the classical instances to the quantum instances. In various embodiments, the network 150 may encompass any suitable combination of networking hardware and protocols necessary to establish network-based communications between a classical computing instance 110, 120, or 130 and the quantum computing instance 161. For example, the network 150 may generally encompass the various telecommunications networks and service providers that collectively implement the Internet. The network 150 may also include private networks such as local area networks (LANs) or wide area networks (WANs) as well as public or private wireless networks. For example, both a classical computing instance and the quantum computing instance 161 may be respectively provisioned within enterprises having their own internal networks. In such an embodiment, the network 150 may include the hardware (e.g., modems, routers, switches, load balancers, proxy servers, etc.) and software (e.g., protocol stacks, accounting software, firewall/security software, etc.) necessary to establish a networking link between the classical computing instance and the Internet as well as between the Internet and the quantum computing instance 161.

In one embodiment, aspects of the service 100, quantum computing resources 160, and classical computing resources 170 may be implemented using computing resources of a provider network 190. A provider network 190 may represent a network set up by an entity such as a business or a public-sector organization to provide one or more services (such as various types of network-accessible computing or storage) accessible via the Internet and/or other networks to a distributed set of clients. A provider network 190 may include numerous data centers hosting various resource pools, such as collections of physical and/or virtualized computer servers, storage devices, networking equipment and the like, that are used to implement and distribute the infrastructure and services offered by the provider. The computing resources may, in some embodiments, be offered to clients in units called "instances," such as virtual or physical compute instances. A virtual computing instance may, for example, comprise one or more servers with a specified computational capacity (which may be specified by indicating the type and number of CPUs, the main memory size, and so on) and a specified software stack (e.g., a particular version of an operating system, which may in turn run on top of a hypervisor). A number of different types of computing devices may be used singly or in combination to implement the resources of the provider network 190 in different embodiments, including classical computer servers, quantum computers, storage devices, network devices, and the like. Because resources of the provider network 190 may be under the control of multiple clients (or tenants) simultaneously, the provider network may be said to offer multi-tenancy and may be termed a multi-tenant provider network. For example, different ones of the quantum computing resources 160 may be concurrently used for the processing of data by different clients.

In some embodiments, an operator of the provider network 190 may implement a flexible set of resource reservation, control, and access interfaces for their clients. For example, a resource manager 180 may implement a programmatic resource reservation interface (e.g., via a web site or a set of web pages) that allows clients (potentially including other components within the provider network 190) to learn about, select, purchase access to, and/or reserve computing instances offered by the provider network. Such an interface may include capabilities to allow browsing of a resource catalog and provide details and specifications of the different types or sizes of resources supported, the different reservation types or modes supported, pricing models, and so on.

The provider network 190 may support several different purchasing modes (which may also be referred to herein as reservation modes) in one embodiment: for example, long-term reservations, on-demand resource allocation, or spot-price-based resource allocation. Using the long-term reservation mode, a client may make a low, one-time, upfront payment for a resource instance, reserve it for a specified duration such as a one-year or three-year term, and pay a low hourly rate for the instance; the client may be assured of having the reserved instance available for the term of the reservation. Using on-demand mode, a client could pay for capacity by the hour (or some appropriate time unit), without any long-term commitments or upfront payments. In the spot-price mode, a client could specify the maximum price per unit time that it is willing to pay for a particular type of resource, and if the client's maximum price exceeded a dynamic spot price determined at least in part by supply and demand, that type of resource would be provided to the client. In some embodiments, dynamically resizable pools of resource instances may be set aside for the different reservation types or modes: e.g., long-term reserved instances may be allocated from one pool, on-demand instances from another, and so on. During periods when the supply of the requested resource type exceeds the demand, the spot price may become significantly lower than the price for on-demand mode. In some implementations, if the spot price increases beyond the maximum bid specified by a client, a resource allocation may be interrupted: i.e., a resource instance that was previously allocated to the client may be reclaimed by the resource manager and may be allocated to some other client that is willing to pay a higher price. Other purchasing modes or combinations of modes may be implemented by the resource manager in some embodiments.

Figure 2A:
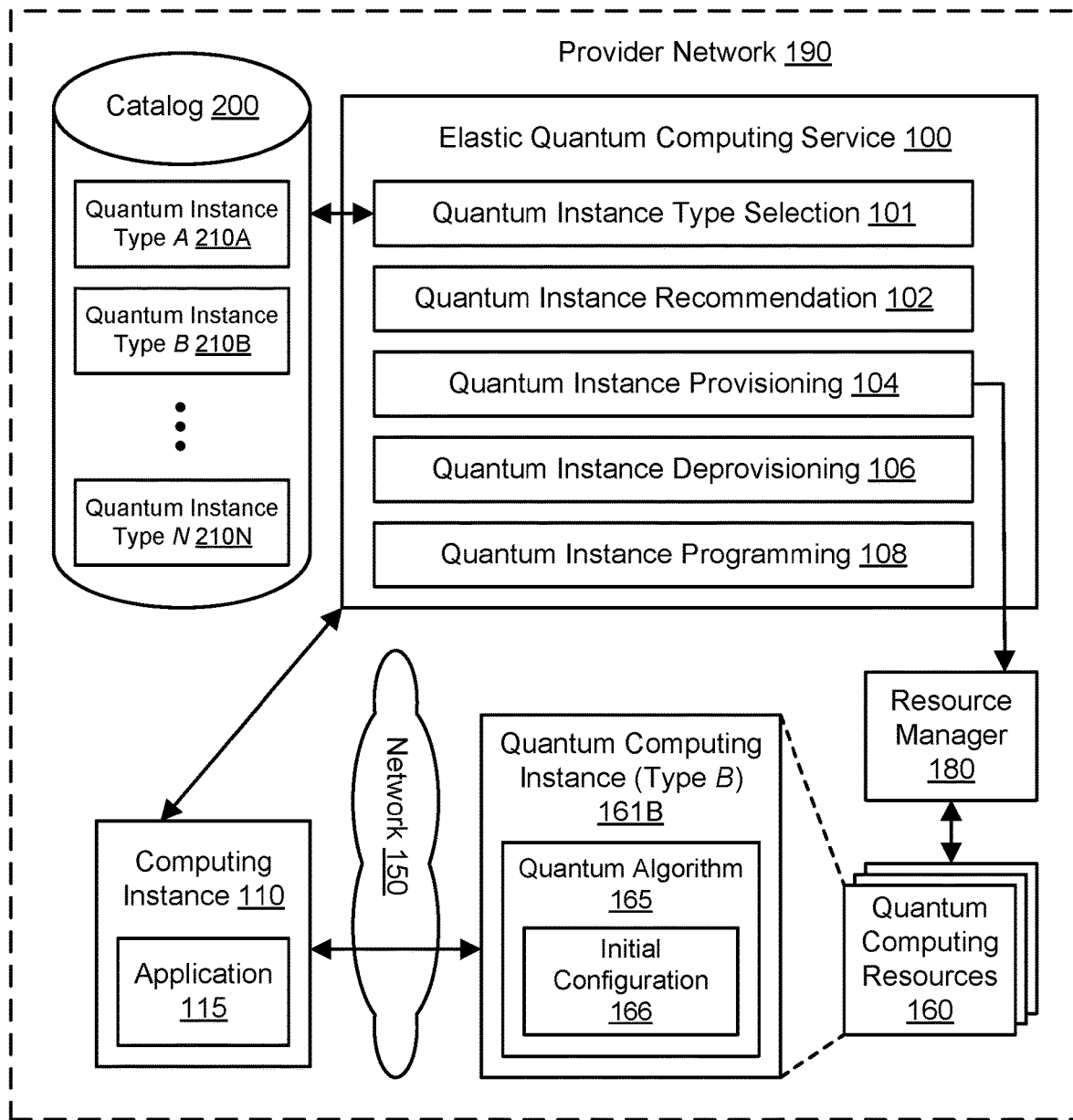
FIG. 2A illustrates further aspects of the example system environment for cloud-based access to quantum computing resources, including a catalog that offers quantum computing instances of different instance types, according to one embodiment.

FIG. 2A illustrates further aspects of the example system environment for cloud-based access to quantum computing resources, including a catalog that offers quantum computing instances of different instance types, according to one embodiment. In one embodiment, a client associated with a classical computing instance (such as instance 110) may select an instance type for the quantum computing instance that is to be attached to the classical instance. In one embodiment, information describing a set of available quantum computing instance types may be stored in a catalog 200. As shown in the example of FIG. 2A, the catalog 200 may indicate a quantum instance type A 210A, a quantum instance type B 210B, a quantum instance type N 210N, and so on. In one embodiment, at least some of the instance types 210A-210N may indicate particular quantum computing characteristics, such as a particular number of qubits or a particular configuration of hardware resources. The different instance types may also be associated with different costs, such that more capable instance types are typically more expensive than less capable instance types. In one embodiment, at least some of the instance types 210A-210N may be optimized for particular problem domains, such as molecular modeling, integer factorization, and so on. The elastic quantum computing service 100 may include a quantum instance type selection component 101 that accesses the instance type information in the catalog 200, presents information about the available instance types, and permits clients to choose from among the instance types, e.g., using a graphical user interface. In one embodiment, the client may be presented with both a set of available instance types and a recommendation of one or more of the instance types (as generated using the recommendation component 102). Upon receipt of user input representing a client's selection of a quantum computing instance type, such as instance type B 210B, the service 100 may provision and attach a quantum computing instance 161B of that particular instance type. The quantum algorithm 165 and initial configuration 166 may be selected from the catalog 200 or provided by the client.

Figure 2B:
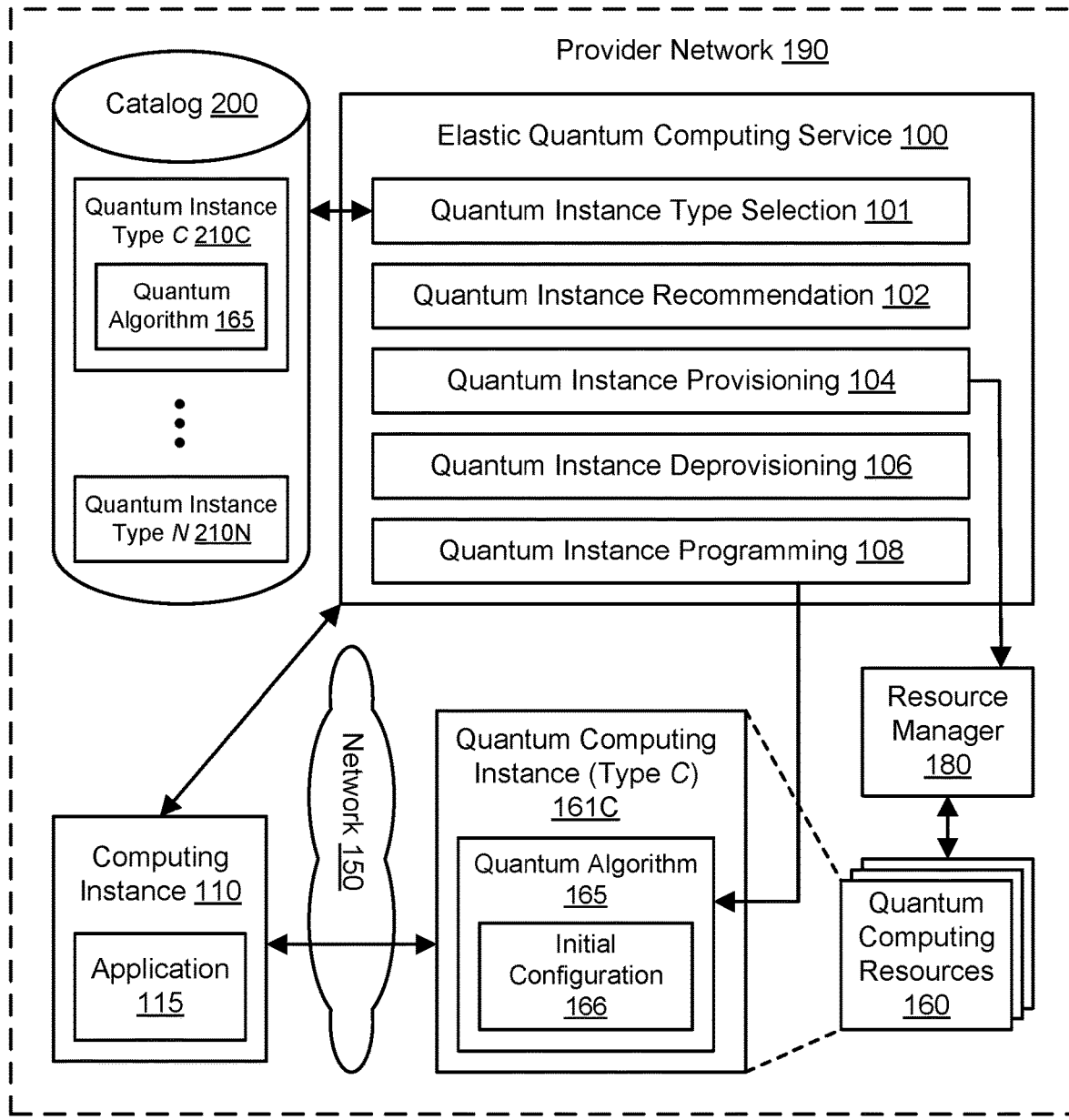
FIG. 2B illustrates further aspects of the example system environment for cloud-based access to quantum computing resources, including a catalog that offers quantum computing instances with pre-loaded quantum algorithms, according to one embodiment.

FIG. 2B illustrates further aspects of the example system environment for cloud-based access to quantum computing resources, including a catalog that offers quantum computing instances with pre-loaded quantum algorithms, according to one embodiment. In one embodiment, the catalog may describe one or more instance types that include pre-loaded quantum algorithms. As shown in the example of FIG. 2B, the catalog 200 may indicate a quantum instance type C 210C that is bundled with a particular quantum algorithm 165. The instance type 210C and algorithm 165 may represent a template for solving a type of problem in a particular domain. Based on the client's selection of the instance type 210C, the quantum instance 161C of that type may be provisioned and attached to the classical computing instance 110. In one embodiment, the selected quantum algorithm 165 may be pre-loaded on the quantum computing instance 161C by the service 100.

Figure 2C:
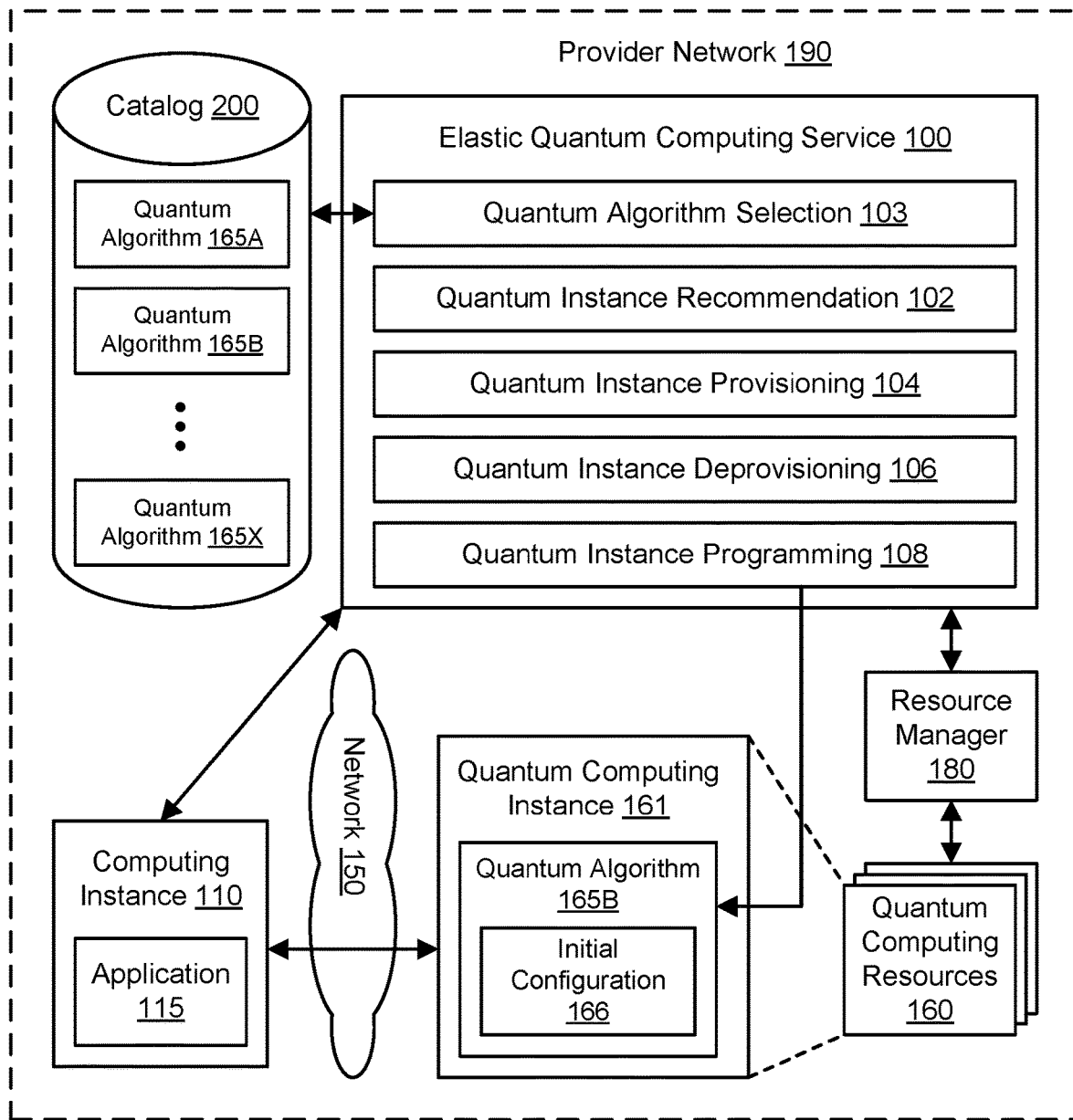
FIG. 2C illustrates further aspects of the example system environment for cloud-based access to quantum computing resources, including a catalog that offers quantum algorithms for use with quantum computing instances, according to one embodiment.

FIG. 2C illustrates further aspects of the example system environment for cloud-based access to quantum computing resources, including a catalog that offers quantum algorithms for use with quantum computing instances, according to one embodiment. In one embodiment, information describing a set of available quantum algorithms may be stored in a catalog 200. As shown in the example of FIG. 2C, the catalog 200 may indicate a quantum algorithm 165A, a quantum algorithm 165B, a quantum algorithm 165X, and so on. In one embodiment, at least some of the quantum algorithms 165A-165X may be designed for particular problem domains, such as molecular modeling, integer factorization, and so on. The elastic quantum computing service 100 may include a quantum algorithm selection component 103 that accesses the algorithm information in the catalog 200, presents information about the available algorithms, and permits clients to choose from among the algorithms, e.g., using a graphical user interface. In one embodiment, the client may be presented with both a set of available algorithms and a recommendation of one or more of the algorithms (as generated using the recommendation component 102). Upon receipt of user input representing a client's selection of a quantum algorithm, such as algorithm 165B, the service 100 may program the selected algorithm into the quantum computing instance 161. The initial configuration 166 may be selected from the catalog 200 or provided by the client.

Figure 2D:
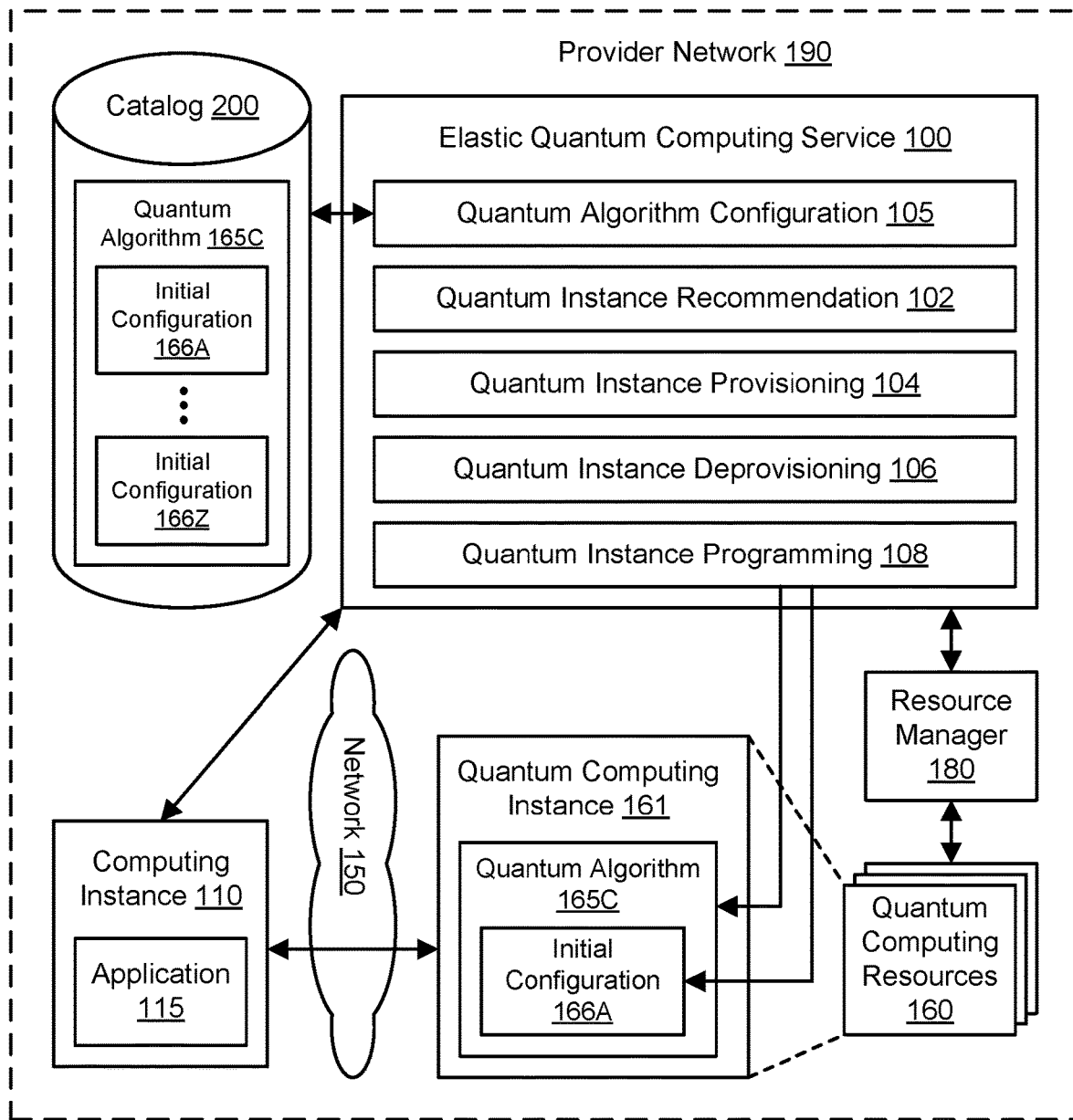
FIG. 2D illustrates further aspects of the example system environment for cloud-based access to quantum computing resources, including a catalog that offers quantum algorithms with options for different initial configurations, according to one embodiment.

FIG. 2D illustrates further aspects of the example system environment for cloud-based access to quantum computing resources, including a catalog that offers quantum algorithms with options for different initial configurations, according to one embodiment. In one embodiment, for particular quantum algorithms such as algorithm 165C, the catalog 200 may indicate options for the initial configuration of the algorithm. As shown in the example of FIG. 2D, the catalog may include various initial configurations 166A through 166Z for the algorithm 165C. Each of the initial configurations 166A-166Z may include initial values for the qubits of a quantum computing instance. The elastic quantum computing service 100 may include a quantum algorithm configuration component 105 that accesses the configuration information in the catalog 200, presents information about the available configurations, and permits clients to choose from among the configurations, e.g., using a graphical user interface. Based on the client's selection of an initial configuration such as configuration 166A, the service 100 may set the desired values for the quantum algorithm to be run on the quantum computing instance 161.

Figure 3A:
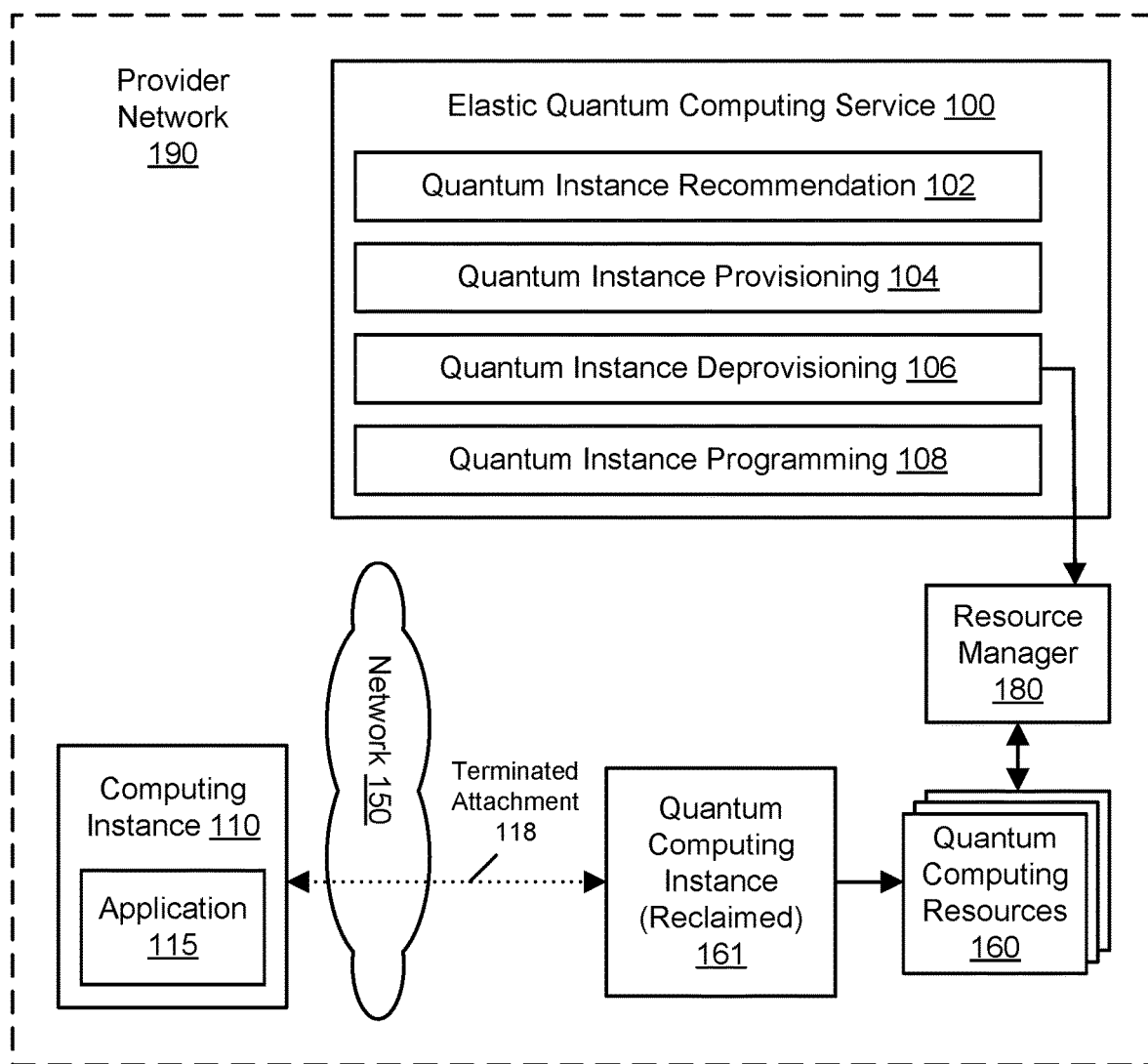
FIG. 3A illustrates further aspects of the example system environment for cloud-based access to quantum computing resources, including reclamation of a quantum computing instance whose attachment to a classical computing instance has been terminated, according to one embodiment.

FIG. 3A illustrates further aspects of the example system environment for cloud-based access to quantum computing resources, including reclamation of a quantum computing instance whose attachment to a classical computing instance has been terminated, according to one embodiment. As discussed above, the attachment 118 between a classical computing instance 110 and a quantum computing instance 161 may be temporary and may eventually be terminated. The attachment 118 may be terminated based (at least in part) on a request from the classical instance 110 or from a client associated with that instance. The attachment 118 may be terminated automatically upon expiration of a reservation of the quantum computing instance 161, e.g., for a predetermined period of time. The attachment 118 may be terminated automatically based on an error at the classical computing instance 110, an error at the quantum computing instance 161, or an error in the networking infrastructure 150. In one embodiment, the attachment 118 may be terminated automatically if the quantum instance 161 has been left idle by the classical instance 110 beyond some threshold period of time, e.g., per an agreement between the provider network 190 and the client. In one embodiment, the attachment 118 may be terminated automatically upon completion of a run of a quantum algorithm on the quantum computing instance 161.

In one embodiment, when the service 100 detects that the attachment 118 is terminated, the service may reclaim the resource(s) used to implement the quantum computing instance 161. The quantum computing resource(s) used to implement the quantum computing instance 161 may be returned to the pool of available quantum computing resources 160. Reclaiming the quantum computing instance 161 may include deprogramming the quantum algorithm, erasing or resetting the values of any qubits, removing any client-specific data or metadata associated with the quantum instance (e.g., in a classical component that is local to the quantum computer and that manages the quantum computer), and/or otherwise preparing the reclaimed quantum computing resources for reuse by the same client or another client.

Figure 3B:
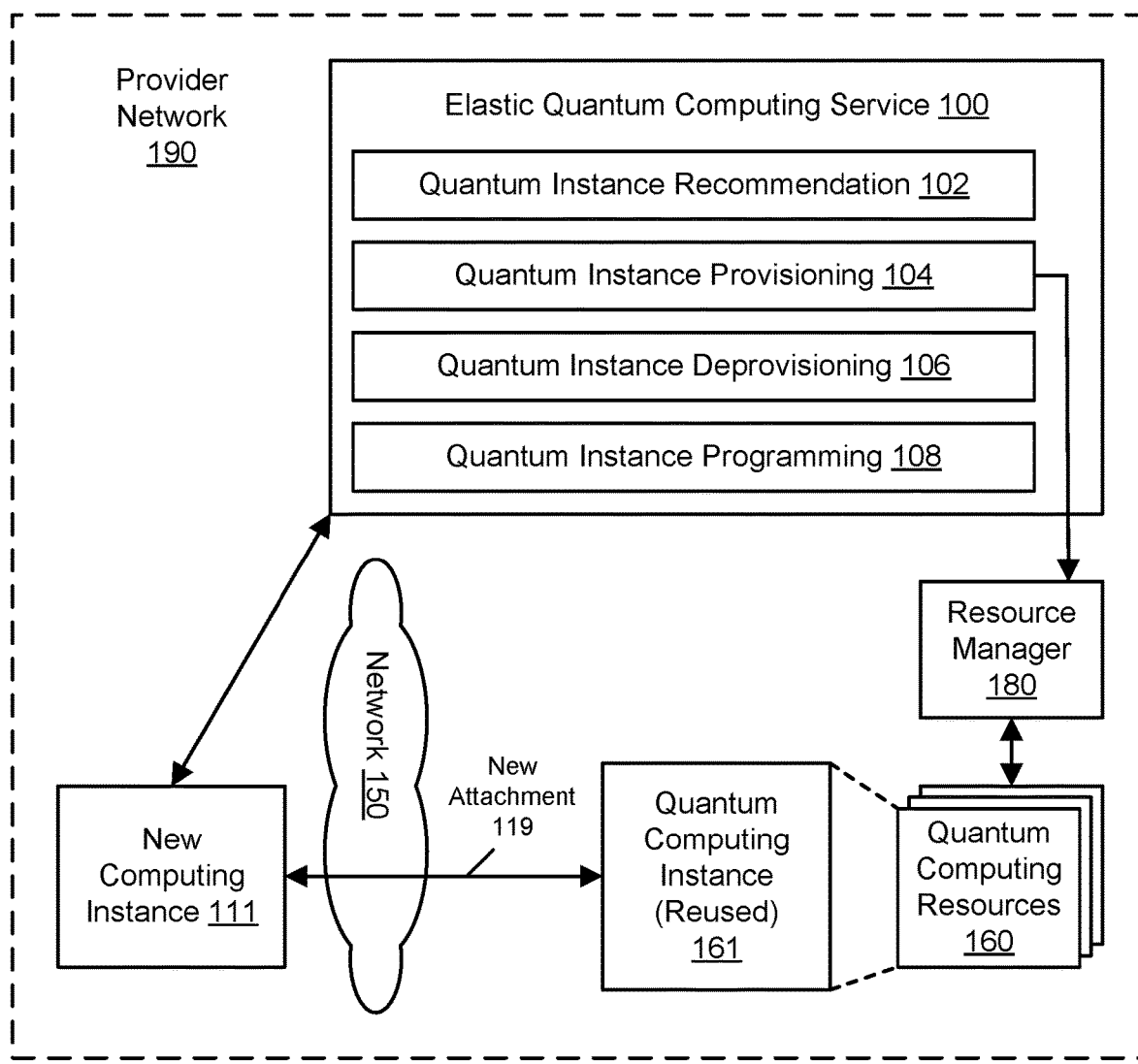
FIG. 3B illustrates further aspects of the example system environment for cloud-based access to quantum computing resources, including reuse of a reclaimed quantum computing instance for attachment to another classical computing instance, according to one embodiment.

FIG. 3B illustrates further aspects of the example system environment for cloud-based access to quantum computing resources, including reuse of a reclaimed quantum computing instance for attachment to another classical computing instance, according to one embodiment. Reclaimed quantum computing resources may be available for provisioning and attachment by the same client or different clients. If an attachment request is received that specifies a new classical computing instance 111, the service 100 may re-use the previously reclaimed quantum computing resources to attach and re-use the quantum computing instance 161. The quantum computing instance 161 may keep the same quantum algorithm it had before or may instead be programmed with a different quantum algorithm. The service 100 may establish a new attachment 119 between the quantum instance 161 and the classical instance 111 over the network 150. In this way, quantum computing resources 160 hosted in the cloud may be used and re-used for various clients. Similarly, a particular classical instance may use different quantum instances at different points in time.

Figure 4A:
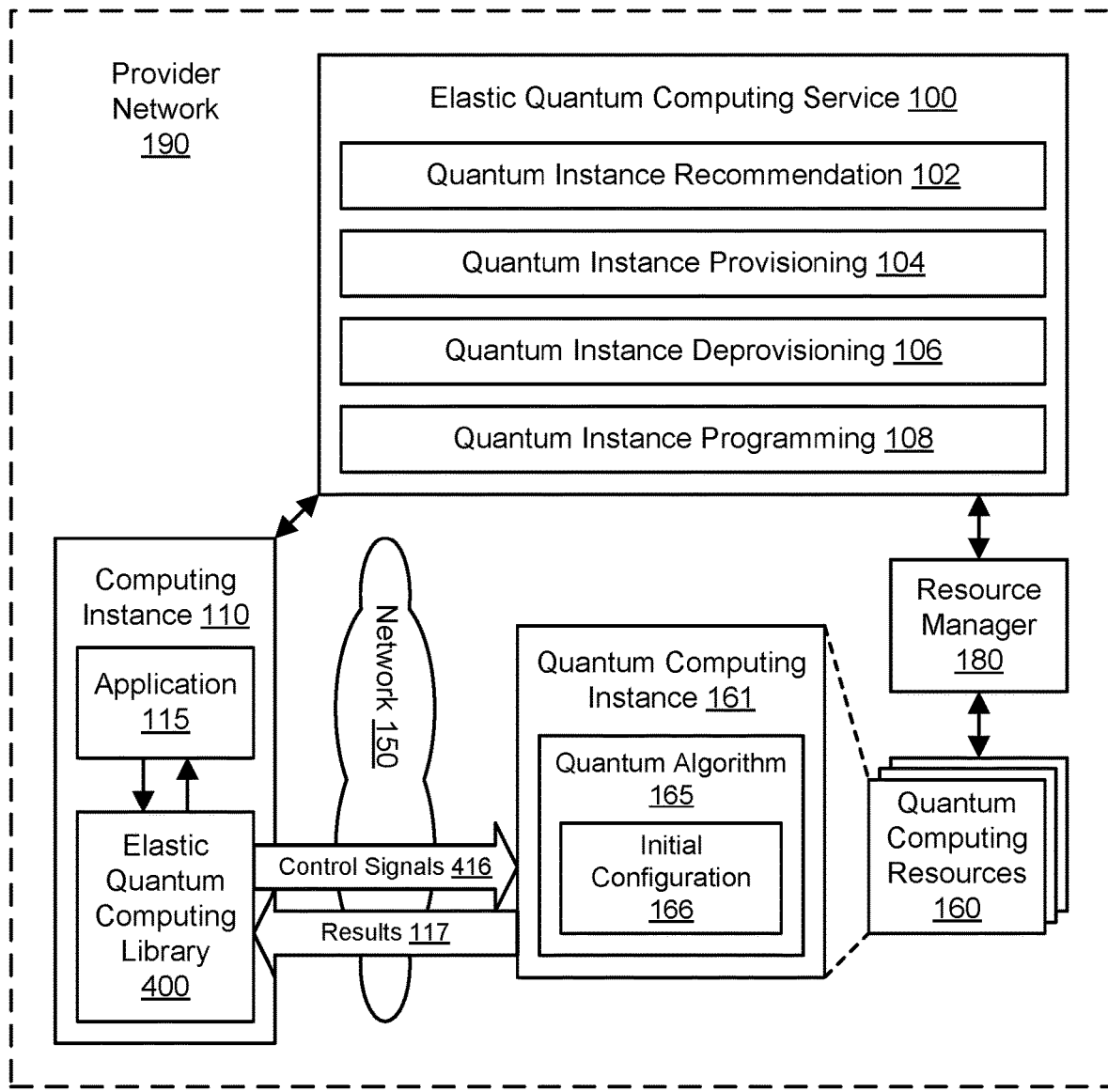
FIG. 4A illustrates further aspects of the example system environment for cloud-based access to quantum computing resources, including an elastic quantum computing library that permits interaction between a classical computing instance and a quantum computing instance, according to one embodiment.

FIG. 4A illustrates further aspects of the example system environment for cloud-based access to quantum computing resources, including an elastic quantum computing library that permits remote interaction between a classical computing instance and a quantum computing instance, according to one embodiment. In one embodiment, the classical computing instance 110 may include an elastic quantum computing library 400. The library 400 may replace or supplement a standard interface that permits applications to interact with locally accessible quantum computers; by replacing or supplementing the standard interface, the library 400 may make the quantum computing instance 161 remotely accessible. The library 400 may intercept calls from the application 115, such as calls to invoke the functionality of a quantum computer. The library 400 may translate the calls into appropriate control signals 416 that can natively control the operation of the quantum computing instance 161. For example, the control signals 416 may cause the algorithm 165 to be programmed into the instance 161, may cause the initial values 166 to be set or reset, may cause the algorithm to be run one or more times, and so on. The library 400 may serialize and send the control signals 416 over the network 150 to the quantum computing instance 161 to control its operation. In one embodiment, each run of the algorithm 165 may generate results 117 that may be returned to the library 400 over the network 150. The library 400 may forward the results 117 directly to the application 115 or may aggregate the results of multiple runs before forwarding the aggregated results to the application. In one embodiment, the library 400 may select and/or optimize a quantum algorithm based on a request by the application 115 to perform a task.

In one embodiment, to invoke the functionality of the quantum computing instance 161, the application 115 or another element of the classical computing instance 110 may generate one or more calls to an external service. For example, the elastic quantum computing service 100 may accept, via a service interface, calls to program the algorithm 165 into the instance 161, set or reset the initial values 166, run the algorithm one or more times, and so on. Results of runs may also be returned to the classical instance 110 via the service 100. In one embodiment, the classical instance 110 may submit algorithms or jobs to the service 100, and the service may schedule the algorithms or jobs to be run on the quantum instance 161.

Figure 4B:
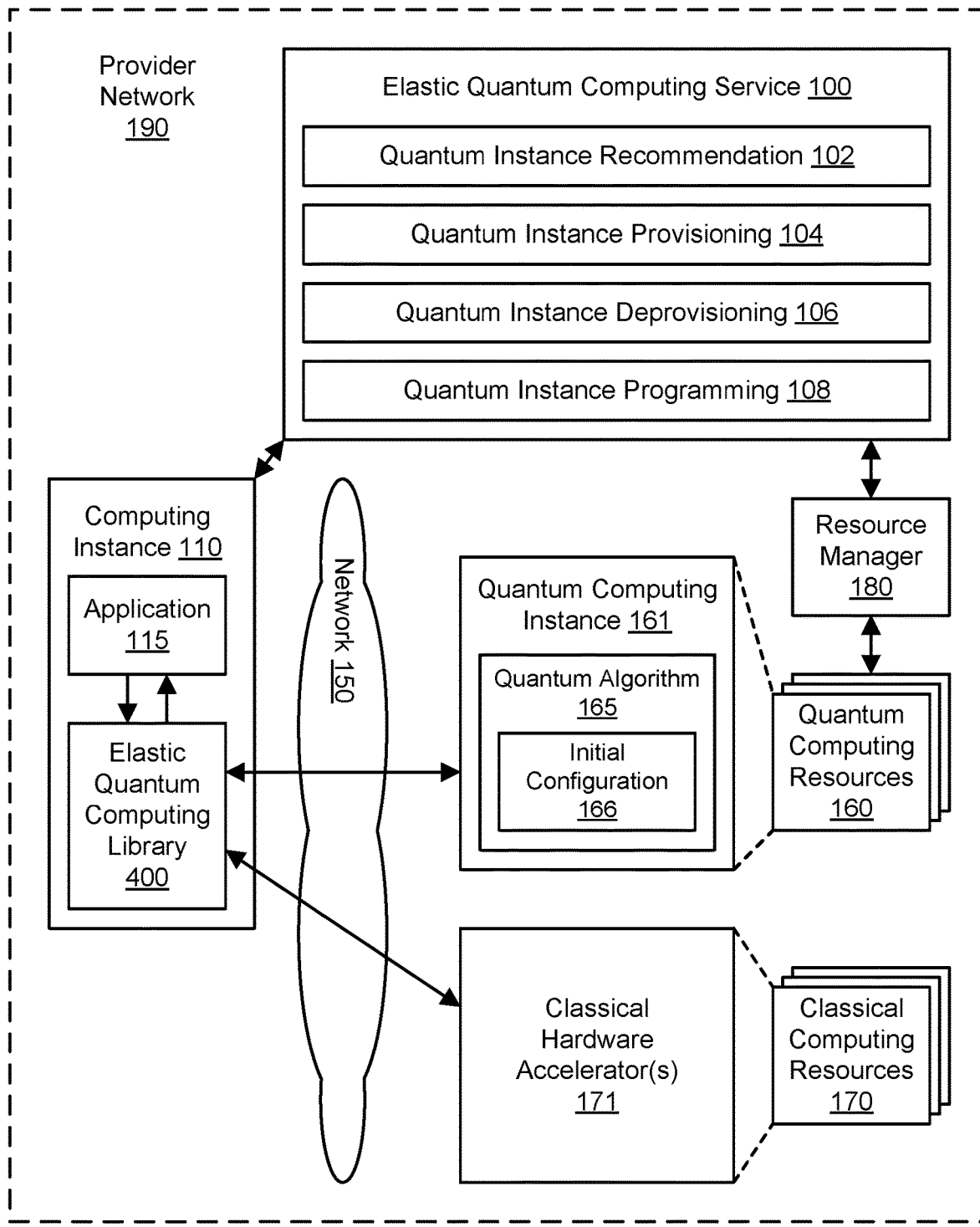
FIG. 4B illustrates further aspects of the example system environment for cloud-based access to quantum computing resources, including an elastic quantum computing library that permits interaction between a classical computing instance and various types of accelerators, according to one embodiment.

FIG. 4B illustrates further aspects of the example system environment for cloud-based access to quantum computing resources, including an elastic quantum computing library that permits interaction between a classical computing instance and various types of accelerators, according to one embodiment. In one embodiment, the elastic quantum computing library 400 may permit the computing instance 110 to interact with both a quantum computing instance 161 and one or more classical hardware-based accelerator(s) 171. For example, the accelerator(s) 171 may include one or more GPUs, one or more FPGAs, one or more ASICs, and so on. The accelerator(s) 171 may be provisioned from a pool of classical computing resources 170 of the provider network 190 for use by the computing instance 110. In one embodiment, the library 400 may determine whether to accelerate a given call with the quantum computing instance 161 or with one or more of the classical accelerators 171. For example, if the application 115 generates a request to perform a molecular modeling task, the library 400 may analyze the request and determine whether to assign the task to the quantum computing instance 161, to one or more of the classical accelerators 171, or to a combination of the quantum computing instance 161 and the accelerator(s) 171. The library 400 may make the determination based on machine learning or other analysis of past usage of the quantum computing instance 161 and the accelerator(s) 171, e.g., the runtime, accuracy, and/or cost of prior runs. The library 400 may marshal any results returned by the quantum computing instance 161 and/or accelerator(s) 171.

Figure 5A:
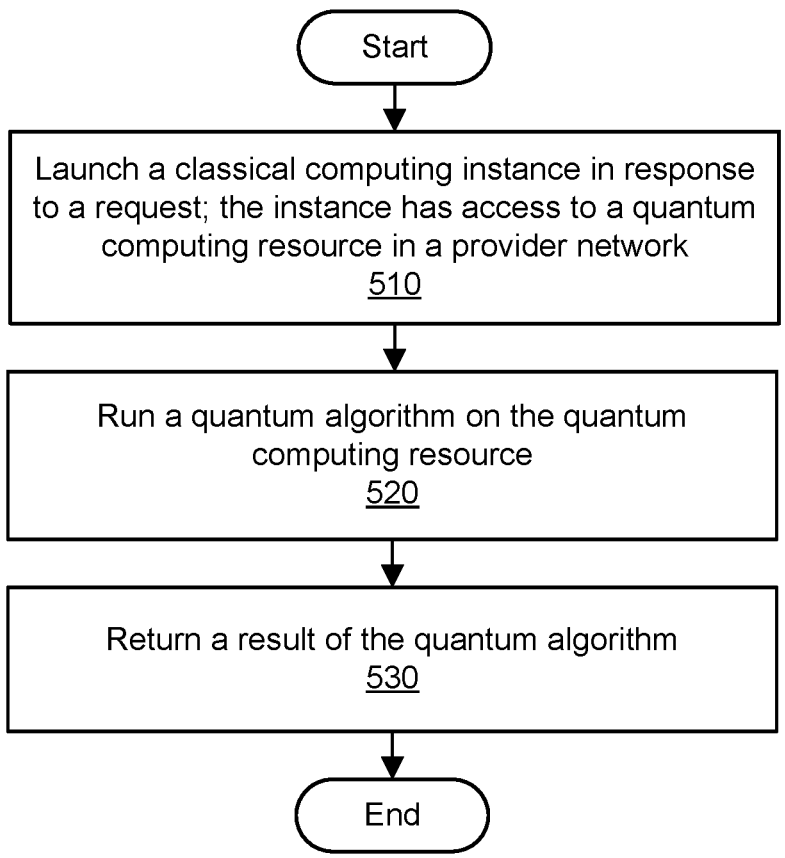
FIG. 5A and FIG. 5B are a flowcharts illustrating methods for cloud-based access to quantum computing resources, according to one embodiment.

FIG. 5A is a flowchart illustrating a method for cloud-based access to quantum computing resources, according to one embodiment. As shown in 500, a classical computing instance may be launched in response to a request from a client of a provider network. On or after the launch, the instance may have access to a quantum computing resource. In one embodiment, the quantum computing resource may represent a component that is physically included in or locally attached (via an interconnect) to the server that implements the classical computing instance. In one embodiment, the quantum computing resource may be attached to the classical instance over a network. The quantum computing resource may be referred to as a quantum computing instance if attached to the classical instance over a network. The quantum computing resource may be hosted in a cloud-based provider network, and in various embodiments the classical computing instance may be internal or external to the provider network. The quantum computing resource may rely on quantum-mechanical phenomena for their operation. A quantum computing device may include a plurality of quantum bits (qubits), each of which can be in a superposition of states.

As shown in 520, a quantum algorithm may be run on the quantum computing resource. The quantum computing instance may run the algorithm based (at least in part) on input associated with the classical computing instance, e.g., input by a user of the classical instance or input from the classical instance to the quantum computing resource. The input may represent a selection or programming of the particular algorithm, a selection or programming of the initial configuration of values for the algorithm, a decision to start the run at a particular time, and/or other control signals associated with operation of the quantum computing instance. Upon being measured, the system of qubits may collapse into one state, where each qubit represents a binary value (one or zero); this state may represent a result of one run of the quantum algorithm. As shown in 530, the result of one or more runs of the quantum algorithm may be returned, e.g., to the classical computing instance via the network or interconnect.

Figure 5B:
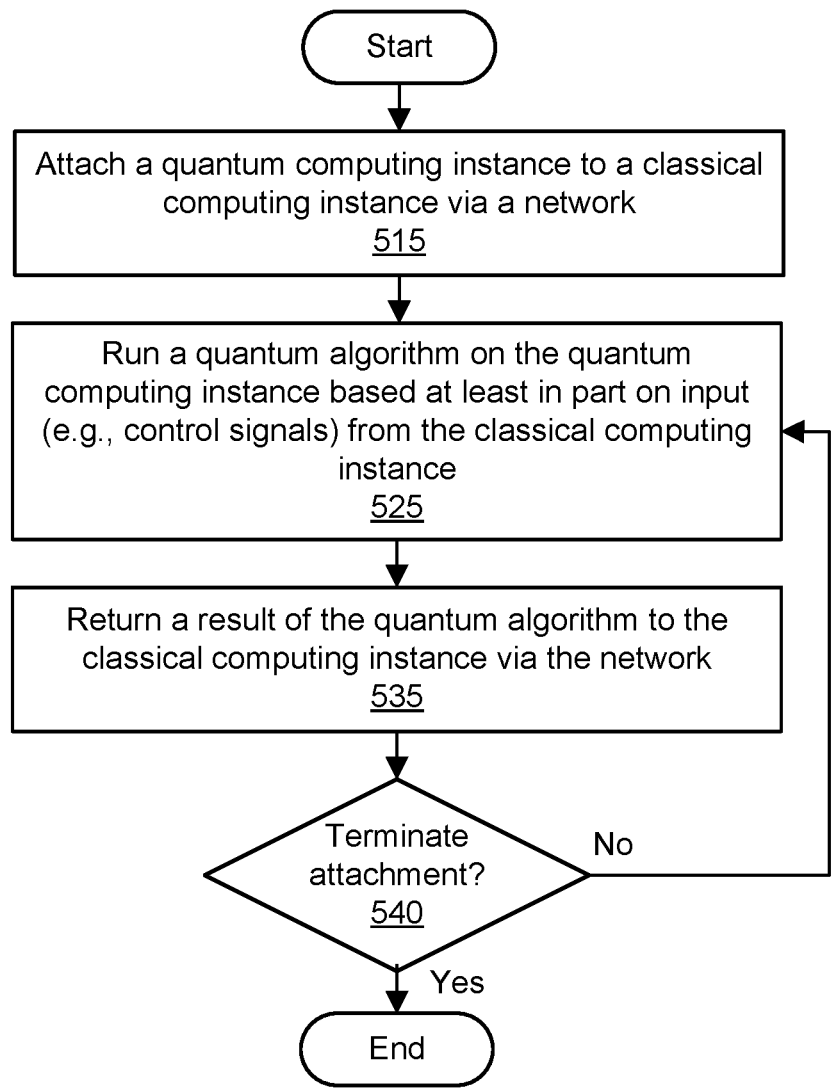

FIG. 5B is a flowchart illustrating a method for cloud-based access to quantum computing resources, according to one embodiment. As shown in 515, a quantum computing instance may be attached to a classical computing instance (e.g., a binary digital computing device) via a network. The quantum computing instance may be hosted in a cloud-based provider network, and in various embodiments the classical computing instance may be internal or external to the provider network. The quantum computing instance may be provisioned and attached in response to an attachment request associated with the classical computing instance. The quantum computing instance may be implemented using one or more quantum computing resources, such as computing devices that rely on quantum-mechanical phenomena for their operation. A quantum computing device may include a plurality of quantum bits (qubits), each of which can be in a superposition of states. In one embodiment, the quantum computing instance may correspond to one physical quantum computing device in the pool of quantum resources. In one embodiment, the quantum computing instance may correspond to a portion of one physical quantum computing device. In one embodiment, a single quantum computing device may be time-shared to offer its functionality to multiple tenants in manner that appears concurrent to the tenants.

As shown in 525, a quantum algorithm may be run on the quantum computing instance. The quantum computing instance may run the algorithm based (at least in part) on input from the classical computing instance. The input may represent a selection or programming of the particular algorithm, a selection or programming of the initial configuration of values for the algorithm, a decision to start the run at a particular time, and/or other control signals associated with operation of the quantum computing instance. Upon being measured, the system of qubits may collapse into one state, where each qubit represents a binary value (one or zero); this state may represent a result of one run of the quantum algorithm.

As shown in 535, the result of one or more runs of the quantum algorithm may be returned to the classical computing instance via the network. As shown in 540, the method may determine whether the attachment of the quantum computing instance to the classical computing instance has been terminated. If not, then the classical instance may continue to remotely use the functionality of the quantum instance, e.g., by performing one or more runs of the same quantum algorithm or a different quantum algorithm. If the attachment has been terminated, then the quantum computing instance may be reclaimed and prepared for re-use at a later time.

Service for Managing Quantum Computing Resources

Figure 6:
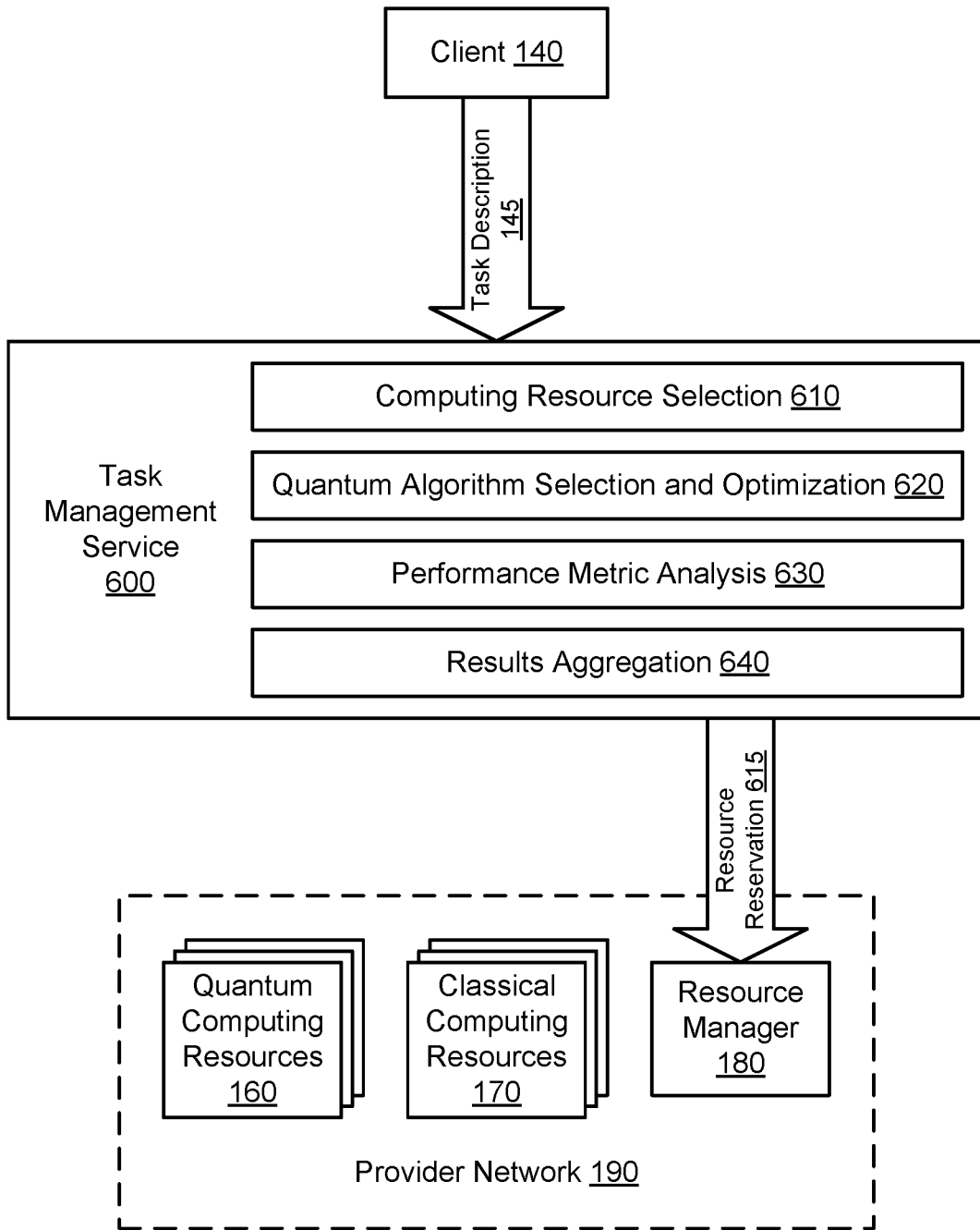
FIG. 6 illustrates an example system environment for a service for managing quantum computing resources, according to one embodiment.

FIG. 6 illustrates an example system environment for a service for managing quantum computing resources, according to one embodiment. A task management service 600 may manage the use of computing resources, including quantum computing resources 160, to perform tasks specified by clients. The computing resources managed by the task management service 600 may also include classical computing resources 170. The classical computing resources 170 may include servers, virtual compute instances, field-programmable gate arrays (FPGAs), graphics processing units (GPUs), and other types of computing devices and accelerators. In various embodiments, the task management service 600 may select appropriate resources for a particular task, provision or reserve the selected resources, invoke the functionality of the selected resources to perform the task, and marshal the results of the task. In some embodiments, the task management service 600 may use both quantum computing resources 160 and classical computing resources 170 to perform a particular task, e.g., where the different types of resources perform different portions of the task. In some embodiments, the task management service 600 may use both quantum computing resources 160 and classical computing resources 170 to perform the same task, and the service may analyze the results to influence the selection of resources for future tasks. Using the techniques described herein, the task management service 600 may introduce a layer of intelligent management of computing resources such that clients may delegate management of resources to the service.

As discussed above, the quantum computing resources 160 may be hosted "in the cloud," e.g., in a cloud-based provider network 190 whose resources are remotely accessible to clients. Quantum computing resources 160 may include computing devices that rely on quantum-mechanical phenomena for their operation. A quantum computing device, also referred to as a quantum computer, may include a plurality of quantum bits (qubits). A quantum bit can be in a superposition of states. A quantum computer with n qubits may be in a superposition of $2^n$ different states simultaneously, while a non-quantum (classical) computer may be in only one of those states at a given time. A quantum computer may run a quantum algorithm that includes a sequence of quantum logic gates; a problem may be encoded by setting the initial configuration of values of the qubits. When measured, the system of qubits may collapse into one of the $2^n$ states, where each qubit represents a binary value (one or zero). Using these principles, quantum computing resources 160 may solve some problems much faster than a classical computer. For example, the quantum computing resources 160 may be used to solve complex problems in domains such as machine learning, financial portfolio optimization, molecular modeling, climate modeling, integer factorization, simulation, and so on. Quantum algorithms may often provide an exponential or quadratic speedup over their classical computing counterparts. In some embodiments, the quantum computing resources 160 may run quantum algorithms such as Grover's algorithm, the Deutsch-Jozsa algorithm, Shor's algorithm, a quantum Fourier transform, a family of quantum algorithms involving amplitude amplification, adiabatic quantum computation, quantum error connection, and so on.

In one embodiment, the quantum computing resources 160 may be used to implement a plurality of quantum computing instances that can be managed on behalf of clients (such as client 140). In one embodiment, one quantum computing instance may correspond to one physical quantum computing device in the quantum resources 160. In one embodiment, a plurality of quantum computing instances may be provided by one physical quantum computing device in the quantum resources 160. In one embodiment, a single quantum computing device in the quantum resources 160 may be time-shared to offer its functionality to multiple tenants in manner that appears concurrent to the tenants. The time-sharing may be implemented using a control plane associated with the quantum computing resources 160, e.g., using the service 600 to facilitate the use of a single quantum computing device by different clients. In one embodiment, a quantum computing instance may represent a virtual instance that is implemented on top of the underlying physical quantum resources 160.

In one embodiment, the task management service 600 may provide mediated or indirect access to quantum computing resources 160 and potentially to classical computing resources 170 for a plurality of clients (such as client 140) of a provider network 190. In one embodiment, the service 600 may also be part of the provider network 190. The clients may represent customers of the provider network 190, and the clients may use various resources and services of the provider network in exchange for fees. The clients may operate various computing devices that represent a "classical" approach to computing in that they do not rely on quantum-mechanical phenomena for their operation. The client computing device 140 and classical computing resources 170 may represent binary digital computing devices such as the example computing device 3000 as shown in FIG. 20. A client 140 may submit a task description 145 that includes information describing one or more tasks that the client seeks to have the task management service 600 oversee. The task description 145 may include the name of a quantum algorithm, a description of a problem domain associated with quantum computing, a quantum algorithm itself, high-level programming code, an execution plan, an indication of desired results, and/or other suitable elements.

In various embodiments, client devices that submit task descriptions may have varying relationships to the provider network 190. In one embodiment, the client device 140 may represent a classical computing instance that is internal to the provider network 190, e.g., such that the underlying hardware resources of the instance 140 are hosted by the provider network. In one embodiment, the client device 140 may represent a virtual computing instance that is internal to the provider network 190. The virtual computing instance may be provided by a computing virtualization service of the provider network 190 using classical computing resources 170 that are hosted in the provider network. In one embodiment, a client device 140 may be external to the provider network 190, e.g., on client premises or otherwise in an environment not under the management of the provider network.

In various embodiments, the task management service 600 may include components to implement various types of functionality. In one embodiment, the task management service 600 may include a component for computing resource selection 610. For a particular task description 145, the computing resource selection component 610 may select one or more of the quantum computing resources 160 and/or one or more of the classical computing resources 170 to be used in performing the task. In one embodiment, the names or characteristics of the selected resources may not be described or specified by the client 140 but may instead be determined by the computing resource selection component 610. In one embodiment, the computing resources may be selected based (at least in part) on analysis of the task description 145. For example, the computing resource selection component 610 may determine the name or description of a particular quantum algorithm in the task description 145 and may then select a quantum computing resource that is specialized for performing that quantum algorithm. Similarly, the computing resource selection component 610 may determine the name or description of a particular quantum algorithm in the task description 145 and may then select a quantum computing resource with a pre-loaded version of the quantum algorithm. In one embodiment, the computing resources may be selected based (at least in part) on performance metric analysis 630, e.g., on analysis of performance metrics associated with prior tasks. For example, if a similar task (e.g., a task related to the same quantum computing problem domain or using a similar quantum algorithm) previously had superior performance on one type of resource in comparison to another, then the computing resource selection component 610 may select the resource that had the superior performance. In one embodiment, the computing resources may be selected based (at least in part) on a goal specified by the client 140, e.g., to optimize speed, accuracy, or cost. In one embodiment, the task management service 600 may recommend the use of particular quantum computing resources and/or classical computing resources to the client 140, and the resources may be selected and provisioned based (at least in part) on user input representing a selection among recommended options or a confirmation of the recommendation.

In one embodiment, computing resources may be selected at particular locations, e.g., in particular regions, data centers, or racks within data centers. The computing resources may be selected at particular locations in order to optimize the performance of the task, e.g., to minimize network latency. In one embodiment, one or more computing resources may be selected at edge locations that are closer (in terms of network latency) to the client's data. In one embodiment, one or more classical computing resources may be selected on client premises to be used with quantum computing resources in the provider network 190. The performance metrics of previous tasks may be used to influence the selection of particular locations for quantum resources and/or classical resources by the task management service 600.

In one embodiment, the computing resource selection component 610 (or another component of the service 600) may interact with a resource manager 180 to reserve the selected quantum computing resources 160 and classical computing resources 170. As shown in the example of FIG. 6, the computing resource selection component 610 may send a resource reservation request 615 to the resource manager 180. For a requested resource, the request 615 may indicate the high-level type of computing resource (e.g., quantum or classical), the desired characteristics of the resource (e.g., the qubit size for quantum resources or the memory and CPU class for classical resources), the name of an instance type, the reservation mode or duration, and/or other suitable characteristics. The quantum computing resources 160 and classical computing resources 170 may represent various pools of available resources, including quantum computing devices and classical computing devices in one or more data centers managed by the provider network 190. Provisioning a computing resource may include reserving one of the computing devices, or a portion of one of the computing devices, for use in performing a specified task on behalf of the client 140. In one embodiment, the computing resource selection component 610 may also interact with the resource manager 180 to deprovision computing resources. After a task is performed, the computing resource(s) used to implement the task may be returned to the pools of available computing resources 160 and 170. For example, deprovisioning a quantum computing instance may include deprogramming the quantum algorithm, erasing or resetting the values of any qubits, removing any client-specific data or metadata associated with the quantum instance (e.g., in a classical component that is local to the quantum computer and that manages the quantum computer), and/or otherwise preparing the reclaimed quantum computing resources for reuse at a later time. The task management service 600 may re-use the same quantum computing resource multiple times on behalf of the same client 140 and/or different clients.

In one embodiment, the task management service 600 may include a component for quantum algorithm selection and optimization 620. For a particular task description 145, the quantum algorithm selection and optimization 620 may select one or more of the quantum algorithms to be used in performing the task. In one embodiment, the quantum algorithm may be selected based (at least in part) on analysis of the task description 145. For example, the quantum algorithm selection and optimization 620 may determine the name or description of a particular quantum algorithm in the task description 145 and may then select a suitable version of that quantum algorithm. The quantum algorithm selection and optimization 620 may also configure the selected algorithm by determining an initial configuration representing initial values for qubits. In one embodiment, the quantum algorithm may be selected and/or configured based (at least in part) on performance metric analysis 630, e.g., on analysis of performance metrics associated with prior tasks. For example, if a similar task (e.g., a task in the same problem domain) previously had superior performance with one specific quantum algorithm and initial configuration in comparison to another, then the computing resource selection component 610 may select the algorithm and configuration that had the superior performance. In one embodiment, the quantum algorithm may be selected and optimized based (at least in part) on a goal specified by the client 140, e.g., to optimize speed, accuracy, or cost. In one embodiment, the quantum algorithm selection and optimization 620 may determine the number of times to run a particular algorithm. For example, due to the probabilistic nature of quantum computing, an algorithm may be run several times and the results aggregated. In one embodiment, the quantum algorithm selection and optimization 620 may determine when to change the quantum algorithm associated with a particular task 145. In one embodiment, the quantum algorithm selection and optimization 620 may determine when to change the initial configuration on a subsequent run of a particular algorithm. In one embodiment, the task management service 600 may recommend the use of particular quantum algorithms or configurations to the client 140, and an algorithm may be selected and programmed based (at least in part) on user input representing a selection among recommended options or a confirmation of the recommendation.

In one embodiment, the task management service 600 may include a component for performance metric analysis 630. The performance metric analysis 630 may collect and analyze metrics related to the performance of prior tasks. For example, the speed, accuracy, and/or cost of a particular quantum algorithm may be determined and stored by the performance metric analysis 630. Aggregate performance metrics may be maintained for quantum computing instance types, quantum algorithms, families of algorithms, initial configurations for algorithms, and so on. For classical computing resources, performance metrics may relate to processor usage, memory usage, storage usage, network usage, and so on. Performance metrics may be collected using instrumentation of individual resources, external services, and/or analysis by the task management service 600 (e.g., of the time to receive a result after a task has been submitted to a resource). The performance metric analysis may be used to influence the computing resource selection 610 and/or quantum algorithm selection 620.

In one embodiment, the task management service 600 may include a component for results aggregation 640. In one embodiment, the results aggregation 640 may collect and aggregate results of multiple runs of the same quantum algorithm on one or more quantum computing resources. The multiple runs may be performed in serial or in parallel. In one embodiment, the multiple runs of the same algorithm may increase the accuracy of the aggregate results due to the probabilistic nature of quantum computing. In one embodiment, the results aggregation 640 may collect and aggregate results from one or more quantum computing resources along with results from one or more classical computing resources. The quantum resources and classical resources may be used in serial or in parallel. In one embodiment, the quantum resources and classical resources may both be used for comparison of their respective results. In one embodiment, the quantum resources and classical resources may both be used for comparison of their respective runtime and/or cost to generate results.

The task management service 600 may be implemented using any suitable number and configuration of computing devices, any of which may be implemented by the example computing device 3000 illustrated in FIG. 20. The computing devices may be located in any suitable number of data centers or geographical locations. In various embodiments, at least some of the functionality of the service 600 may be provided by the same computing device or by different computing devices. If any of the components of the service 600 are implemented using different computing devices, then the components and their respective computing devices may be communicatively coupled, e.g., via one or more networks. Each of the components of the service 600 may represent any combination of software and hardware usable to perform their respective functions, as discussed as follows. Operations implemented by the service 600 may be performed automatically, e.g., without a need for user initiation or user intervention after an initial configuration stage, and programmatically, e.g., by execution of program instructions on at least one computing device. It is contemplated that the service 600 may include additional components not shown, fewer components than shown, or different combinations, configurations, or quantities of the components shown.

The task management service 600 may be implemented in a service-oriented system in which multiple services (e.g., the resource manager 180, a computing virtualization service, and so on) collaborate according to a service-oriented architecture. In such an environment, the service 600 may offer its functionality as to multiple clients in a substantially concurrent manner. It is contemplated that any suitable number and configuration of clients may interact with the service 600. To enable clients to invoke functionality, the service 600 may expose any suitable interface(s), such as one or more APIs or other programmatic interfaces and/or graphical user interfaces (GUIs). The service 100 may be implemented using a plurality of different instances that are distributed throughout one or more networks, and each instance may offer access to the functionality of the corresponding service to various clients. For example, multiple computing devices may each offer the functionality of the service 600 to clients in various locations. The functionality of the service 600, such as the use of quantum computing instances and/or classical computing instances to perform tasks, may be offered to the clients in exchange for fees.

Figure 7A:
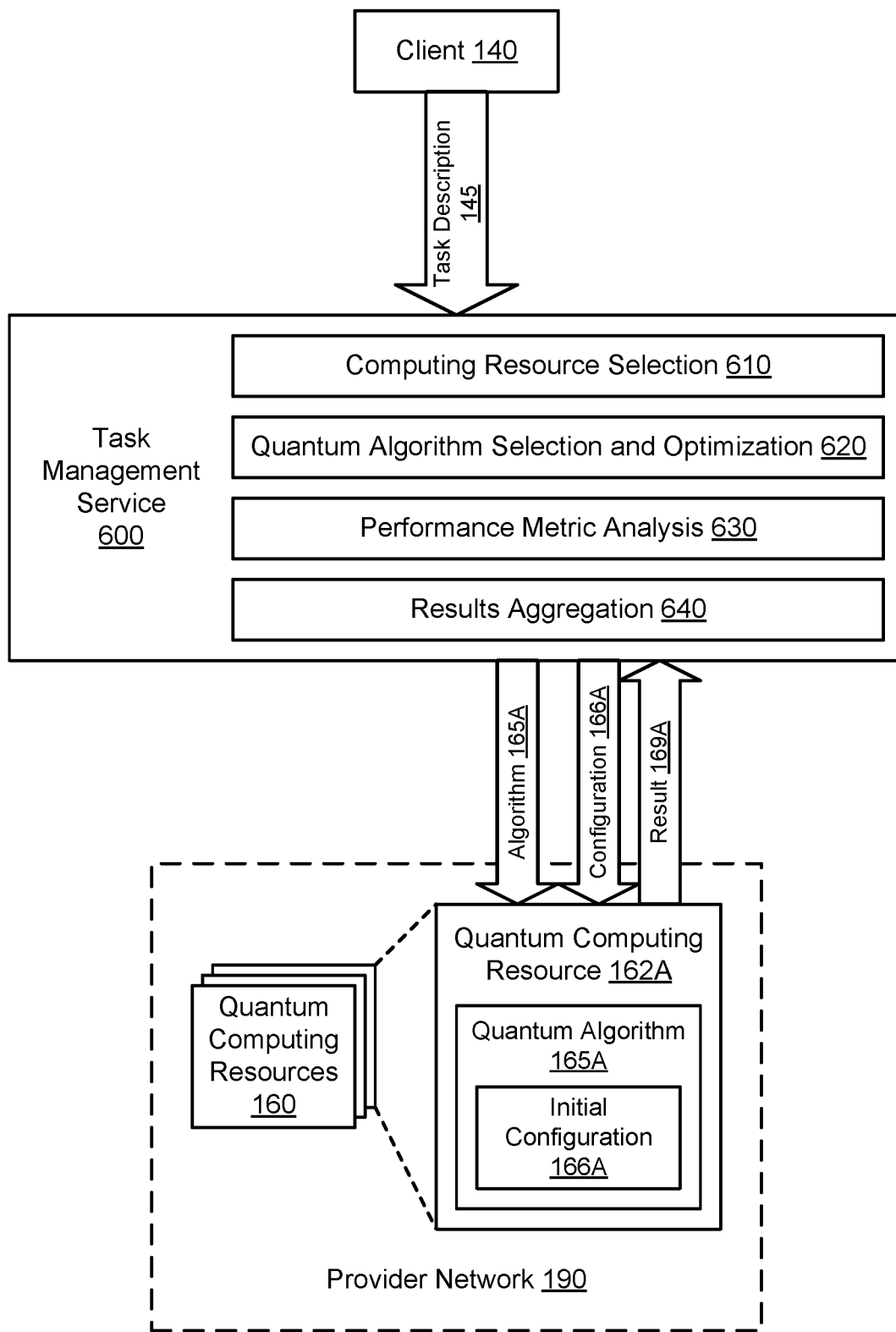
FIG. 7A illustrates further aspects of the example system environment for a service for managing quantum computing resources, including the service using a quantum computing resource to run a quantum algorithm with an initial configuration, according to one embodiment.

FIG. 7A illustrates further aspects of the example system environment for a service for managing quantum computing resources, including the service using a quantum computing resource to run a quantum algorithm with an initial configuration, according to one embodiment. In one embodiment, a component of the service 600 (such as the computing resource selection component 610) may interact with the resource manager 180 to configure the reserved resource(s). Configuring a reserved resource may include deploying a quantum algorithm 165A to a quantum computing resource 162A or deploying a set of executable operations to a classical computing resource. The quantum instance programming may configure a quantum algorithm 165A on a quantum computing resource 162A by providing an initial configuration 166A for the algorithm. The initial configuration 166A may represent initial values for qubits. In one embodiment, the quantum algorithm 165A may be provided or indicated by the client 140. In one embodiment, the quantum algorithm 165A may be selected by the client 140 from a catalog of algorithms offered by the provider network 190. In one embodiment, the quantum algorithm 165A may be pre-loaded on the quantum computing resource 162A, and the quantum computing resource may be selected by the computing resource selection component 610 due to its suitability for a particular problem domain.

In one embodiment, the task management service 600 may determine when to run the quantum algorithm 165A on the selected quantum computing resource 162A. For example, the service 600 may decide to run the algorithm without delay or may instead schedule the run for a later time, e.g., due to cost or resource availability. In one embodiment, the task management service 600 may determine how many times to run the quantum algorithm 165A on the selected quantum computing resource 162A. The initial configuration 166A may be reset before each run. A run may end upon measuring (observing) the qubits, and the qubits may collapse into a particular state where each qubit represents a binary value (one or zero). This state may represent the result 169A of the run of the algorithm 165A and may be provided back to the task management service 600. Quantum algorithms may be considered probabilistic such that they provide a solution with a certain probability, and the algorithm 165A may be run more than once to arrive at different results 169A. In one embodiment, by repeatedly setting the algorithm's initial values, running the algorithm, and measuring the algorithm's results, the probability of arriving at the correct answer may be increased.

Figure 7B:
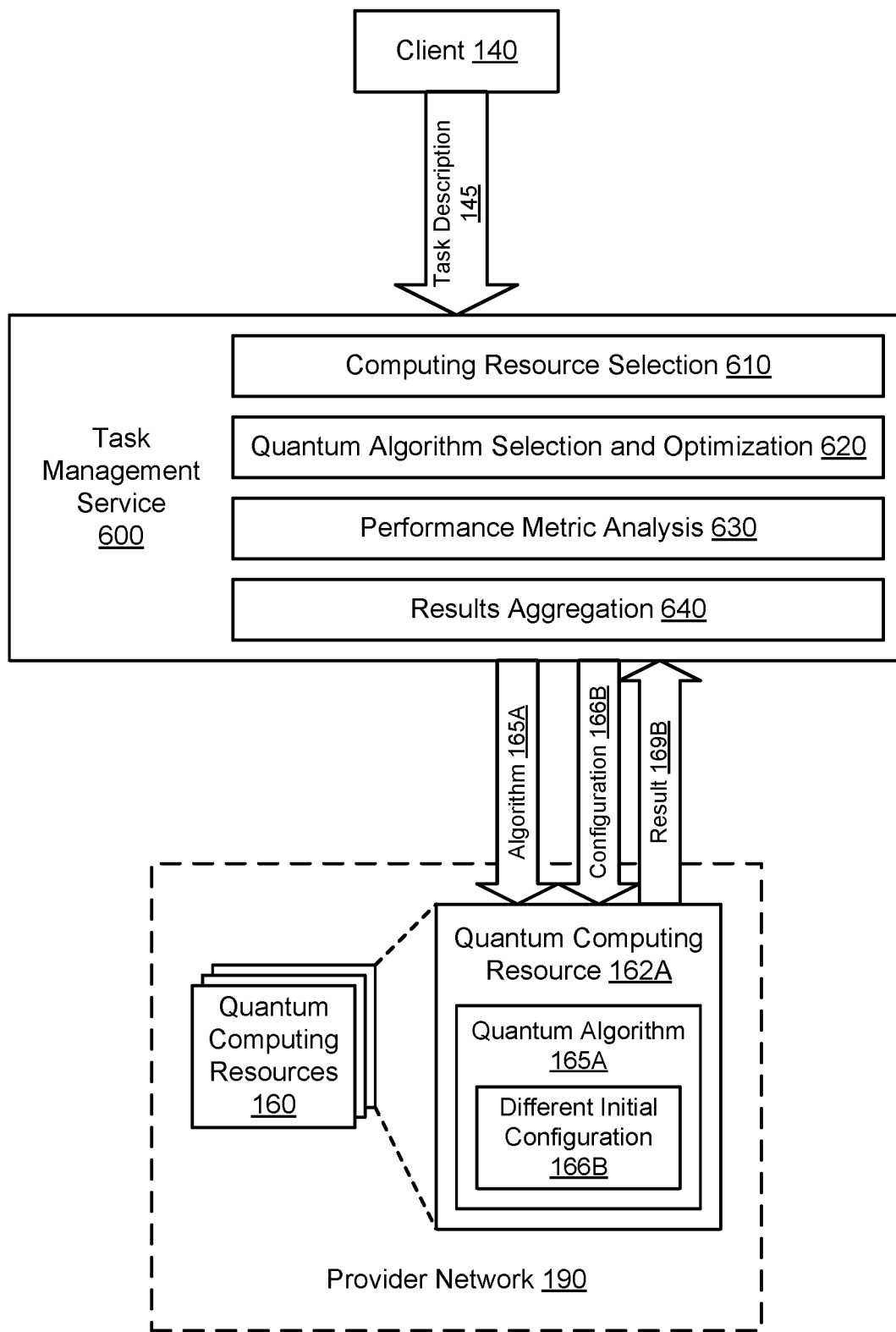
FIG. 7B illustrates further aspects of the example system environment for a service for managing quantum computing resources, including the service using the quantum computing resource to run the quantum algorithm with a different initial configuration, according to one embodiment.

FIG. 7B illustrates further aspects of the example system environment for a service for managing quantum computing resources, including the service using the quantum computing resource to run the quantum algorithm with a different initial configuration, according to one embodiment. In one embodiment, the task management service 600 may determine when to change the initial configuration of the quantum algorithm 165A on the selected quantum computing resource 162A. For example, the initial configuration may be changed to a different set of values 166B after the algorithm 165A has been run a certain number of times with the original configuration 166A. The algorithm 165A may be run one or more times with the new configuration 166B. In one embodiment, the result(s) 169B of the new configuration 166B may be aggregated with the result(s) of the original configuration 166A.

Figure 7C:
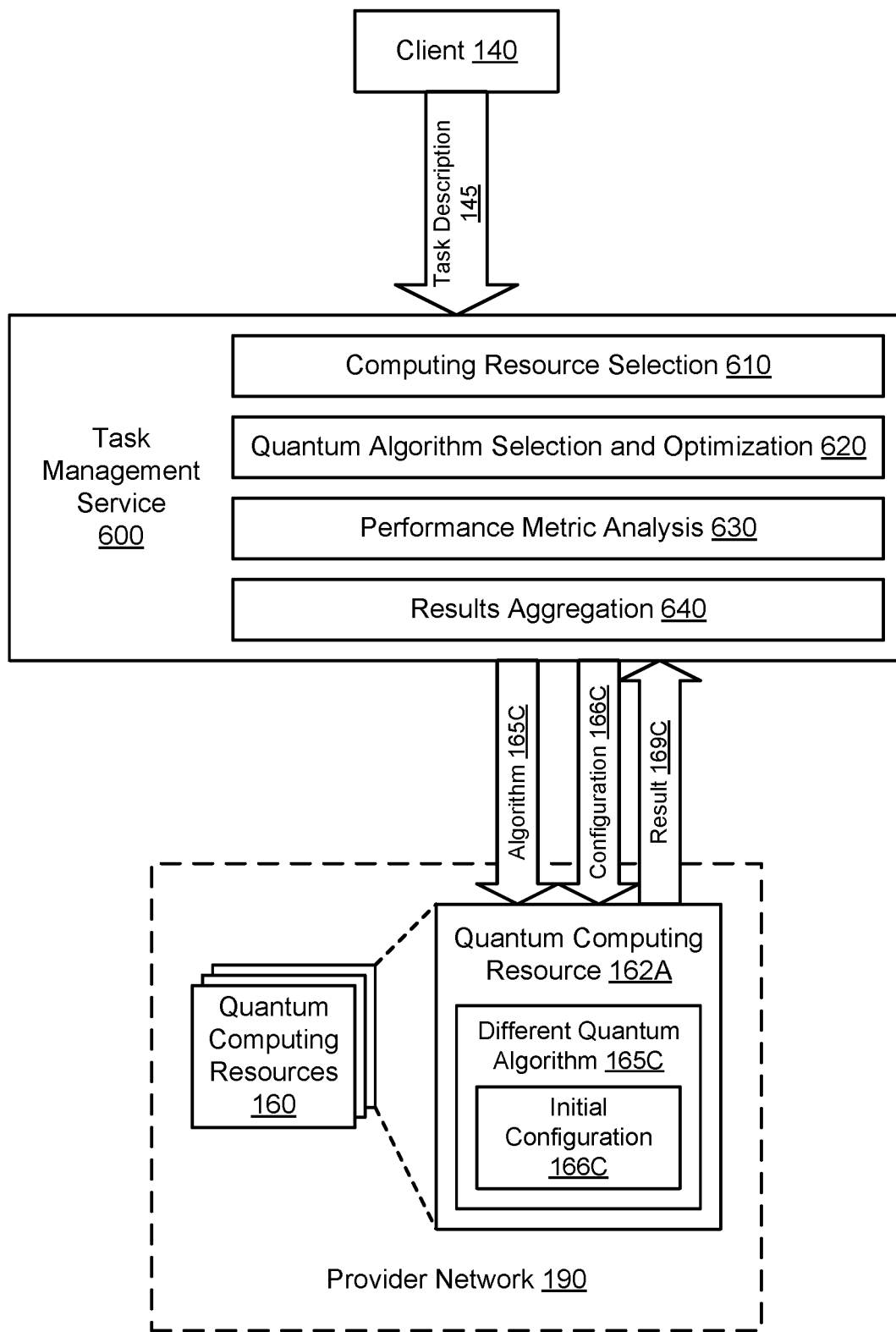
FIG. 7C illustrates further aspects of the example system environment for a service for managing quantum computing resources, including the service using the quantum computing resource to run a different quantum algorithm, according to one embodiment.

FIG. 7C illustrates further aspects of the example system environment for a service for managing quantum computing resources, including the service using the quantum computing resource to run a different quantum algorithm, according to one embodiment. In one embodiment, the task management service 600 may determine when to change the quantum algorithm on the selected quantum computing resource 162A. For example, the quantum computing resource 162A may be programmed with a different quantum algorithm 165C after the original algorithm 165A has been run a certain number of times. The quantum resource 162A may run the new algorithm 165C one or more times with its initial configuration 166C. In one embodiment, the result(s) 169C of the new algorithm 165C may be aggregated with the result(s) of the original algorithm 165A. In one embodiment, the service 600 may program the quantum resource 162A with the new algorithm 165C to perform a different task. The different task may be part of the same task description 145 or a new task description. The different task may be associated with the same client 140 or with a different client, such that the quantum computing resource 162A may be re-used for one or more clients.

In some embodiments, algorithms may be run or re-configured based (at least in part) on events. An event may be generated in the provider network and received by the task management service 600. The event may indicate a particular quantum algorithm to run on a particular quantum computing resource. The event may indicate a particular initial configuration to use for a particular quantum algorithm. The event may trigger a run of a quantum algorithm with a particular initial configuration. Events may be used to reprogram a quantum computing resource, determine the number of runs of a quantum algorithm, change the initial configuration for a run, and so on.

Figure 8:
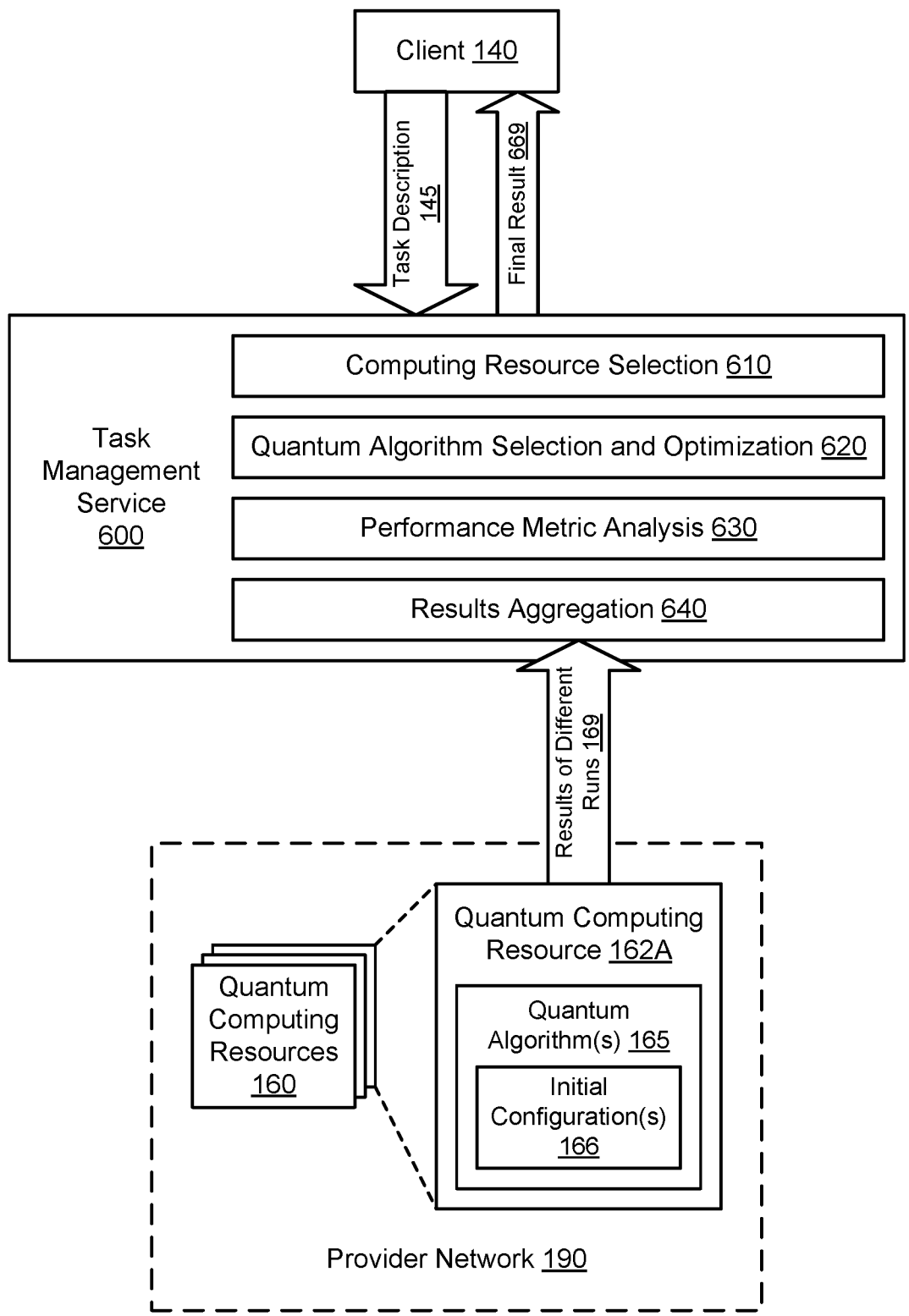
FIG. 8 illustrates further aspects of the example system environment for a service for managing quantum computing resources, including the service aggregating the results of multiple runs of one or more quantum algorithms, according to one embodiment.

FIG. 8 illustrates further aspects of the example system environment for a service for managing quantum computing resources, including the service aggregating the results of multiple runs of one or more quantum algorithms, according to one embodiment. In one embodiment, the results aggregation 640 may collect and aggregate results 169 of multiple runs of the same quantum algorithm 165 on one or more quantum computing resources 162A. The multiple runs may be performed in serial or in parallel. In one embodiment, the multiple runs of the same algorithm may increase the accuracy of the aggregate results due to the probabilistic nature of quantum computing. In one embodiment, the results 169 of the different runs may be aggregated into a final result 669 which is then provided to the client 140. In one embodiment, the final result 669 may be selected from among the results 169 of the different runs and provided to the client 140.

Figure 9:
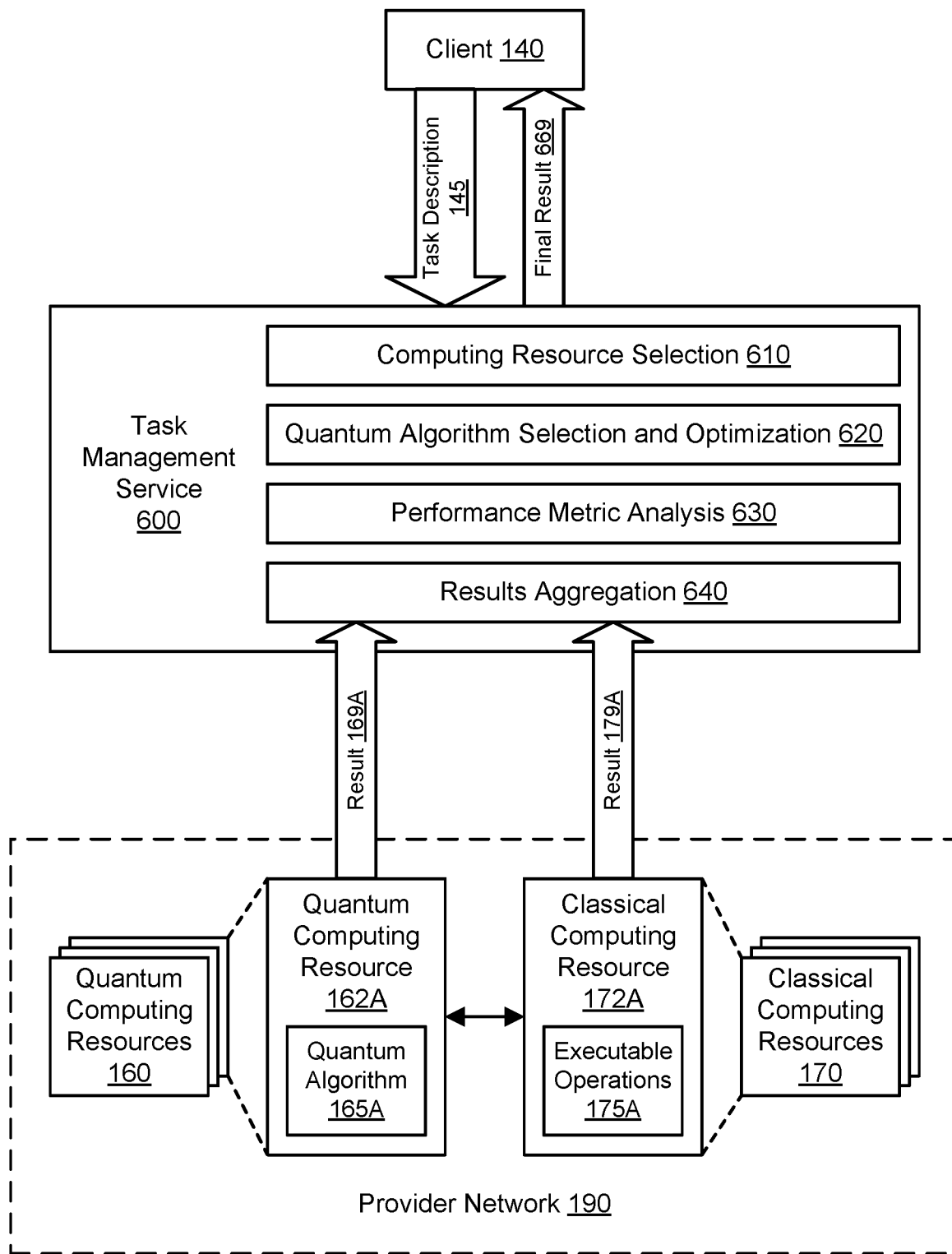
FIG. 9 illustrates further aspects of the example system environment for a service for managing quantum computing resources, including the service aggregating the results from a quantum computing resource and a classical computing resource, according to one embodiment.

FIG. 9 illustrates further aspects of the example system environment for a service for managing quantum computing resources, including the service aggregating the results from a quantum computing resource and a classical computing resource, according to one embodiment. In one embodiment, the results aggregation 640 may collect and aggregate results from one or more quantum computing resources 162A along with results from one or more classical computing resources 172A. The quantum resource(s) 162A may run a quantum algorithm 165A to generate results 169A over one or more runs, and the classical resource(s) 172A may perform a series of executable operations 175A to generate results 179A. The quantum resource(s) 162A and classical resource(s) 172A may be used in serial or in parallel. In one embodiment, the quantum resource(s) 162A and classical resource(s) 172A may both be used for comparison of their respective results. In one embodiment, the quantum resource(s) 162A and classical resource(s) 172A may both be used for comparison of their respective runtime and/or cost to generate results. In one embodiment, the results 169A and 179A may be aggregated into a final result 669 which is then provided to the client 140. In one embodiment, the final result 669 may be selected from among the results 169A and 179A and provided to the client 140, e.g., based on the speed or accuracy of the individual results. In one embodiment, the quantum resource(s) 162A and classical resource(s) 172A may perform different portions of the main task and may each produce a portion of a final result 669.

In one embodiment, the quantum resource 162A and the classical resource 172A may interact to perform one or more tasks. For example, the classical resource 172A may perform a pre-processing step, and the output of the pre-processing step may represent input to the quantum algorithm 165A. As another example, the classical resource 172A may perform a post-processing step, and the input to the post-processing step may represent output of the quantum algorithm 165A. As yet another example, the classical resource 172A may determine when to begin a run of the quantum algorithm 165A, how to set the initial configuration of the algorithm, how many runs of the quantum algorithm to perform, and so on. In one embodiment, the result 169A and/or result 179A may represent intermediate results. The intermediate results may be gathered by the results aggregation component 640 before being used for subsequent stages at the quantum resource 162A and/or classical resource 172A.

Figure 10:
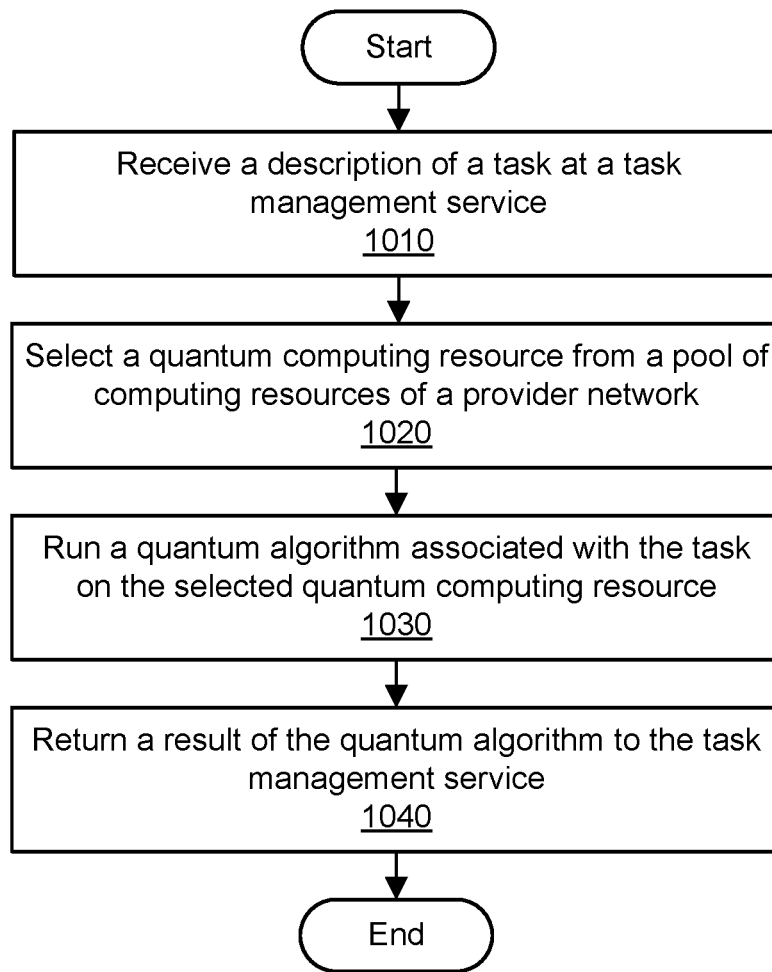
FIG. 10 is a flowchart illustrating a method for using a service for managing quantum computing resources, according to one embodiment.

FIG. 10 is a flowchart illustrating a method for using a service for managing quantum computing resources, according to one embodiment. As shown in 1010, a description of a task may be received at a task management service. A client of the task management service may submit a task description that includes information describing one or more tasks that the client seeks to have the task management service oversee. The task description may include the name of a quantum algorithm, a description of a problem domain associated with quantum computing, a quantum algorithm itself, high-level programming code, an execution plan, an indication of desired results, and/or other suitable elements.

As shown in 1020, a quantum computing resource may be selected from a pool of computing resources of a provider network. The provider network may host quantum computing resources and classical computing resources. For this particular task description, the task management service may select one or more of the quantum computing resources and potentially one or more of the classical computing resources to be used in performing the task. The classical computing resources may include servers, virtual compute instances, field-programmable gate arrays (FPGAs), graphics processing units (GPUs), and other types of computing devices and accelerators. In one embodiment, the names or characteristics of the selected resources may not be described or specified by the task description but may instead be determined by the task management service. In one embodiment, the computing resources may be selected based (at least in part) on analysis of the task description. For example, the task management service may determine the name or description of a particular quantum algorithm in the task description and may then select a quantum computing resource that is specialized for performing that quantum algorithm. In one embodiment, the computing resource(s) may be selected based (at least in part) on analysis of performance metrics associated with prior tasks. For example, if a similar task (e.g., a task related to the same quantum computing problem domain or using a similar quantum algorithm) previously had superior performance on one type of resource in comparison to another, then the task management service may select the resource that had the superior performance. In one embodiment, the computing resource(s) may be selected based (at least in part) on a goal specified by the client, e.g., to optimize speed, accuracy, or cost.

As shown in 1030, the selected quantum computing resource may run a quantum algorithm associated with the task. In one embodiment, the quantum algorithm may be selected and/or optimized based (at least in part) on analysis of the task description. For example, the task management service may determine the name or description of a particular quantum algorithm in the task description and may then select a suitable version of that quantum algorithm. The task management service may also configure the selected algorithm by determining an initial configuration representing initial values for qubits. In one embodiment, the quantum algorithm may be selected and/or configured based (at least in part) on analysis of performance metrics associated with prior tasks. For example, if a similar task (e.g., a task in the same problem domain) previously had superior performance with one specific quantum algorithm and initial configuration in comparison to another, then the task management service may select the algorithm and configuration that had the superior performance. In one embodiment, the quantum algorithm may be selected and optimized based (at least in part) on a goal specified by the client, e.g., to optimize speed, accuracy, or cost.

As shown in 1040, a result of the quantum algorithm may be returned to the task management service. The quantum resource may run the algorithm one or more times with one or more sets of initial configuration values. The initial configuration may be reset before each run. A run may end upon measuring (observing) the qubits, and the qubits may collapse into a particular state where each qubit represents a binary value (one or zero). This state may represent the result of the run of the algorithm and may be provided back to the task management service. Quantum algorithms may be considered probabilistic such that they provide a solution with a certain probability, and the algorithm may be run more than once to arrive at different results. In one embodiment, by repeatedly setting the algorithm's initial values, running the algorithm, and measuring the algorithm's results, the probability of arriving at the correct answer may be increased.

Development Environment for Programming Quantum Computing Resources

Figure 11A:
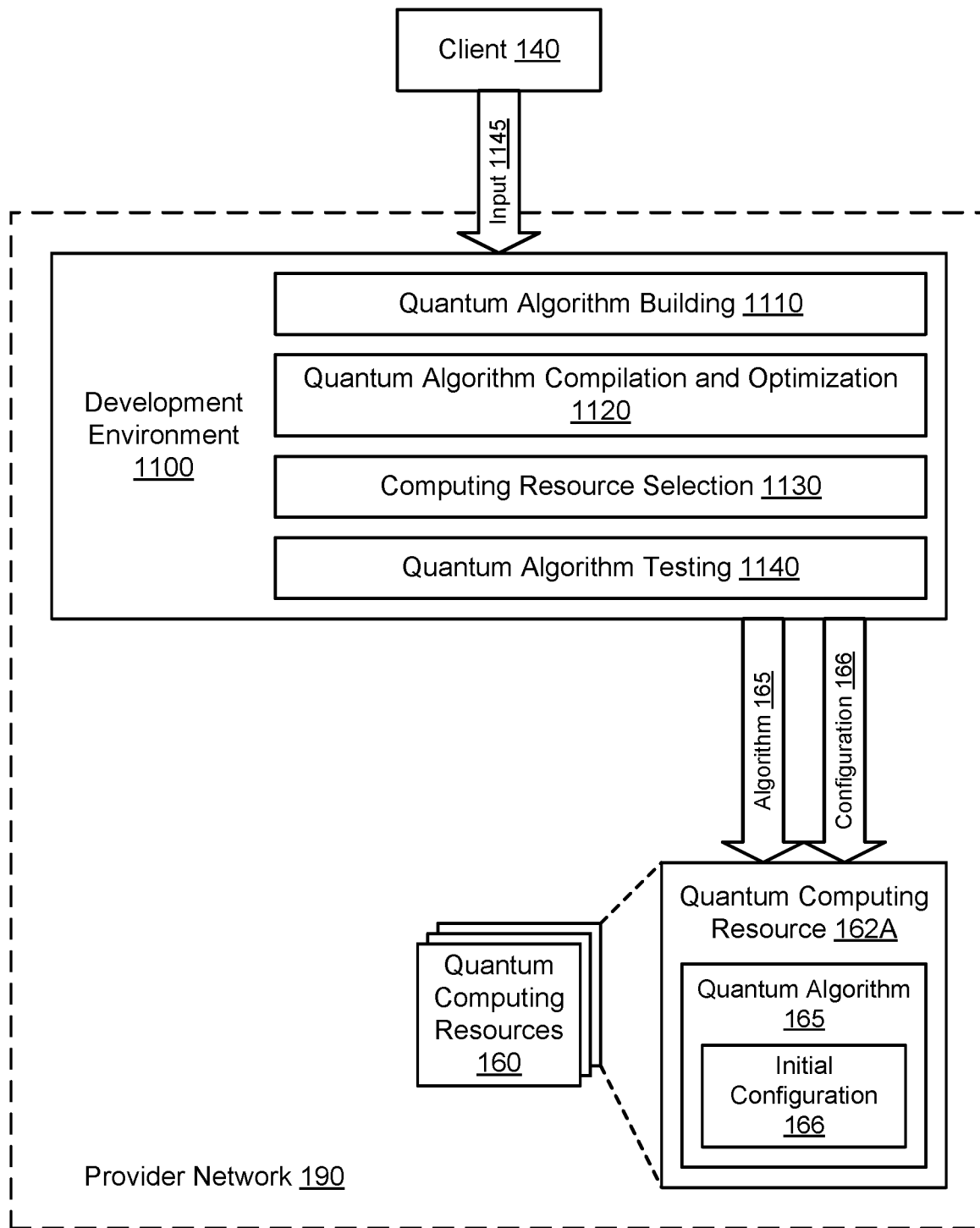
FIG. 11A illustrates an example system environment for a development environment for programming quantum computing resources, according to one embodiment.

FIG. 11A illustrates an example system environment for a development environment for programming quantum computing resources, according to one embodiment. Clients may use a development environment 1100 to build programs executable on quantum computing resources. In various embodiments, the development environment 1100 may include various components that assist clients (e.g., developers) in building, compiling, optimizing, and/or testing quantum algorithms. The development environment 1100 may include a component for quantum algorithm building 1110. The development environment 1100 may include a component for quantum algorithm compilation and optimization 1120. The development environment 1100 may include a component for computing resource selection 1130. The development environment 1100 may include a component for quantum algorithm testing 1140. In one embodiment, the development environment 1100 may support various programming languages associated with quantum computing. In one embodiment, the development environment 1100 may implement version control. Aspects of the various components 1110, 1120, 1130, and 1140 are discussed in greater detail below.

In one embodiment, the development environment 1100 may use cloud-based quantum computing resources 160 of a provider network 190 to run and/or test quantum algorithms. In one embodiment, the development environment 1100 may use quantum computing resources managed by the client 140 (e.g., hosted in client-managed data centers) to run and/or test quantum algorithms. In one embodiment, the development environment 1100 may be associated with (e.g., designed for) a particular type of quantum computing resource, such as a particular instance type offered by the provider network 190; the development environment may offer compilation and testing of quantum algorithms for the particular type of quantum resource. In one embodiment, the development environment 1100 may be associated with (e.g., designed for) a broader set of quantum computing resources or a higher-level abstraction of quantum computing resources; the development environment may offer compilation and testing of quantum algorithms for several types of quantum resources, such as various instance types offered by the provider network 190.

The development environment 1100 may be implemented using program code that is executable on one or more classical computing resources. In one embodiment, as shown in FIG. 11A, the development environment 1100 may be hosted (at least in part) in a cloud-based provider network 190. A client device 140 that uses the development environment 1100 to develop quantum algorithms may be external or internal to the provider network 190. The client device 140 may provide input 1145 to the development environment 1100, e.g., across a network connection between the client device and the provider network 190. The input 1145 may represent, for example, entry of one or more programming elements, a selection of one or more programming elements presented by the development environment 1100 or an associated repository, acceptance or rejection of recommendations made by the development environment, input to compile or run or test a quantum algorithm, input to set an initial configuration of a quantum algorithm, and so on.

Figure 11B:
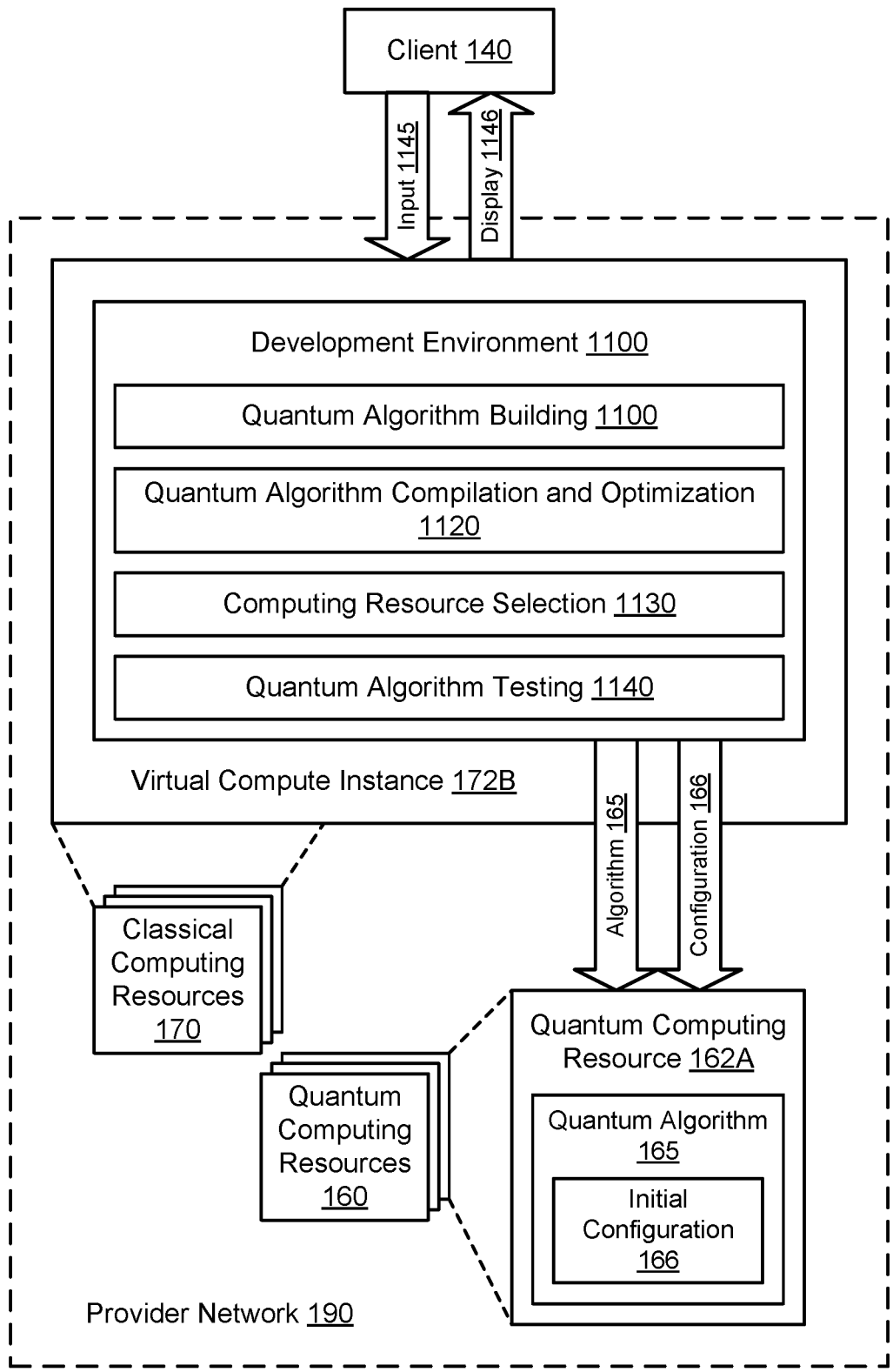
FIG. 11B illustrates an example system environment for a development environment for programming quantum computing resources, including a development environment generating and sending a display to a client, according to one embodiment.
Figure 11C:
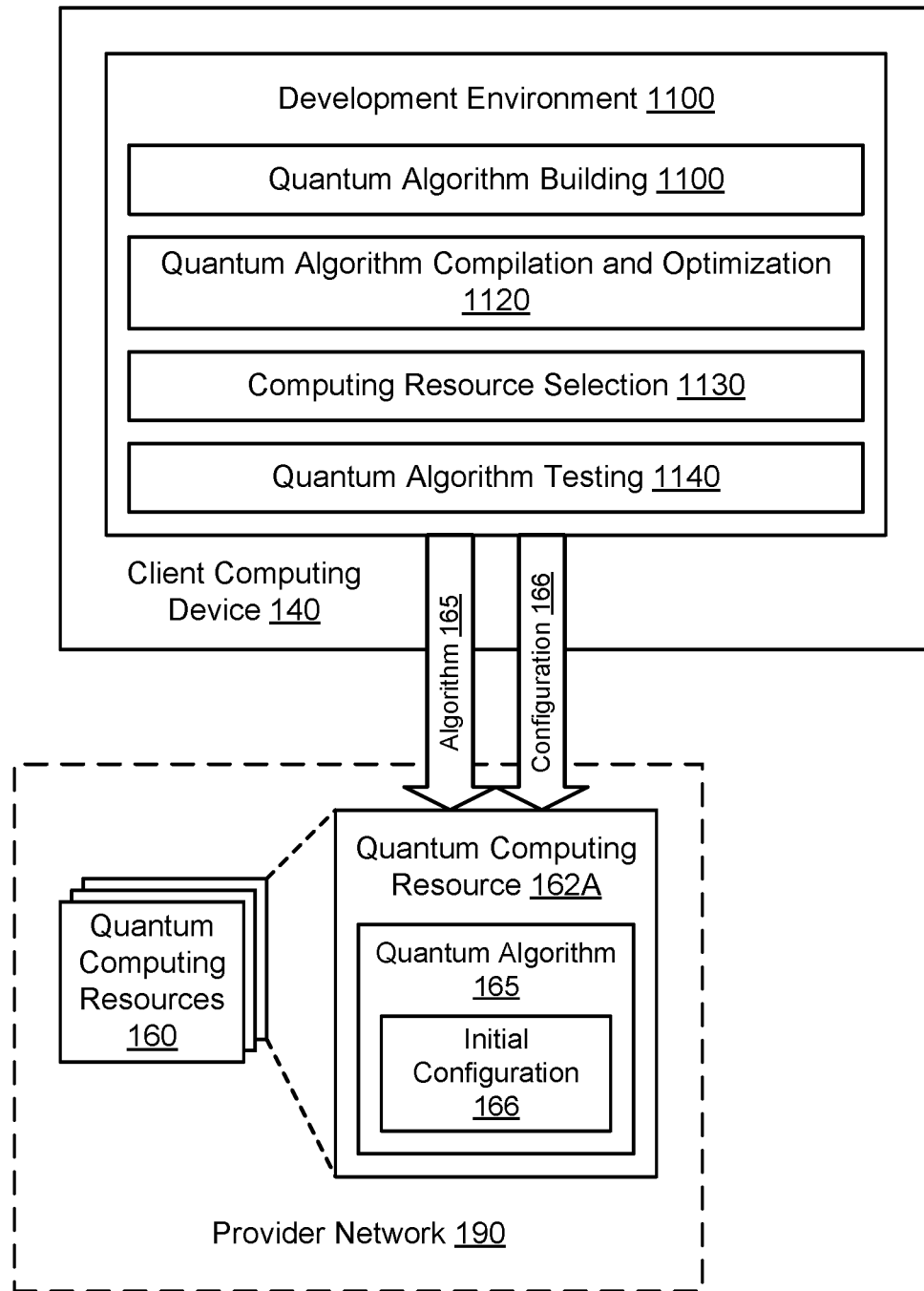
FIG. 11C illustrates an example system environment for a development environment for programming quantum computing resources, including a development environment executable on a client computing device, according to one embodiment.

In one embodiment, as shown in FIG. 11B, the development environment 1100 may be hosted (at least in part) in a virtual compute instance 172B in a cloud-based provider network 190. The virtual compute instance 172B may be implemented using classical computing resources 170 of the provider network 190 and accessed by a client device 140 that is external or internal to the provider network. In one embodiment, the virtual compute instance 172B may be of an instance type that includes the development environment 1100, and the instance type may be selected by the client 140 based (at least in part) on its inclusion of the development environment. In one embodiment, the virtual compute instance 172B may run the development environment 1100 within the provider network, generate a screen display 1146 representing a user interface of the development environment, and send that screen display to the client device 140 for display. The screen display may include a grid of pixels or other display elements. The client 140 may interact with the development environment 1100 by sending input 1145 back to the virtual compute instance 172B, and the input may represent client interaction with the display 1146. In one embodiment, as shown in FIG. 11C, the development environment 1100 may be executed locally (at least in part) on a client computing device 140 that is external to the provider network 190.

Using the component for quantum algorithm building 1110, a client 140 may enter information 1145 associated with a quantum algorithm, such as programming elements of the algorithm or other program code. In one embodiment, the program code may be entered as text, e.g., using a text editor. In one embodiment, the program code may be entered as graphical programming elements, e.g., by linking or otherwise manipulating nodes or components of a graphical program. In one embodiment, programming elements may be selected by the client 140 or by the environment 1100 itself from a repository. In one embodiment, programming elements may be recommended to the client 140 by the environment 1100. In one embodiment, the development environment 1100 may generate recommendations using machine learning techniques based on input from various clients. In one embodiment, the development environment 1100 may use intelligent code completion to supply auto-completed values for terms entered by the client 140. In one embodiment, the quantum algorithm building 1110 may include debugging tools. In one embodiment, the quantum algorithm building may produce a program that can be run on a quantum computing resource along with a program that can be run on a classical computing resource (e.g., a server with or without a hardware accelerator such as a GPU or FPGA).

Using the component for quantum algorithm compilation and optimization 1120, the development environment 1100 may optimize the program code built using the quantum algorithm building component 1110. In one embodiment, the optimization may use metrics from prior runs to improve the speed, cost, and/or accuracy of the program code, e.g., by structuring quantum gates in a different way. In one embodiment, the optimization may be performed relative to a particular type of quantum computing resource, e.g., a quantum computer with a particular number of quantum bits or a particular hardware configuration. Using the component for quantum algorithm compilation and optimization 1120, the development environment 1100 may compile the program code built using the quantum algorithm building component 1110 into a program (e.g., a quantum algorithm 165) that is executable on a quantum computing resource such as resource 162A.

Using the component for computing resource selection 1130, the development environment 1100 may select one or more quantum resources to run the quantum algorithm. In one embodiment, a quantum resource may be selected from a pool of computing resources 160 hosted in a cloud-based provider network 190. In one embodiment, a quantum resource may be selected that is hosted in a client-managed provider network. In one embodiment, a quantum resource may be selected that is in a data center managed by a different provider network than the provider network 190. A quantum computing resource may be selected based (at least in part) on characteristics of the quantum algorithm, e.g., to select a quantum resource that is particularly suited for a specific problem domain such as molecular modeling, traffic optimization, and so on. A quantum computing resource may be selected based (at least in part) on optimization of speed, accuracy, and/or cost. The computing resource selection 1130 may determine the number of computing resources to be used in running and/or testing the quantum algorithm 165. The computing resource selection 1130 may determine one or more instance types of computing resources to be used in running and/or testing the quantum algorithm 165. In one embodiment, the computing resource selection 1130 may select one or more classical computing resources, either in addition to or instead of the quantum computing resource 162A. For example, one or more classical instances with hardware accelerators such as GPUs or FPGAs may be used to process intermediate data between other stages that are performed using quantum computing resources. In one embodiment, the resource selection 1130 may represent a tradeoff between cost, speed, and/or accuracy, and the selection may be based (at least in part) on one or more user goals indicating the relative desirability of cost, speed, and/or accuracy.

Using the component for quantum algorithm testing 1140, the development environment 1100 may use cloud-based quantum computing resources 160 to run and/or test a quantum algorithm 165. In one embodiment, the development environment 1100 may use quantum computing resources managed by the client 140 (e.g., hosted in client-managed data centers) to run and/or test quantum algorithms. The development environment 1100 may deploy a quantum algorithm 165 and an initial configuration 166 to the selected quantum computing resource 162A. The development environment 1100 may then trigger one or more runs of the quantum algorithm with one or more sets of initial configuration values. Quantum algorithms may be considered probabilistic such that they provide a solution with a certain probability, and the algorithm 165 may be run more than once to arrive at different results. In one embodiment, by repeatedly setting the algorithm's initial values, running the algorithm, and measuring the algorithm's results, the probability of arriving at the correct answer may be increased. The development environment 1100 may collect results of the run(s). The development environment 1100 may collect performance metrics from the run(s) to influence the compilation and optimization 1120 and/or the resource selection 1130.

In one embodiment, the development environment 1100 may perform quantum instance provisioning and deprovisioning to use the quantum computing resources 160 of the provider network 190. The quantum instance provisioning may interact with a resource manager of the provider network 190 to reserve and/or configure at least one of the quantum computing resources 160 on behalf of the development environment 1100. The quantum computing resources 160 may represent a pool of available resources, including quantum computers in one or more data centers managed by the provider network 190. Provisioning the quantum computing resource 162A (e.g., a quantum computing instance) may include reserving one of the quantum computers, or a portion of one of the quantum computers, for use by the development environment 1100. The quantum computing resource 162A may be returned to the pool of available quantum computing resources 160 when no longer needed or used by the development environment 1100. Deprovisioning the quantum computing resource 162A may include deprogramming the quantum algorithm, erasing or resetting the values of any qubits, removing any client-specific data or metadata associated with the quantum instance (e.g., in a classical component that is local to the quantum computer and that manages the quantum computer), and/or otherwise preparing the reclaimed quantum computing resources for reuse.

The development environment 1100 may be implemented using any suitable number and configuration of computing devices, any of which may be implemented by the example computing device 3000 illustrated in FIG. 20. The computing devices may be located in any suitable number of data centers or geographical locations. In various embodiments, at least some of the functionality of the development environment 1100 may be provided by the same computing device or by different computing devices. If any of the components of the development environment 1100 are implemented using different computing devices, then the components and their respective computing devices may be communicatively coupled, e.g., via one or more networks. Each of the components of the development environment 1100 may represent any combination of software and hardware usable to perform their respective functions. Operations implemented by the development environment 1100 may be performed automatically, e.g., without a need for user initiation or user intervention after an initial configuration stage, and programmatically, e.g., by execution of program instructions on at least one computing device. It is contemplated that the development environment 1100 may include additional components not shown, fewer components than shown, or different combinations, configurations, or quantities of the components shown.

The development environment 1100 may be implemented in a service-oriented system in which multiple services (e.g., the resource manager of the provider network 190, a computing virtualization service, and so on) collaborate according to a service-oriented architecture. In such an environment, the development environment 1100 may offer its functionality as to multiple clients in a substantially concurrent manner. It is contemplated that any suitable number and configuration of clients may interact with the development environment 1100. To enable clients to invoke its functionality as a service, the development environment 1100 may expose any suitable interface(s), such as one or more APIs or other programmatic interfaces and/or graphical user interfaces (GUIs). The development environment 1100 may be implemented using a plurality of different instances that are distributed throughout one or more networks, and each instance may offer access to the functionality of the corresponding service to various clients. For example, multiple computing devices may each offer the functionality of the development environment 1100 to clients in various locations. The functionality of the development environment 1100 may be offered to the clients in exchange for fees.

Figure 12:
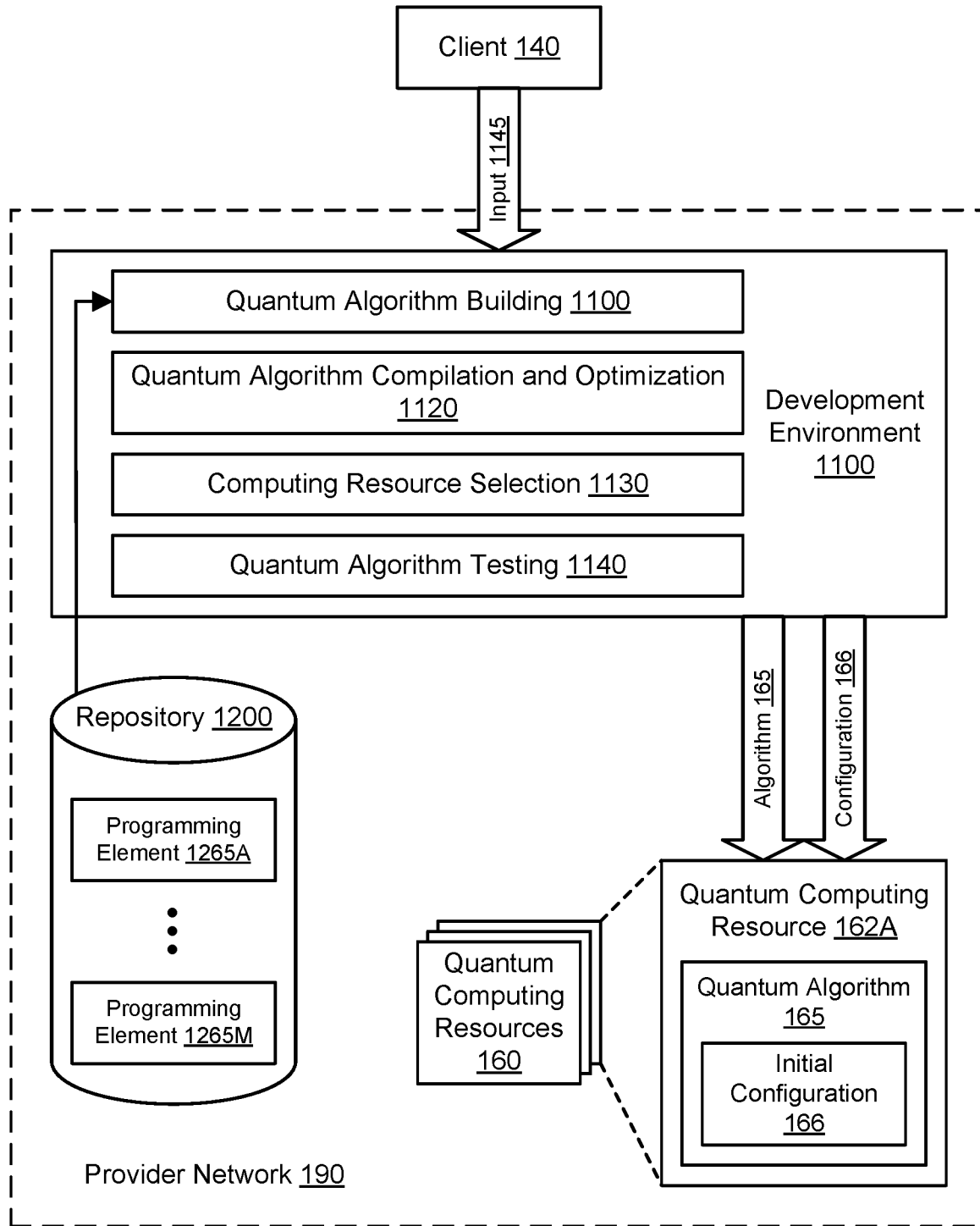
FIG. 12 illustrates further aspects of the example system environment for a development environment for programming quantum computing resources, including a repository of programming elements usable for building a quantum algorithm, according to one embodiment.

FIG. 12 illustrates further aspects of the example system environment for a development environment for programming quantum computing resources, including a repository of programming elements usable for building a quantum algorithm, according to one embodiment. In one embodiment, the development environment 1100 may be associated with a repository 1200 that includes programming elements 1265A-1265M. The repository 1200 may be accessible to the development environment 1100 in the cloud-based provider network 190. The repository 1200 may be bundled with the development environment 1100, e.g., when the development environment is executed locally on a client computing device 140. The programming elements 1265A-1265M may represent blocks or segments of program code for quantum algorithms. The programming elements 1265A-1265M may represent blocks or segments of program code for program code executable on classical computing resources. In one embodiment, the programming elements 1265A-1265M may include program code for hardware accelerators such as GPUs, FPGAs, ASICs, and so on. The repository 1200 may be accessible to the client 140 via the development environment 1100. In one embodiment, the client 140 may browse and select at least some of the programming elements 1265A-1265M for use in building a quantum algorithm. In one embodiment, the client 140 may browse and select at least some of the programming elements 1265A-1265M for use in building a program code executable on a classical computing resource, e.g., to be used in processing input to or output of a quantum algorithm. In one embodiment, the development environment 1100 itself may select one or more of the programming elements 1265A-1265M, e.g., based on machine learning. In one embodiment, the development environment 1100 may recommend one or more of the programming elements 1265A-1265M to the client 140.

Figure 13A:
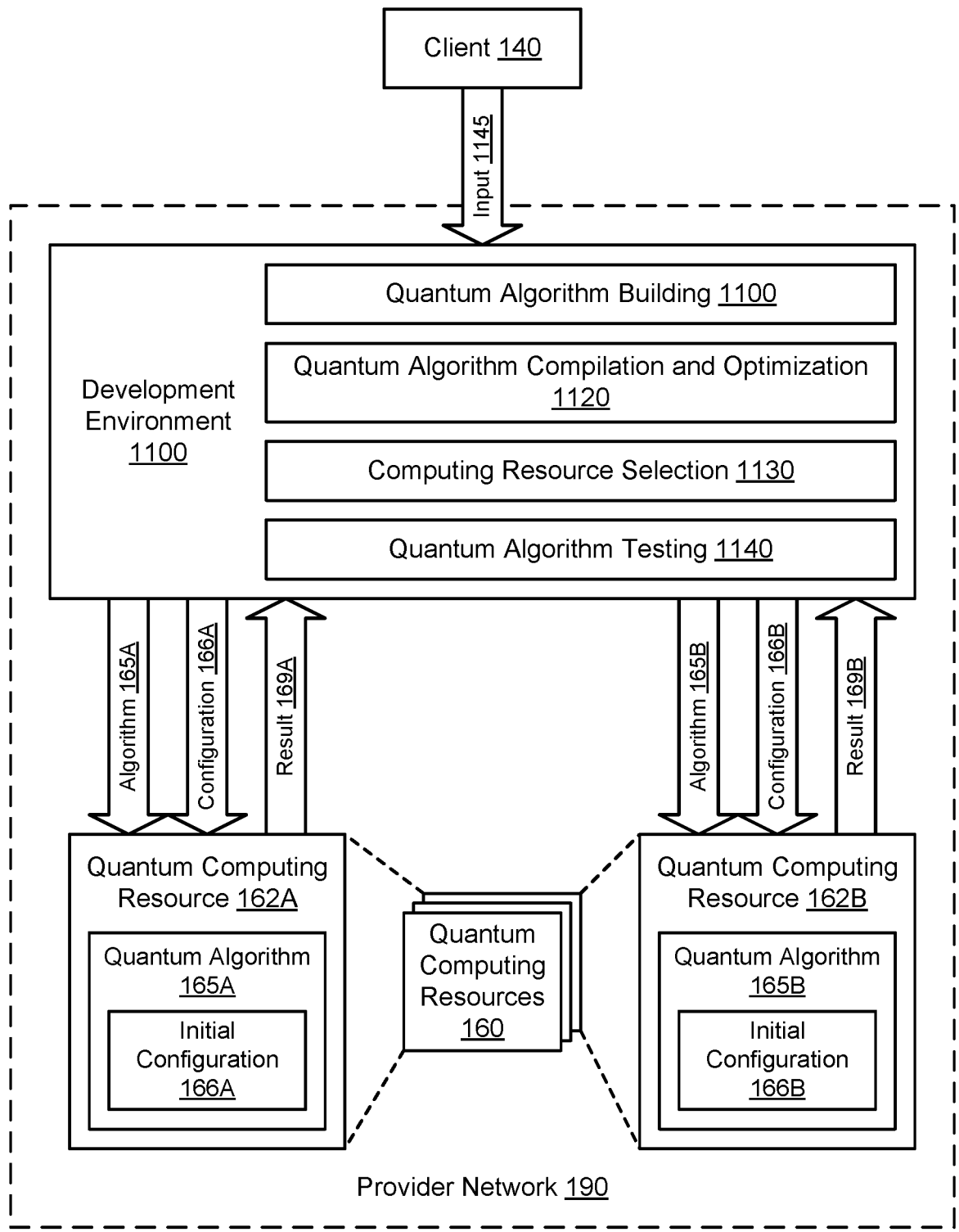
FIG. 13A illustrates further aspects of the example system environment for a development environment for programming quantum computing resources, including testing variants of a quantum algorithm using different quantum computing resources, according to one embodiment.

FIG. 13A illustrates further aspects of the example system environment for a development environment for programming quantum computing resources, including testing variants of a quantum algorithm using different quantum computing resources, according to one embodiment. In some embodiments, a quantum algorithm may be tested on different quantum computing resources, or variants of an algorithm may be tested on different instances of the same type of quantum resource. As shown in the example of FIG. 13A, multiple quantum computing resources such as resource 162A and resource 162B may be used to test a quantum algorithm. The development environment 1100 may compile variants 165A and 165B of the same quantum algorithm for testing with the quantum computing resources 162A and 162B. The quantum resources 162A and 162B may represent different instance types or hardware characteristics, and the respective quantum algorithms 165A and 165B may be compiled for the different platforms of the various resources. The quantum resources 162A and 162B may represent the same instance types or hardware characteristics, and the respective quantum algorithms 165A and 165B may represent different logic and/or different initial configurations 166A and 166B.

In one embodiment, the development environment 1100 may implement or enable a continuous delivery pipeline. Using the continuous delivery pipeline, the development environment 1100 may place a continuous flow of software changes into production in a largely automated manner. The pipeline may include stages such as build automation and continuous integration, test automation, and deployment automation. As metrics are gathered and analyzed by the development environment 1100 for one client or many clients, the metrics may influence the selection 1130 of quantum resources for algorithms. In one embodiment, using analysis of these metrics, improvements to a quantum algorithm may result in automated deployment to a different quantum computing resource. Using these techniques, a feedback loop may be implemented that enables improved use of quantum computing resources 160 on behalf of clients of the development environment 1100.

Each of the algorithms 165A and 165B may be run one or more times to generate respective results 169A and 169B. The resources 162A and 162B may run their algorithms in serial or in parallel. The quantum algorithm testing 1140 may collect, generate, and/or analyze metrics related to the performance, accuracy, and/or cost of the different resources or different algorithms. Based on the results and/or metrics, the environment may recommend one or more particular resource types for a particular quantum algorithm or may recommend a variant of the quantum algorithm. For example, if the quantum resource 162A generates results faster, then the environment 1100 may recommend that resource if the client 140 seeks to optimize runtime. As another example, if the quantum resource 162B generates results at a lower cost, then the environment 1100 may recommend that resource if the client 140 seeks to optimize cost. In one embodiment, the quantum algorithm 165 may be modified in response to the testing, deployed to the quantum resource, and tested again.

Figure 13B:
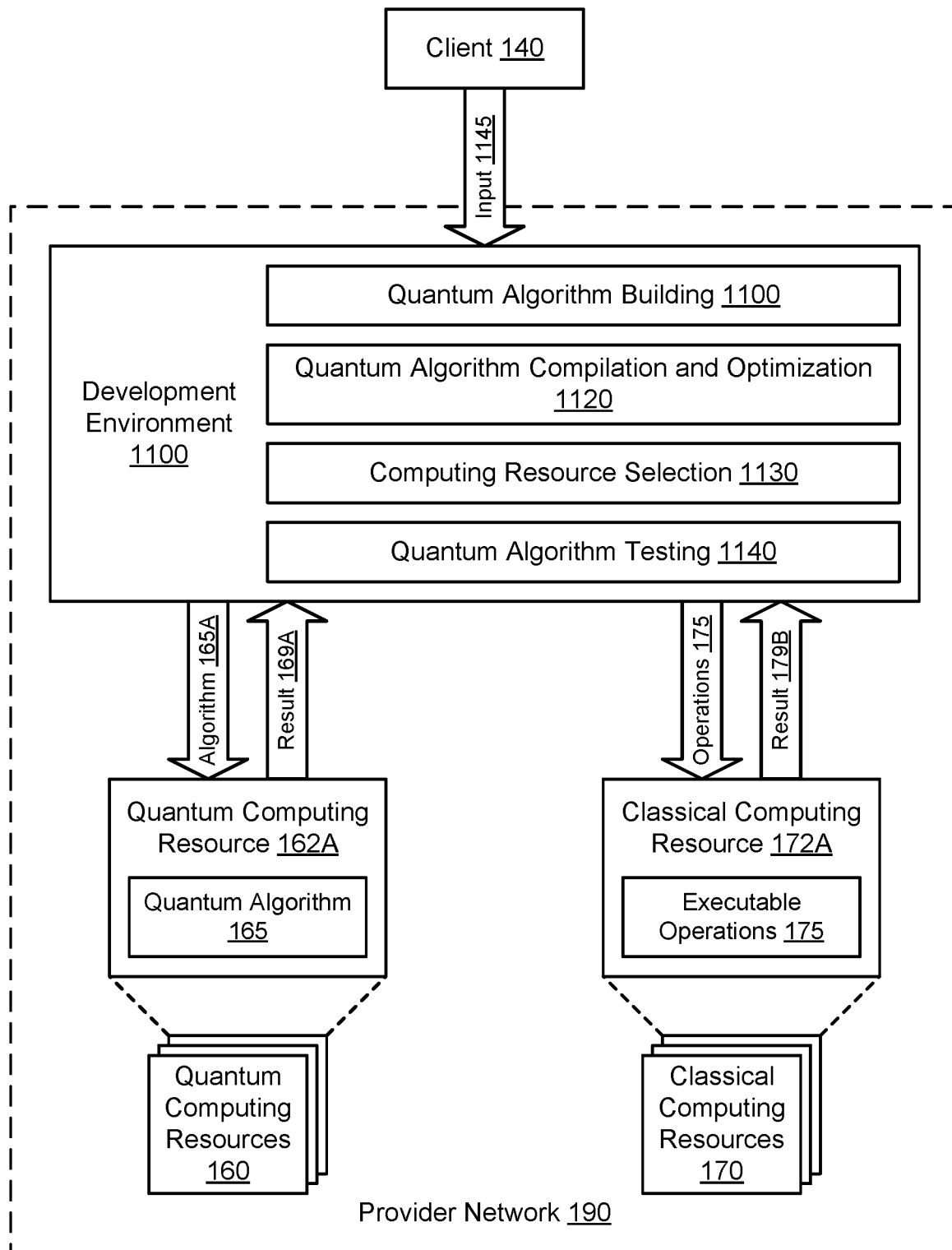
FIG. 13B illustrates further aspects of the example system environment for a development environment for programming quantum computing resources, including testing a quantum algorithm using both a quantum computing resource and a classical computing resource, according to one embodiment.

FIG. 13B illustrates further aspects of the example system environment for a development environment for programming quantum computing resources, including testing a quantum algorithm using both a quantum computing resource and a classical computing resource, according to one embodiment. In one embodiment, a quantum algorithm and related program code may be tested on both quantum resources and classical computing resources. In addition to the use of a quantum computing resource 162A as discussed above with respect to FIG. 13A, the quantum algorithm testing 1140 may also test executable operations 175 using at least one classical computing resource 172A. The classical resource 172A may represent a server with or without one or more hardware accelerators such as GPUs and FPGAs. The classical resource 172A may be selected by the computing resource selection component 1130. In one embodiment, the executable operations 175 may represent an alternative implementation of the quantum algorithm 165 for use with a classical computing approach. In one embodiment, the executable operations 175 may represent one or more tasks to be performed in conjunction with the quantum algorithm 165, e.g., to process input to or output of a stage of the quantum algorithm.

The algorithm 165A may be run one or more times to generate results 169A, and the operations 175 may be executed one or more times to generate results 179B. The resources 162A and 172A may run their algorithm and operations in serial or in parallel. The quantum algorithm testing 1140 may collect, generate, and/or analyze metrics related to the performance, accuracy, and/or cost of the different resources or different algorithms and operations. Based on the results and/or metrics, the environment may recommend one or more particular resource types. For example, if the combination of the quantum resource 162A and classical resource 172A generates results at a lower cost than the quantum resource 162A alone, then the environment 1100 may recommend that combination if the client 140 seeks to optimize cost.

Figure 14:
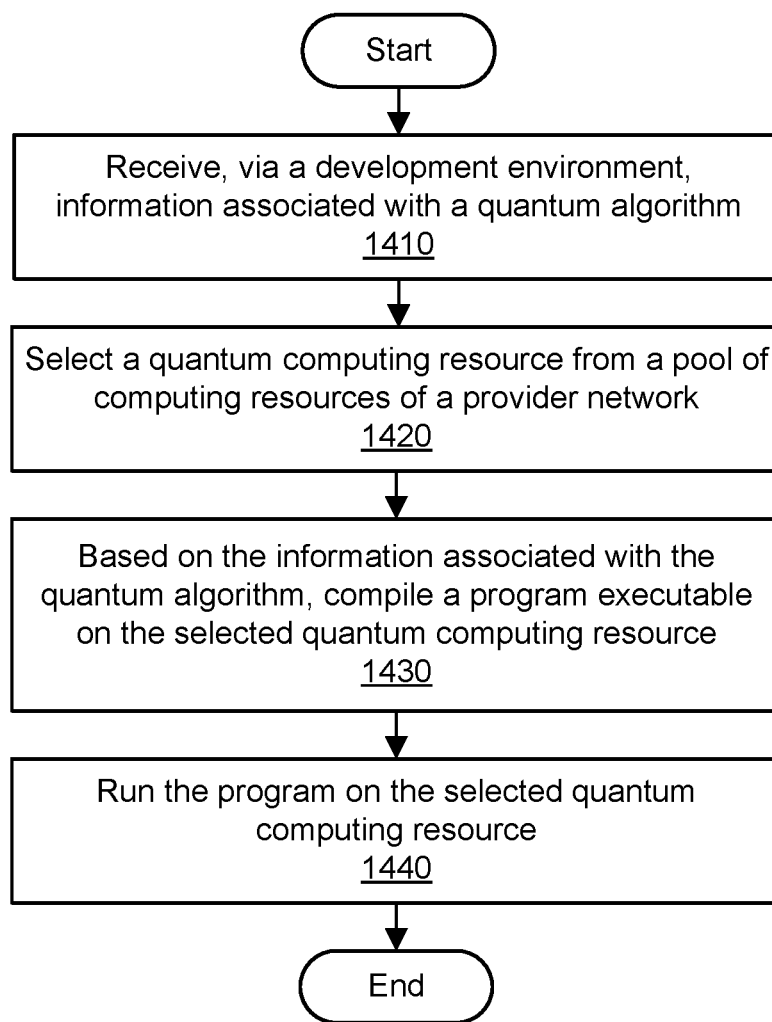
FIG. 14 is a flowchart illustrating a method for using a development environment for programming quantum computing resources, according to one embodiment.

FIG. 14 is a flowchart illustrating a method for using a development environment for programming quantum computing resources, according to one embodiment. As shown in 1410, information associated with a quantum algorithm may be received via a development environment. The information may be input by a client using a user interface associated with the development environment. The input may represent, for example, entry of one or more programming elements, a selection of one or more programming elements presented by the development environment or an associated repository, acceptance or rejection of recommendations made by the development environment, input to compile or run or test a quantum algorithm, input to set an initial configuration of a quantum algorithm, and so on. In one embodiment, programming elements may be entered as text, e.g., using a text editor. In one embodiment, programming elements may be entered as graphical elements, e.g., by linking or otherwise manipulating nodes or components of a graphical program. In one embodiment, programming elements may be recommended to the client by the environment itself.

As shown in 1420, at least one quantum computing resource may be selected for use with the quantum algorithm. In one embodiment, a quantum resource may be selected from a pool of computing resources hosted in a cloud-based provider network. In one embodiment, a quantum resource may be selected that is hosted in a client-managed provider network. In one embodiment, a quantum resource may be selected that is in a data center managed by a different provider network than the provider network. A quantum computing resource may be selected based (at least in part) on characteristics of the quantum algorithm, e.g., to select a quantum resource that is particularly suited for a specific problem domain such as molecular modeling, traffic optimization, and so on. A quantum computing resource may be selected based (at least in part) on optimization of speed, accuracy, and/or cost, e.g., based on user-specified goals. A quantum computing resource may be selected based (at least in part) on one or more metrics analyzed by the development environment. For example, the metrics may have been collected for prior runs of various quantum algorithms on various types of quantum computing resources in order to capture the performance, cost, and/or accuracy of the runs. As another example, the metrics may relate to the compilation of prior algorithms. In one embodiment, one or more classical computing resources may also be selected for use with a quantum computing resource. For example, one or more classical instances with hardware accelerators such as GPUs or FPGAs may be used to process intermediate data between other stages that are performed using quantum computing resources.

As shown in 1430, a program may be compiled that is executable on the selected quantum computing resource. The program may be compiled based at least in part on the information entered by the client in 1410, e.g., using programming elements entered or selected by the client. The development environment may optimize the program code, e.g., using metrics from prior runs to improve the speed, cost, and/or accuracy of the program code. In one embodiment, the optimization may be performed relative to a particular type of quantum computing resource, e.g., a quantum computer with a particular number of quantum bits or a particular hardware configuration. In one embodiment, variants of a program may be compiled. The variants may represent a similar algorithm as implemented on different types of quantum computing hardware or may represent variations in the algorithm itself. In one embodiment, one of the variants may be selected by the development environment, e.g., based on analysis of metrics of prior runs or other machine learning techniques.

As shown in 1440, the program may be deployed to and run on the selected quantum computing resource. The quantum resource may run the algorithm one or more times with one or more sets of initial configuration values. The initial configuration may be reset before each run. A run may end upon measuring (observing) the qubits, and the qubits may collapse into a particular state where each qubit represents a binary value (one or zero). This state may represent the result of the run of the algorithm and may be provided back to the task management service. Quantum algorithms may be considered probabilistic such that they provide a solution with a certain probability, and the algorithm may be run more than once to arrive at different results. In one embodiment, by repeatedly setting the algorithm's initial values, running the algorithm, and measuring the algorithm's results, the probability of arriving at the correct answer may be increased. In one embodiment, result(s) of various runs and performance metrics related to the various runs may be collected by the development environment and used for future optimizations and recommendations.

Cloud-Based Simulation of Quantum Computing Resources

Figure 15:
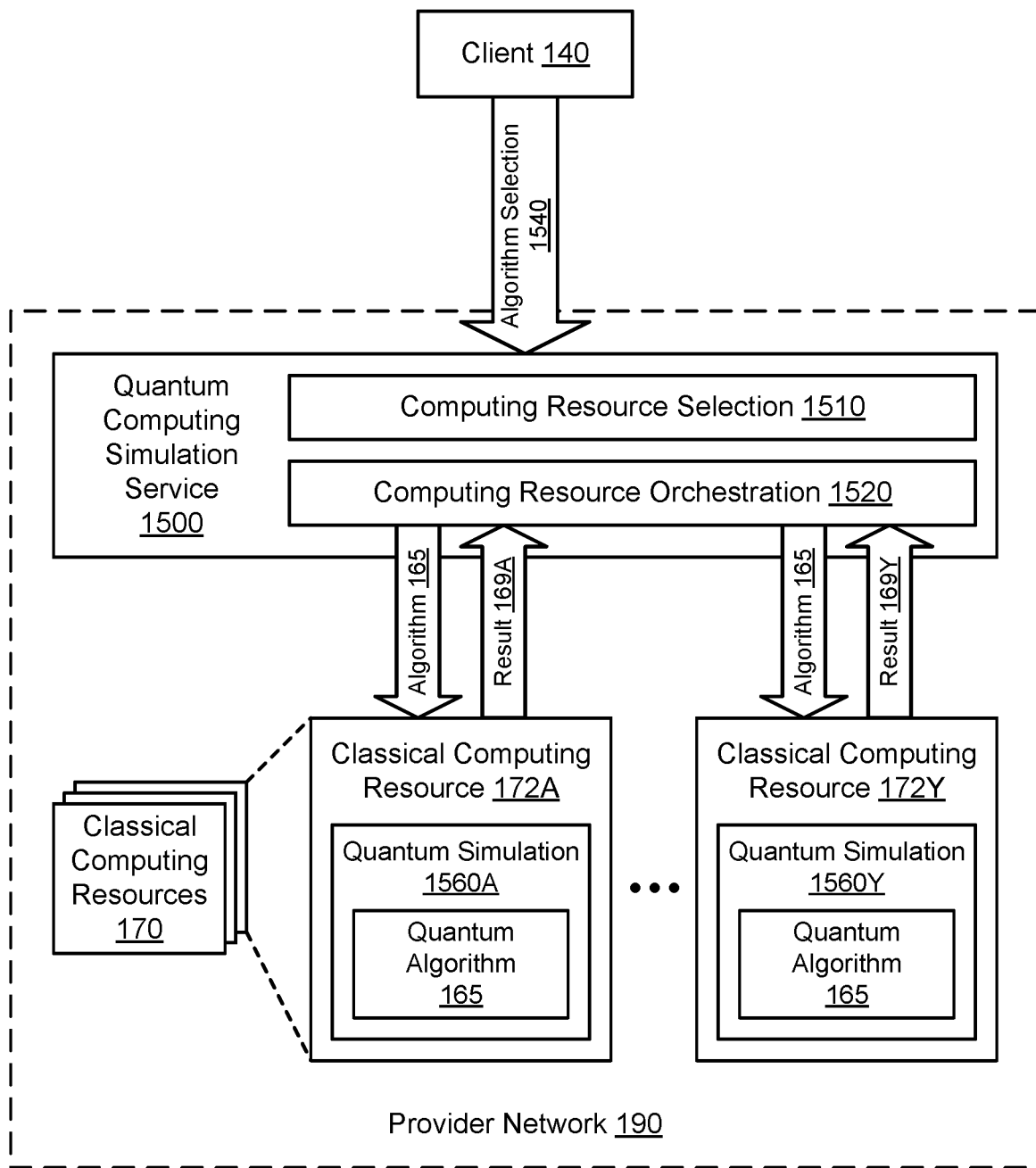
FIG. 15 illustrates an example system environment for cloud-based simulation of quantum computing resources, according to one embodiment.

FIG. 15 illustrates an example system environment for cloud-based simulation of quantum computing resources, according to one embodiment. A quantum computing simulation service 1500 may offer, to clients such as client 140, simulation of quantum algorithms using classical computing resources. A quantum algorithm may include a sequence of quantum logic gates; a problem may be encoded by setting the initial configuration of values of the qubits. When measured, the system of qubits may collapse into one of the $2^n$ states, where each qubit represents a binary value (one or zero). This final state may represent a result of the quantum algorithm. In one embodiment, the service 1500 may offer simulation of a broad and generally open set of quantum algorithms. In one embodiment, the service 1500 may offer simulation of a curated set of specific quantum algorithms. For example, the simulated algorithms may be used to solve complex problems in specific domains such as machine learning, financial portfolio optimization, molecular modeling, climate modeling, integer factorization, simulation, and so on. In some embodiments, the supported quantum algorithms may include Grover's algorithm, the Deutsch-Jozsa algorithm, Shor's algorithm, a quantum Fourier transform, a family of quantum algorithms involving amplitude amplification, adiabatic quantum computation, quantum error connection, and so on. A client 140 may submit a selection 1540 of a quantum algorithm to the service 1500. The selection 1540 may represent the name of the algorithm, the code for the algorithm itself, a selection of the algorithm from a list of available algorithms supported by the service 1500, or any other indication of a quantum algorithm 165.

In one embodiment, the quantum computing simulation service 1500 may be offered to clients by a cloud-based provider network 190, such that a client 140 outside the provider network can invoke the functionality of the service by sending appropriate commands or service calls over a network. The quantum computing simulation service 1500 may implement simulation of the quantum algorithms using classical computing resources. In one embodiment, the classical computing resources 170 may be offered by the cloud-based provider network 190. The classical computing resources 170 may represent a "classical" approach to computing in that they do not rely on quantum-mechanical phenomena for their operation. The classical computing resources 170 may be offered as virtual compute instances, e.g., implemented using a computing virtualization service of the provider network 190. The classical computing resources 170 may include servers with or without various hardware accelerators such as GPUs, FPGAs, and ASICs. Classical computing resources such as resources 172A through 172Y may be provisioned from the pool of resources 170, e.g., using a resource manager of the provider network 190. In one embodiment, the classical resources 172A-172Y may be provisioned when needed to run a simulation on behalf of a particular client 140. In one embodiment, the classical resources 172A-172Y may be provisioned once and then repeatedly used for different simulations for one client 140 or many clients. Classical computing resources 172A-172Y may be used by the service 1500 on a temporary basis, and the classical resources 172A-172Y may eventually be returned to the pool of classical computing resources 170 for potential re-use at a later time by the same service or by one or more other clients or services.

The quantum computing simulation service 1500 may include a component for computing resource selection 1510. The quantum computing simulation service 1500 may select the classical resources 172A-172Y, such as a plurality of virtual compute instances, from a pool of available computing resources 170 of the provider network 190. The quantum computing simulation service 1500 may select an appropriate number of the classical resources for a particular quantum algorithm 165. In one embodiment, the quantum computing simulation service 1500 may recommend a number of classical resources to a client, e.g., based on metrics for past simulations. By provisioning an appropriate number of classical computing resources from the provider network 190, the service 1500 may scale the resources up or down based (at least in part) on the quantum algorithm or to optimize for performance, accuracy, or cost. In one embodiment, the resources 172A-172Y may be selected based (at least in part) on availability or resource demand. For example, the resources 172A-172Y may be selected due to their higher availability in comparison to other types of resources that were not selected. In one embodiment, the resources 172A-172Y may be selected to minimize the number of resources. In one embodiment, the resources 172A-172Y may be selected to minimize the total runtime. In one embodiment, the resources 172A-172Y may be selected based (at least in part) on user-specified goals related to resource usage, budgetary constraints, runtime, performance, and so on.

In one embodiment, classical resources 172A-172Y may be selected based (at least in part) on their position in a memory hierarchy. The memory hierarchy may separate the resources into a hierarchy based (at least in part) on their memory characteristics. For example, the levels in the hierarchy may vary according to memory response time. At least some of the selected resources 172A-172Y may have a large amount of memory in order to adequately simulate quantum algorithms.

In one embodiment, at least some of the classical resources 170 may run a simulator for quantum computing hardware, and any of the classical resources may simulate all or part of the quantum algorithm. In one embodiment, the selected classical resources 172A-172Y may simulate a quantum algorithm 165 using executable instructions that represent similar logic as the quantum algorithm. As shown in the example of FIG. 15, the classical computing resource 172A may implement quantum simulation 1560A, and the classical computing resource 172Y may implement quantum simulation 1560Y. The simulations (or simulators) 1560A-1560Y may represent abstract representations of quantum computing hardware. In one embodiment, the simulators may represent executable software that is installed on the classical resources 172A-172Y. The various simulations 1560A-1560Y may represent different portions of a workload associated with the quantum algorithm 165.

The quantum computing simulation service 1500 may include a component for computing resource orchestration 1520 that orchestrates the use of many classical computing resources to perform various tasks associated with the simulation. The orchestration 1520 may divide a workload into constituent portions and then distribute the portions of the workload among the classical resources 172A-172Y. The orchestration 1520 may deploy the quantum algorithm 165 to the classical resources 172A-172Y and otherwise configure the classical resources to perform the simulation 1560A-1560Y, e.g., by installing appropriate software to implement the simulation. The orchestration 1520 may collect various results of the simulation, such as a result 169A of the simulation 1560A and a result 169Y of the simulation 1560Y. The orchestration 1520 may aggregate or otherwise analyze the various results 169A-169Y, e.g., to produce a final result. In one embodiment, the service 1500 may return a final result to the client 140.

The quantum computing simulation service 1500 may be used to test quantum algorithms on classical computing resources 172A-172Y prior to using genuine quantum computing resources. The simulation may often require many more classical computing resources or more runtime than the use of a quantum computing resource. However, in some scenarios, the cost of the classical computing resources may be less than the quantum computing resource, or the classical computing resources may have greater availability than the quantum computing resource.

The quantum computing simulation service 1500 may be implemented using any suitable number and configuration of computing devices, any of which may be implemented by the example computing device 3000 illustrated in FIG. 20. The computing devices may be located in any suitable number of data centers or geographical locations. In various embodiments, at least some of the functionality of the quantum computing simulation service 1500 may be provided by the same computing device or by different computing devices. If any of the components of the quantum computing simulation service 1500 are implemented using different computing devices, then the components and their respective computing devices may be communicatively coupled, e.g., via one or more networks. Each of the components of the quantum computing simulation service 1500 may represent any combination of software and hardware usable to perform their respective functions. Operations implemented by the quantum computing simulation service 1500 may be performed automatically, e.g., without a need for user initiation or user intervention after an initial configuration stage, and programmatically, e.g., by execution of program instructions on at least one computing device. It is contemplated that the quantum computing simulation service 1500 may include additional components not shown, fewer components than shown, or different combinations, configurations, or quantities of the components shown.

The quantum computing simulation service 1500 may be implemented in a service-oriented system in which multiple services (e.g., the resource manager of the provider network 190, a computing virtualization service, and so on) collaborate according to a service-oriented architecture. In such an environment, the quantum computing simulation service 1500 may offer its functionality as to multiple clients in a substantially concurrent manner. It is contemplated that any suitable number and configuration of clients may interact with the quantum computing simulation service 1500. To enable clients to invoke its functionality as a service, the quantum computing simulation service 1500 may expose any suitable interface(s), such as one or more APIs or other programmatic interfaces and/or graphical user interfaces (GUIs). The quantum computing simulation service 1500 may be implemented using a plurality of different instances that are distributed throughout one or more networks, and each instance may offer access to the functionality of the corresponding service to various clients. For example, multiple computing devices may each offer the functionality of the quantum computing simulation service 1500 to clients in various locations. The functionality of the quantum computing simulation service 1500 may be offered to the clients in exchange for fees.

Figure 16:
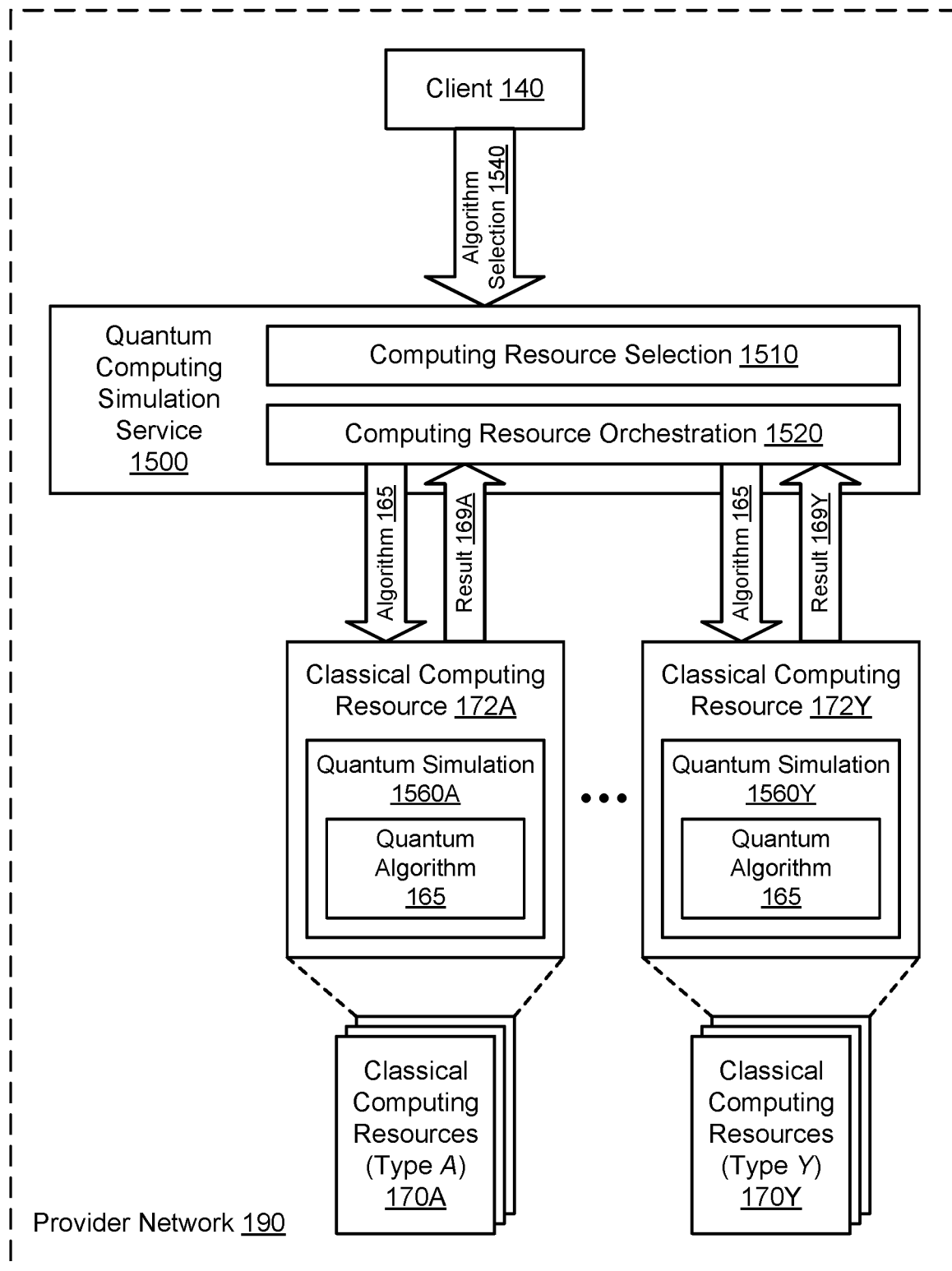
FIG. 16 illustrates further aspects of the example system environment for cloud-based simulation of quantum computing resources, including using classical computing resources of different instance types, according to one embodiment.

FIG. 16 illustrates further aspects of the example system environment for cloud-based simulation of quantum computing resources, including using classical computing resources of different instance types, according to one embodiment. As discussed above, using the component for computing resource selection 1510, the quantum computing simulation service 1500 may select the classical resources 172A-172Y from a pool of available computing resources 170 of the provider network 190. The selected resources 172A-172Y may vary in their instance type or other characteristics. For example, different instance types may represent different CPU capabilities, different accelerator (e.g., GPU or FPGA) capabilities, different memory or storage configurations, and so on. As shown in the example of FIG. 16, the resource 172A may be provisioned from a pool of classical computing resources 170A having an instance type A. As also shown in the example of FIG. 16, the resource 172Y may be provisioned from a pool of classical computing resources 170Y having an instance type Y. The instance type A may have different hardware characteristics than the instance type Y. For example, the instance type Y may include a hardware accelerator such as a GPU or FPGA, while the instance type A may not include such an accelerator. As another example, the instance type A may include a different amount of memory and a different number of processor cores than the instance type Y. The quantum computing simulation service 1500 may select an appropriate number and type of the classical resources for a particular quantum algorithm 165. In one embodiment, one or more of the instance types 170A-170Y may be pre-configured for quantum simulation. In one embodiment, the quantum computing simulation service 1500 may recommend a number and/or type of classical resources to a client, e.g., based on metrics for past simulations. By provisioning an appropriate type of classical computing resources from the provider network 190, the service 1500 may optimize for performance, accuracy, or cost.

Figure 17:
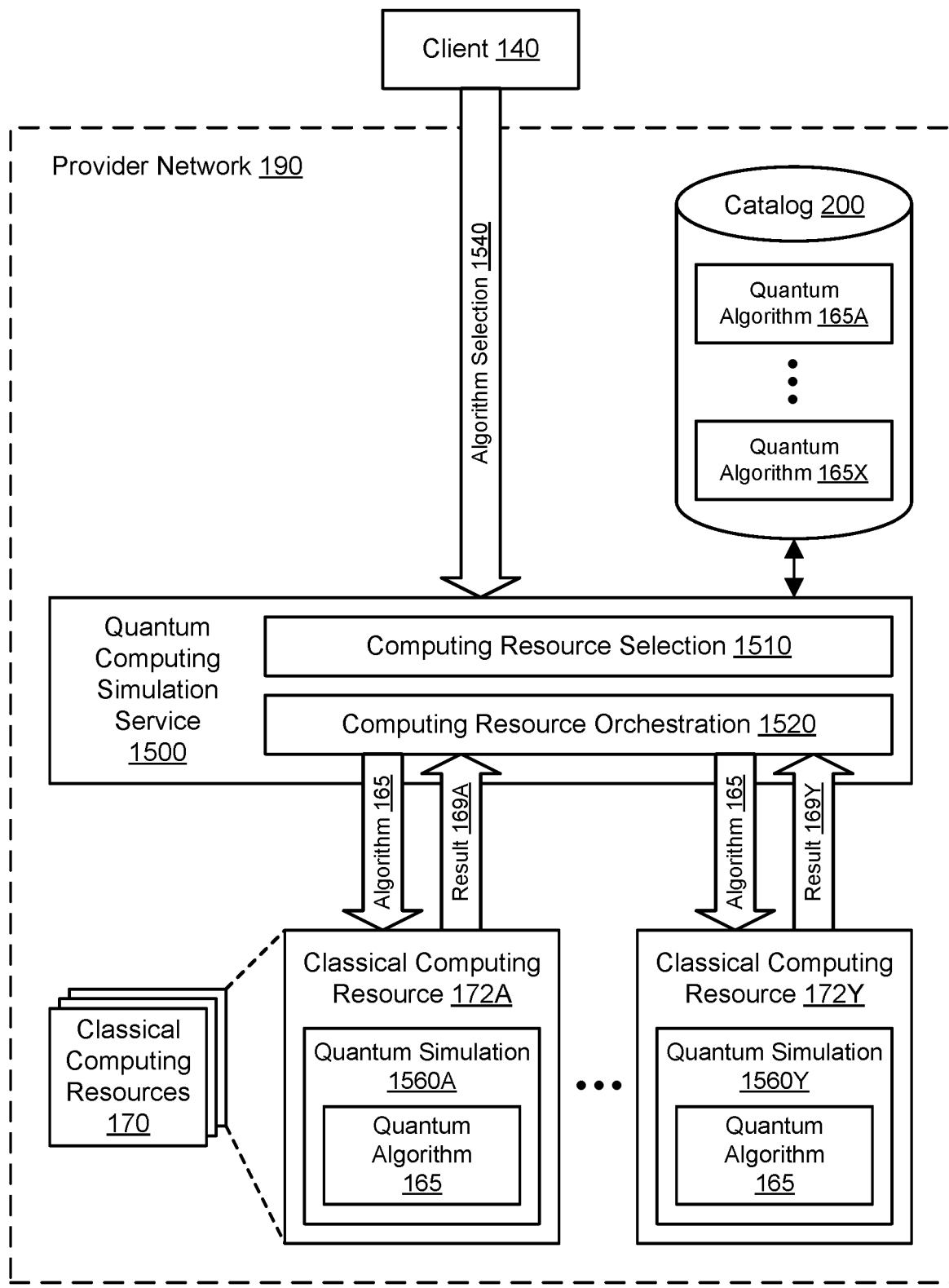
FIG. 17 illustrates further aspects of the example system environment for cloud-based simulation of quantum computing resources, including a catalog of quantum algorithms, according to one embodiment.

FIG. 17 illustrates further aspects of the example system environment for cloud-based simulation of quantum computing resources, including a catalog of quantum algorithms, according to one embodiment. In one embodiment, quantum algorithms may be selected from a catalog 200 in the provider network 190 and then simulated on classical resources 170. In one embodiment, information describing a set of available quantum algorithms may be stored in a catalog 200. As shown in the example of FIG. 17, the catalog 200 may indicate a quantum algorithm 165A through a quantum algorithm 165X. In one embodiment, the algorithms 165A-165X may be curated by the provider network 190. At least some of the algorithms 165A-165X may be provided by third-party vendors. In one embodiment, at least some of the quantum algorithms 165A-165X may be designed for particular problem domains, such as molecular modeling, integer factorization, and so on. The service 1500 may access the algorithm information in the catalog 200, present information about the available algorithms to the client 140, and permits the client to choose from among the algorithms, e.g., using a graphical user interface. In one embodiment, the client 140 may be presented with both a set of available algorithms and a recommendation of one or more of the algorithms. Upon receipt of user input representing a client's selection of a quantum algorithm, the service 1500 may initiate a simulation of the selected algorithm using the classical computing resources 172A-172Y.

Figure 18:
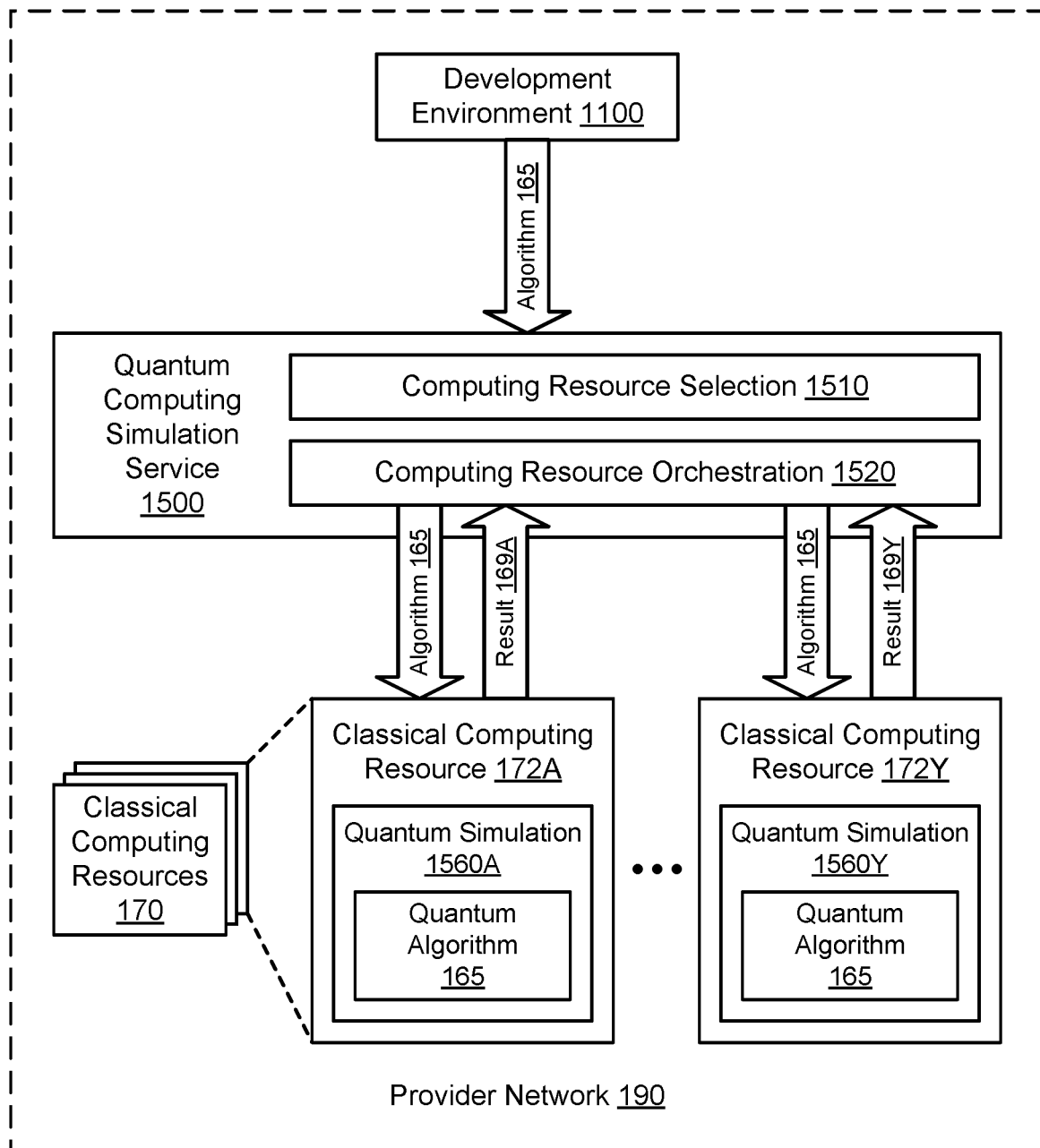
FIG. 18 illustrates further aspects of the example system environment for cloud-based simulation of quantum computing resources, including the use of a development environment to provide the quantum algorithm, according to one embodiment.

FIG. 18 illustrates further aspects of the example system environment for cloud-based simulation of quantum computing resources, including the use of a development environment to provide the quantum algorithm, according to one embodiment. In one embodiment, the quantum computing simulation service may simulate quantum algorithms developed using a development environment 1100 for quantum computing. As discussed above, the development environment 1100 may include various components that assist clients (e.g., developers) in building, compiling, optimizing, and/or testing quantum algorithms. The development environment 1100 may include a component for quantum algorithm building. The development environment 1100 may include a component for quantum algorithm compilation and optimization. The development environment 1100 may include a component for computing resource selection. The development environment 1100 may include a component for quantum algorithm testing. In one embodiment, the development environment 1100 may support various programming languages associated with quantum computing. In one embodiment, the development environment 1100 may implement version control. In one embodiment, the quantum computing simulation service 1500 may accept, as input, a quantum algorithm 165 developed using the development environment 1100. The service 1500 may then initiate a simulation of that algorithm 165 using classical computing resources 172A-172Y. As discussed above, the classical computing resources 172A-172Y may be selected, provisioned, and configured to perform the simulation 1560A-1560Y, e.g., based on characteristics of the quantum algorithm 165. By permitting the development environment 1100 to test quantum algorithms with the quantum computing simulation service 1500, the cost of testing may be reduced, an algorithm may be tested faster if a sufficient number of classical resources are used, and/or an algorithm may be tested faster if sufficient quantum resources are not currently available.

Figure 19:
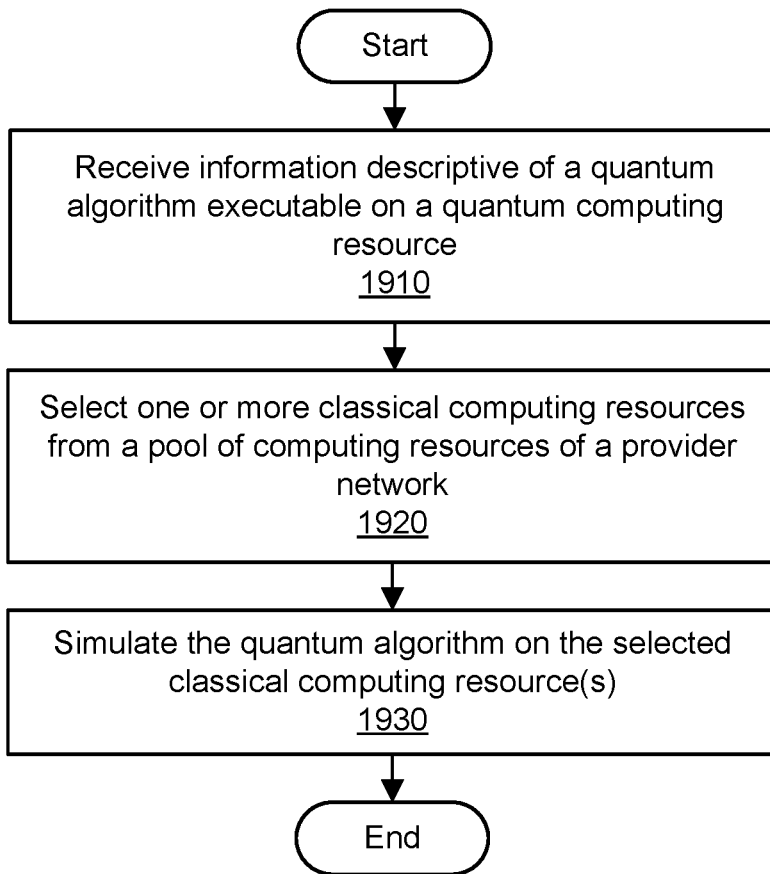
FIG. 19 is a flowchart illustrating a method for cloud-based simulation of quantum computing resources, according to one embodiment.

FIG. 19 is a flowchart illustrating a method for cloud-based simulation of quantum computing resources, according to one embodiment. As shown in 1910, information descriptive of a quantum algorithm may be received, e.g., by a quantum computing simulation service of a provider network. The quantum algorithm may be executable on a quantum computing resource. A quantum algorithm may include a sequence of quantum logic gates; a problem may be encoded by setting the initial configuration of values of the qubits. When measured, the system of qubits may collapse into one of the $2^n$ states, where each qubit represents a binary value (one or zero). This final state may represent a result of the quantum algorithm. In one embodiment, the quantum algorithm may be produced by a development environment associated with the provider network.

As shown in 1920, one or more classical computing resources may be selected to implement the simulation of the quantum algorithm. The quantum computing simulation service may select the classical resources, such as a plurality of virtual compute instances, from a pool of available computing resources of the provider network. The available computing resources may vary in their instance types, and an instance type may represent a particular hardware and/or software configuration. The quantum computing simulation service may select an appropriate type and number of the classical resources for the particular quantum algorithm. In one embodiment, the quantum computing simulation service may recommend a type and number of classical resources to a client, e.g., based on metrics for past simulations. By provisioning an appropriate type and number of classical computing resources from the provider network, the service may scale the resources up or down based (at least in part) on the quantum algorithm or to optimize for performance, accuracy, or cost. In many cases, a large number of classical computing resources may be used to simulate a quantum computer running a quantum algorithm.

As shown in 1930, the quantum algorithm may be simulated using the selected classical resource(s). At least some of the classical resources may run a simulator for quantum computing hardware, and any of the classical resources may simulate all or part of the quantum algorithm. In one embodiment, the selected classical resources may simulate a quantum algorithm using executable instructions that represent similar logic as the quantum algorithm. The quantum computing simulation service may divide a workload into constituent portions and then distribute the portions of the workload among the classical resources. The quantum computing simulation service may collect various results of the simulation and aggregate or otherwise analyze the various results, e.g., to produce a final result.

Illustrative Computer System

In at least some embodiments, a computer system that implements a portion or all of one or more of the technologies described herein may include a computer system that includes or is configured to access one or more computer-readable media. FIG. 20 illustrates such a computing device 3000. In the illustrated embodiment, computing device 3000 includes one or more processors 3010A-3010N coupled to a system memory 3020 via an input/output (I/O) interface 3030. Computing device 3000 further includes a network interface 3040 coupled to I/O interface 3030.

In various embodiments, computing device 3000 may be a uniprocessor system including one processor or a multiprocessor system including several processors 3010A-3010N (e.g., two, four, eight, or another suitable number). Processors 3010A-3010N may include any suitable processors capable of executing instructions. For example, in various embodiments, processors 3010A-3010N may be processors implementing any of a variety of instruction set architectures (ISAs), such as the x86, PowerPC, SPARC, or MIPS ISAs, or any other suitable ISA. In multiprocessor systems, each of processors 3010A-3010N may commonly, but not necessarily, implement the same ISA.

System memory 3020 may be configured to store program instructions and data accessible by processor(s) 3010A-3010N. In various embodiments, system memory 3020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are shown stored within system memory 3020 as code (i.e., program instructions) 3025 and data 3026.

In one embodiment, I/O interface 3030 may be configured to coordinate I/O traffic between processors 3010A-3010N, system memory 3020, and any peripheral devices in the device, including network interface 3040 or other peripheral interfaces. In some embodiments, I/O interface 3030 may perform any necessary protocol, timing or other data transformations to convert data signals from one component (e.g., system memory 3020) into a format suitable for use by another component (e.g., processors 3010A-3010N). In some embodiments, I/O interface 3030 may include support for devices attached through various types of peripheral buses, such as a variant of the Peripheral Component Interconnect (PCI) bus standard or the Universal Serial Bus (USB) standard, for example. In some embodiments, the function of I/O interface 3030 may be split into two or more separate components, such as a north bridge and a south bridge, for example. Also, in some embodiments some or all of the functionality of I/O interface 3030, such as an interface to system memory 3020, may be incorporated directly into processors 3010A-3010N.

Network interface 3040 may be configured to allow data to be exchanged between computing device 3000 and other devices 3060 attached to a network or networks 3050. In various embodiments, network interface 3040 may support communication via any suitable wired or wireless general data networks, such as types of Ethernet network, for example. Additionally, network interface 3040 may support communication via telecommunications/telephony networks such as analog voice networks or digital fiber communications networks, via storage area networks such as Fibre Channel SANs, or via any other suitable type of network and/or protocol.

In some embodiments, system memory 3020 may be one embodiment of a computer-readable (i.e., computer-accessible) medium configured to store program instructions and data as described above for implementing embodiments of the corresponding methods and apparatus. However, in other embodiments, program instructions and/or data may be received, sent or stored upon different types of computer-readable media. Generally speaking, a computer-readable medium may include non-transitory storage media or memory media such as magnetic or optical media, e.g., disk or DVD/CD coupled to computing device 3000 via I/O interface 3030. A non-transitory computer-readable storage medium may also include any volatile or non-volatile media such as RAM (e.g. SDRAM, DDR SDRAM, RDRAM, SRAM, etc.), ROM, etc., that may be included in some embodiments of computing device 3000 as system memory 3020 or another type of memory. Further, a computer-readable medium may include transmission media or signals such as electrical, electromagnetic, or digital signals, conveyed via a communication medium such as a network and/or a wireless link, such as may be implemented via network interface 3040. Portions or all of multiple computing devices such as that illustrated in FIG. 20 may be used to implement the described functionality in various embodiments; for example, software components running on a variety of different devices and servers may collaborate to provide the functionality. In some embodiments, portions of the described functionality may be implemented using storage devices, network devices, or various types of computer systems. The term "computing device," as used herein, refers to at least all these types of devices, and is not limited to these types of devices.

The various methods as illustrated in the Figures and described herein represent examples of embodiments of methods. The methods may be implemented in software, hardware, or a combination thereof. In various ones of the methods, the order of the steps may be changed, and various elements may be added, reordered, combined, omitted, modified, etc. Various ones of the steps may be performed automatically (e.g., without being directly prompted by user input) and/or programmatically (e.g., according to program instructions).

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

It will also be understood that, although the terms first, second, etc., may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

Numerous specific details are set forth herein to provide a thorough understanding of claimed subject matter. However, it will be understood by those skilled in the art that claimed subject matter may be practiced without these specific details. In other instances, methods, apparatus, or systems that would be known by one of ordinary skill have not been described in detail so as not to obscure claimed subject matter. Various modifications and changes may be made as would be obvious to a person skilled in the art having the benefit of this disclosure. It is intended to embrace all such modifications and changes and, accordingly, the above description is to be regarded in an illustrative rather than a restrictive sense.

What is claimed is:

1. A system, comprising:
   a pool of computing resources of a multi-tenant provider network; and
   one or more computing devices configured to implement a quantum computing simulation service of the multi-tenant provider network, wherein the quantum computing simulation service is configured to:
      receive a request to simulate a quantum algorithm, from a client of the quantum computing simulation service of the multi-tenant provider network, wherein the request includes information descriptive of a quantum algorithm, wherein the quantum algorithm is executable using a quantum computing resource comprising a plurality of quantum bits;
      select, from the pool of computing resources of the multi-tenant provider network, a plurality of classical computing resources to implement a simulator to simulate the quantum algorithm based at least in part on the information descriptive of the quantum algorithm; and
      initiate a simulation of the quantum algorithm using the simulator implemented with the selected plurality of classical computing resources.

2. The system as recited in claim 1, wherein one or more resource types of the classical computing resources and an amount of the classical computing resources are selected based at least in part on the quantum algorithm.

3. The system as recited in claim 1, wherein the quantum algorithm is selected from a catalog of quantum algorithms, and wherein the catalog is hosted by the multi-tenant provider network.

4. The system as recited in claim 1, wherein the quantum algorithm is generated using a development environment, wherein a refined quantum algorithm is generated using the development environment based at least in part on the simulation, and wherein the refined quantum algorithm is deployed to one or more quantum computing resources.

5. A computer-implemented method, comprising:
   selecting, by a service of a provider network, one or more classical computing resources from a pool of computing resources of the provider network to implement a simulator to simulate a quantum algorithm based at least in part on information descriptive of the quantum algorithm, wherein the quantum algorithm is executable using a quantum computing resource comprising a plurality of quantum bits; and
   simulating the quantum algorithm using the simulator implemented with the one or more selected classical computing resources.

6. The method as recited in claim 5, wherein one or more resource types of the one or more classical resources are selected based at least in part on the quantum algorithm.

7. The method as recited in claim 5, wherein an amount of the one or more classical computing resources is selected based at least in part on the quantum algorithm.

8. The method as recited in claim 5, wherein the one or more classical computing resources comprise one or more hardware accelerators.

9. The method as recited in claim 5, wherein the quantum algorithm is selected from a catalog of quantum algorithms, and wherein the catalog is hosted by the provider network.

10. The method as recited in claim 5, wherein the quantum algorithm is generated using a development environment, wherein a refined quantum algorithm is generated using the development environment based at least in part on the simulating, and wherein the method further comprises:
    deploying the refined quantum algorithm to one or more quantum computing resources.

11. The method as recited in claim 5, wherein the one or more classical computing resources are provisioned from the pool of computing resources, configured to perform the simulating, and returned to the pool of computing resources after the simulating.

12. The method as recited in claim 5, wherein the one or more classical computing resources are selected based at least in part on analysis by the service of one or more metrics associated with prior simulation runs using one or more classical computing resources.

13. A non-transitory computer-readable storage medium storing program instructions that, when executed on or across one or more processors, cause the one or more processors to perform:
- selecting one or more classical computing resources from a pool of computing resources of a provider network to implement a simulator to simulate a quantum algorithm based at least in part on information descriptive of the quantum algorithm, wherein the quantum algorithm is executable using a quantum computing resource comprising a plurality of quantum bits, and wherein the one or more classical computing resources are selected from a pool of computing resources of a by a quantum computing simulation service of the provider network; and
- initiating a simulation of the quantum algorithm using the simulator implemented with the selected one or more classical computing resources.

14. The non-transitory computer-readable storage medium as recited in claim 13, wherein one or more resource types of the one or more classical computing resources are selected based at least in part on the quantum algorithm.

15. The non-transitory computer-readable storage medium as recited in claim 13, wherein an amount of the classical computing resources is selected based at least in part on the quantum algorithm.

16. The non-transitory computer-readable storage medium as recited in claim 13, wherein the one or more classical computing resources are selected based at least in part on resource demand in the provider network.

17. The non-transitory computer-readable storage medium as recited in claim 13, wherein the one or more classical computing resources are selected based at least in part on optimization of runtime of the simulation.

18. The non-transitory computer-readable storage medium as recited in claim 13, wherein the quantum algorithm is generated using a development environment, wherein a refined quantum algorithm is generated using the development environment based at least in part on the simulating, and wherein the non-transitory computer-readable storage medium further stores program instructions that, when executed on or across one or more processors, cause the one or more processors to perform:
- deploying the refined quantum algorithm to one or more quantum computing resources.

19. The non-transitory computer-readable storage medium as recited in claim 13, wherein the one or more classical computing resources are provisioned from the pool of computing resources, configured to perform the simulation, and returned to the pool of computing resources after the simulation.

20. The non-transitory computer-readable storage medium as recited in claim 13, wherein the one or more classical computing resources are recommended to a developer associated with the quantum algorithm using a quantum computing simulation service.

* * * * *